(12) United States Patent
Hayashi et al.

(10) Patent No.: US 9,553,111 B2
(45) Date of Patent: Jan. 24, 2017

(54) THIN FILM TRANSISTOR ARRAY SUBSTRATE

(71) Applicant: Mitsubishi Electric Corporation, Tokyo (JP)

(72) Inventors: Masami Hayashi, Kumamoto (JP); Takafumi Hashiguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 153 days.

(21) Appl. No.: 14/483,492

(22) Filed: Sep. 11, 2014

(65) Prior Publication Data

US 2015/0076501 A1 Mar. 19, 2015

(30) Foreign Application Priority Data

Sep. 18, 2013 (JP) ................. 2013-192769

(51) Int. Cl.
  *H01L 27/14*  (2006.01)
  *H01L 27/12*  (2006.01)
  *G02F 1/1362* (2006.01)

(52) U.S. Cl.
  CPC ....... *H01L 27/124* (2013.01); *G02F 1/136227* (2013.01); *H01L 27/1248* (2013.01); *H01L 27/1259* (2013.01)

(58) Field of Classification Search
  CPC ..................................... H01L 27/124
  USPC ......................................... 257/72
  See application file for complete search history.

(56) References Cited

U.S. PATENT DOCUMENTS 6,836,301 B1 * 12/2004 Kohtaka ............ G02F 1/1345
                                              257/59
2015/0034955 A1   2/2015 Hayashi et al.

FOREIGN PATENT DOCUMENTS

JP    2009-128397 A    6/2009
JP    2009128397 A  *  6/2009

* cited by examiner

*Primary Examiner* — Ajay K Arora
(74) *Attorney, Agent, or Firm* — Studebaker & Brackett PC

(57) ABSTRACT

A pixel electrode of an array substrate is connected with a drain electrode of a TFT via a first aperture formed on a second interlayer insulating film, a second aperture that includes a bottom portion of the first aperture and is formed on a common electrode, a third aperture that includes at least a part of the bottom portion of the first aperture, is included in a second aperture and is formed on a third interlayer insulating film, and a fourth aperture that is formed on the first interlayer insulating film in a region where the third aperture overlaps with the bottom portion of the first aperture.

15 Claims, 55 Drawing Sheets

F I G. 1
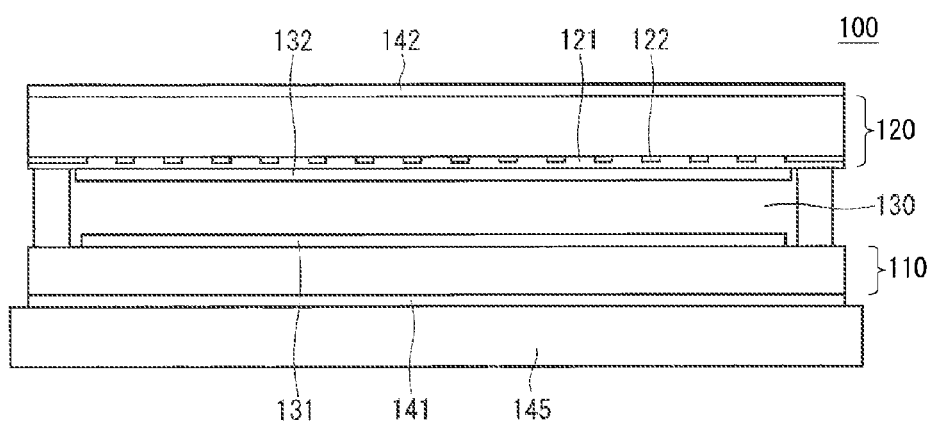
F I G. 2
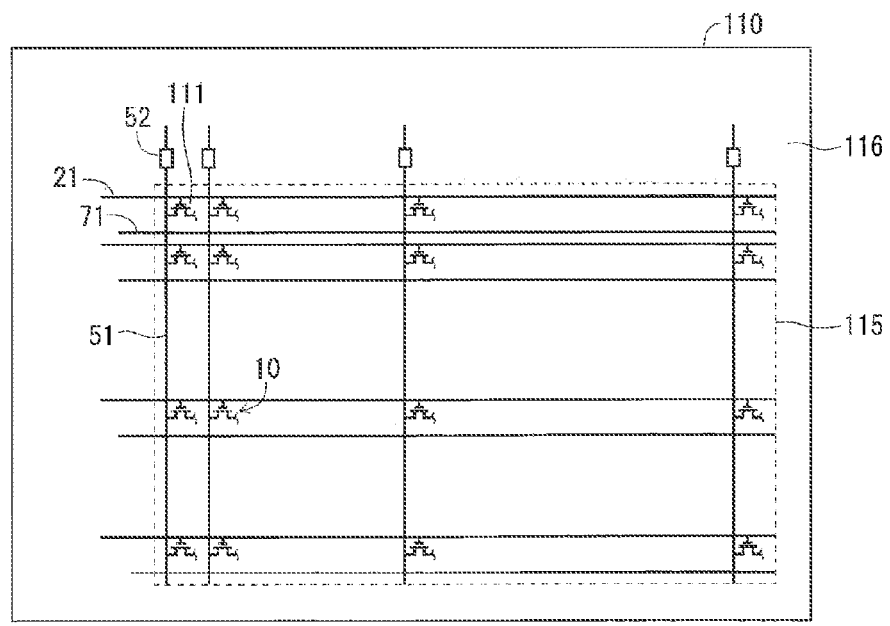

F I G . 3
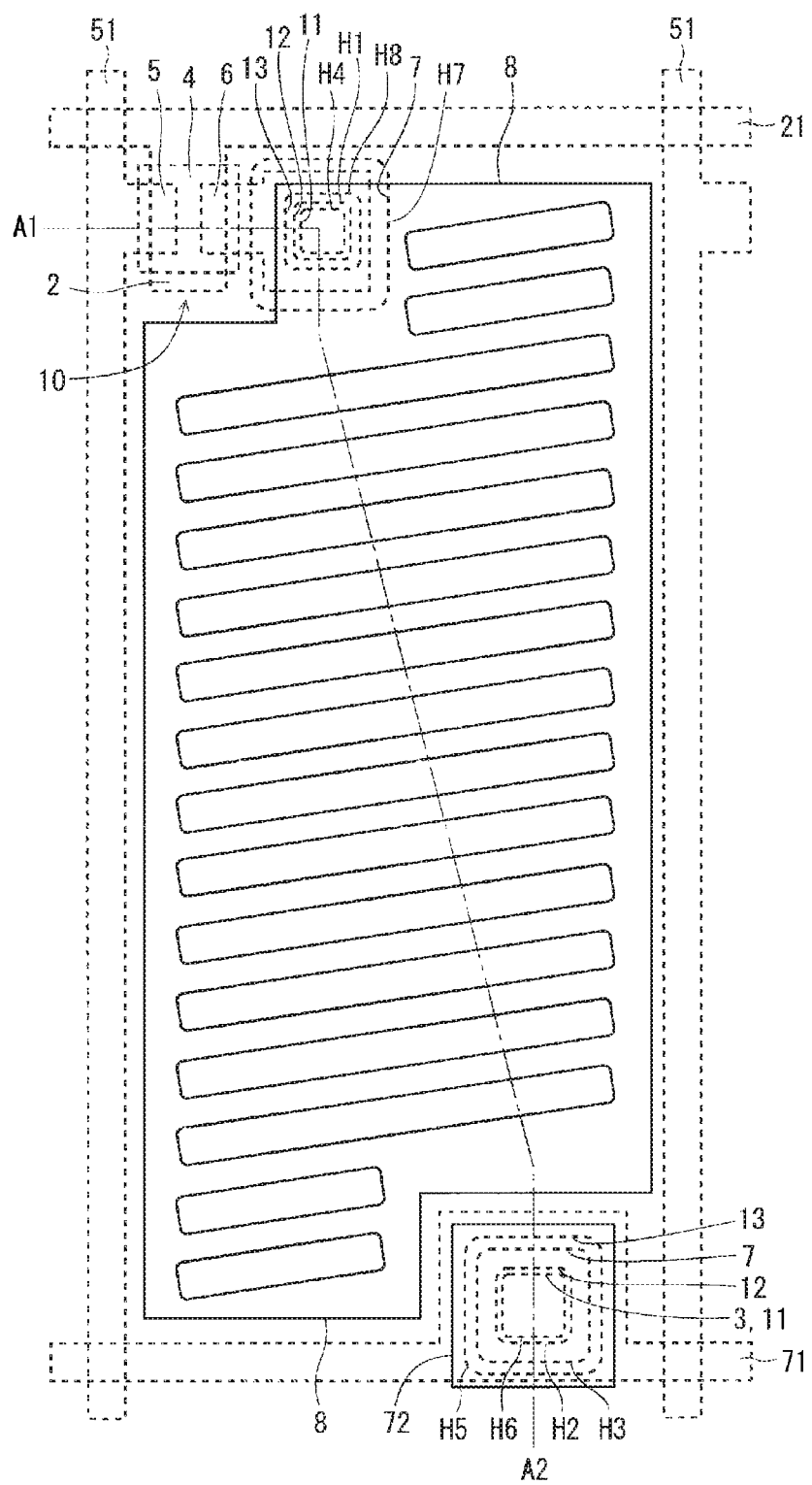

F I G . 3 3
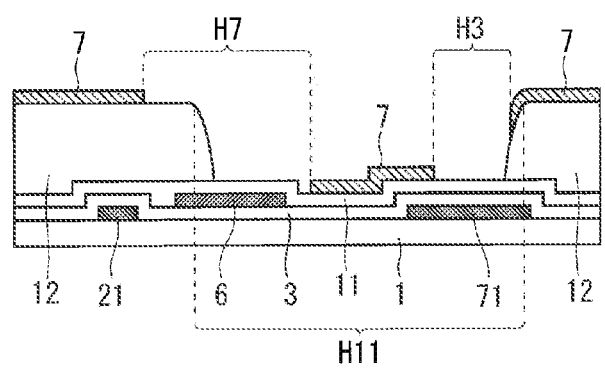

F I G . 3 5
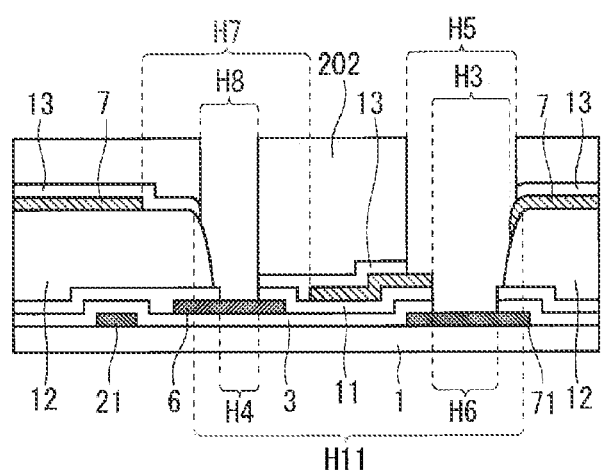

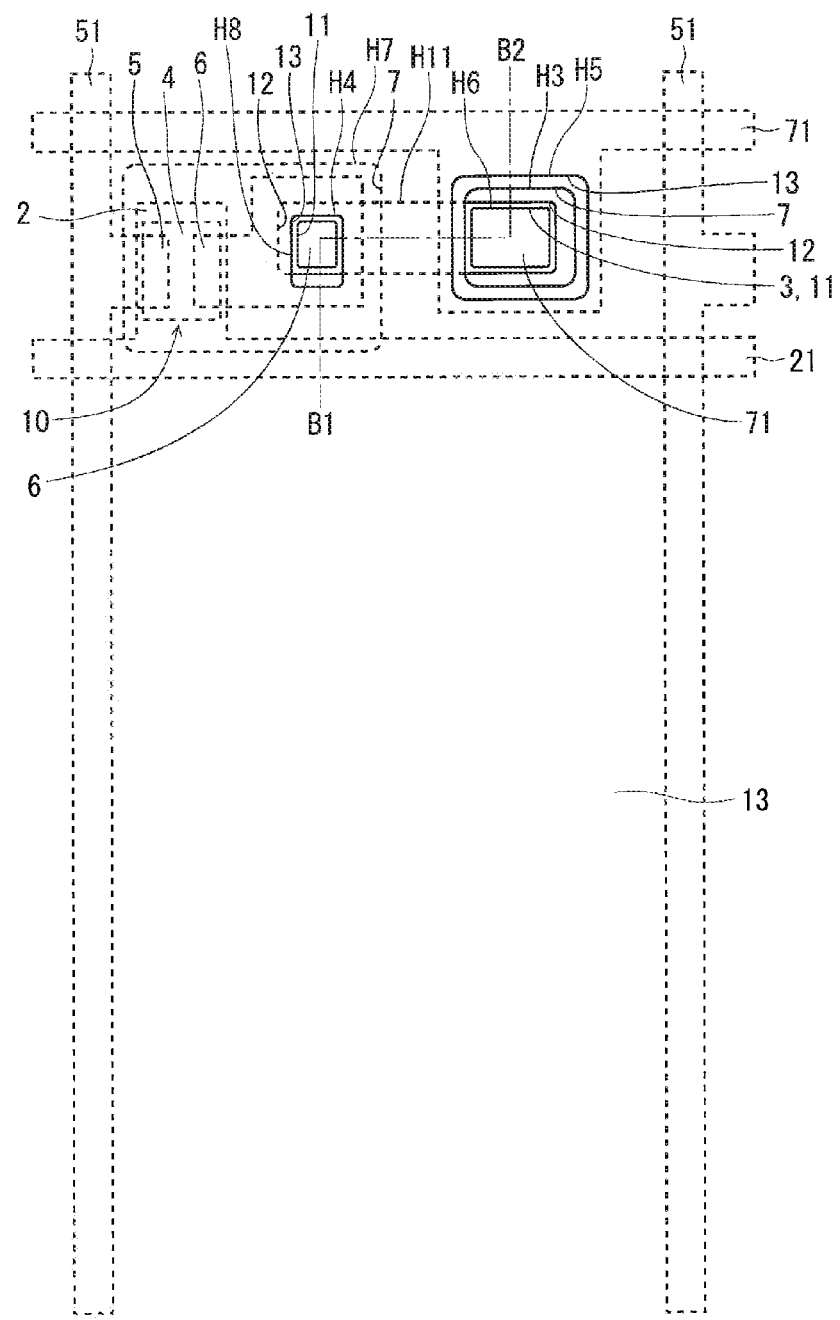
F I G . 3 7

F I G . 4 0
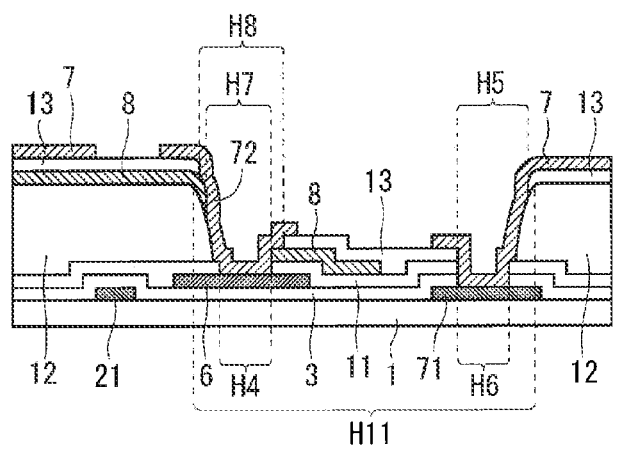

F I G . 4 7
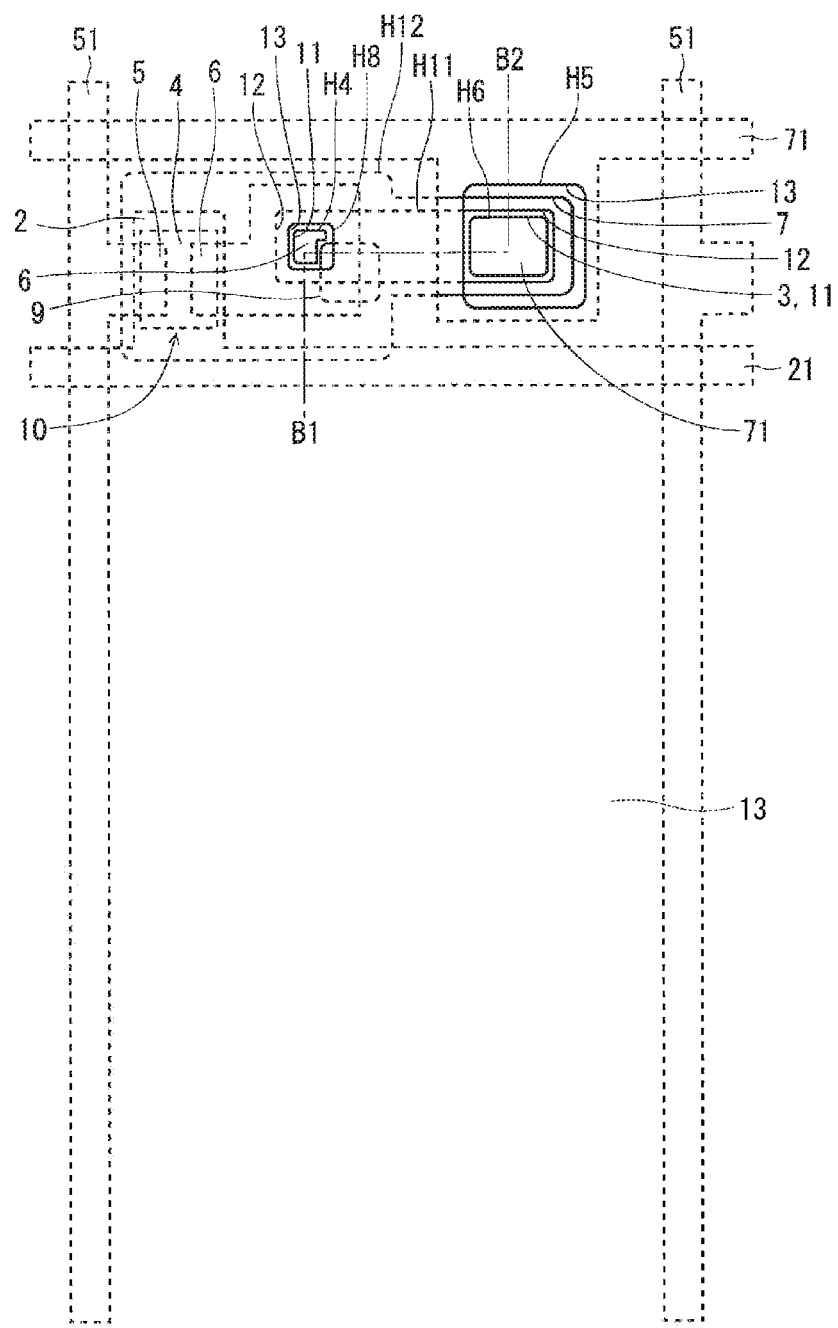

F I G. 5 1
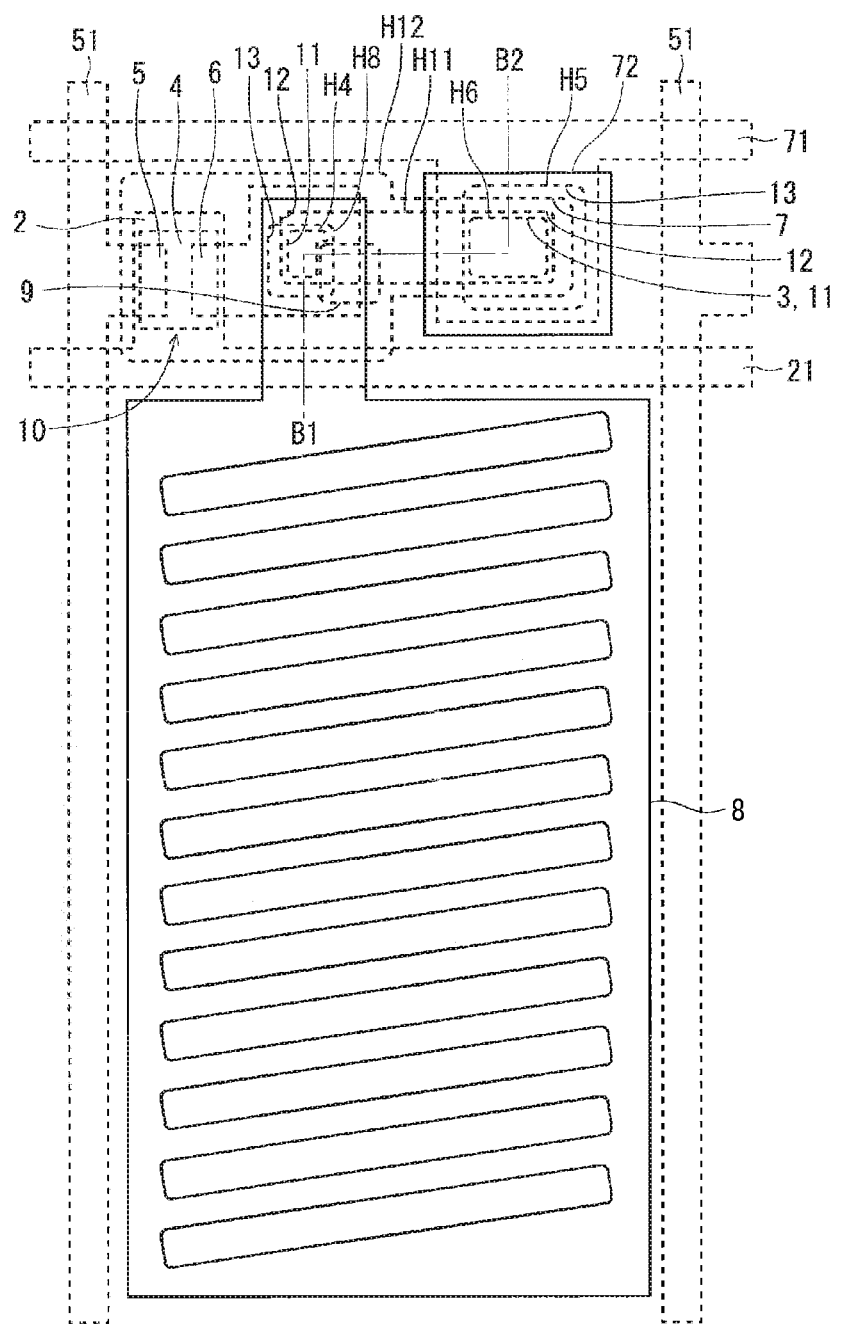

F I G. 5 2
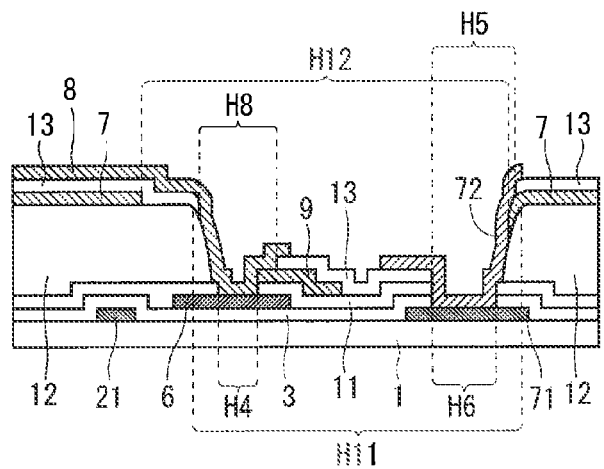
F I G. 5 3
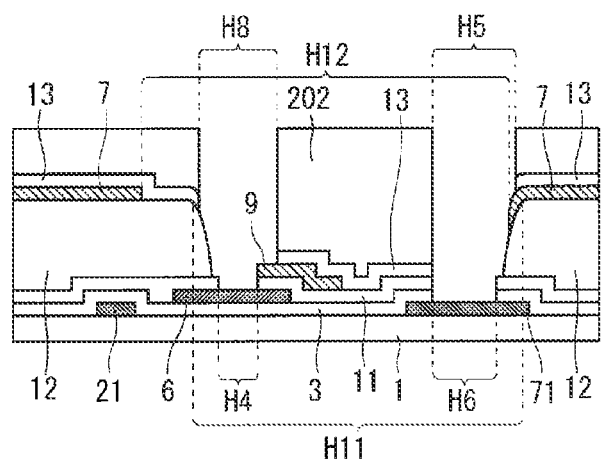

F I G . 5 8
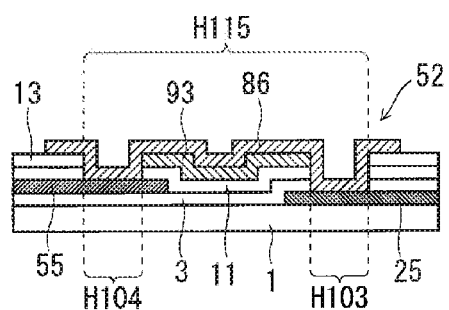
F I G . 5 9
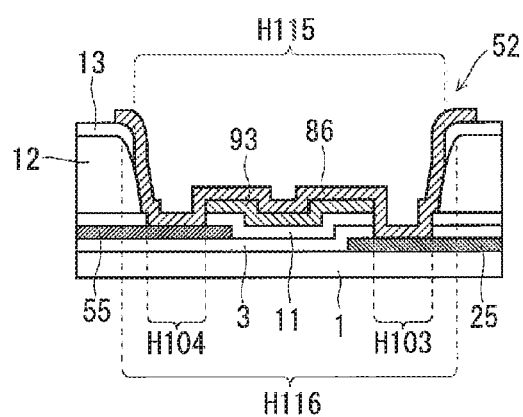

F I G . 6 1
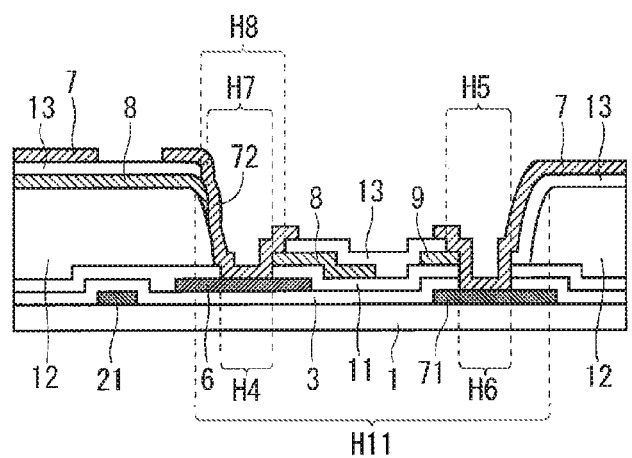

F I G . 6 3
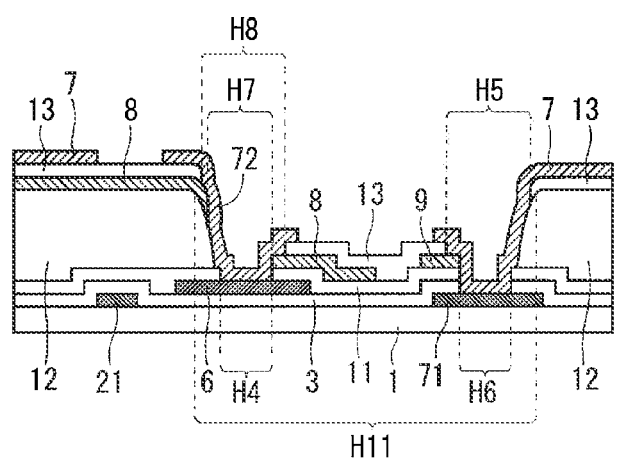

THIN FILM TRANSISTOR ARRAY SUBSTRATE

BACKGROUND OF THE INVENTION

Field of the Invention

The present invention relates to a thin film transistor array substrate to be used in a liquid crystal display device, and a method for manufacturing the substrate.

Description of the Background Art

Conventionally, liquid crystal display devices have a structure where a TFT array substrate (hereinafter, "array substrate") formed with a pixel electrode and a thin film transistor (TFT) for supplying a display signal to the pixel electrode, a counter substrate formed with a common electrode, and a liquid crystal layer held therebetween. The liquid crystal display devices that employ a TN (Twisted Nematic) mode and a VA (Vertical Alignment) mode are the mainstream. In the TN mode, liquid crystal is driven by an electric field in a vertical direction (the direction vertical to the surface of the array substrate and the counter electrode) generated between the pixel electrode and the common electrode. In recent years, liquid crystal display devices that employ an IPS (In-Plane Switching) mode ("IPS" is registered trade mark), and an FFS (Fringe Field Switching) mode are put to practical use. In these modes, both a pixel electrode and a common electrode are disposed on an array substrate, and an electric field in a lateral direction generated between the pixel electrode and the common electrode drives liquid crystal.

For example, Japanese Patent Application Laid-Open No. 2009-128397 (Patent Document 1) proposes a structure where a thick insulating film (planarizing film) is formed on a source wiring (display signal line), and an upper portion of the source wiring is coated with a common electrode in a liquid crystal display panel of the FFS mode. With this structure, the common electrode on the source wiring shields an electric field from a pixel and simultaneously a parasitic capacitance between the pixel and the source wiring is repressed so that power consumption of the liquid crystal display panel can be reduced.

In a liquid crystal display panel of FFS mode, a pixel electrode and a common electrode are formed on different layers. For this reason, at least two dry etching steps are necessary for forming a first aperture (contact hole) that connects the common electrode and a wiring (common wiring) for supplying an electric potential to the common electrode, and a second aperture that connects the pixel electrode and a drain electrode of TFT for supplying a display signal to the pixel electrode.

Further, prior to the step of forming the second aperture, when the planarizing film on the drain electrode of TFT is removed in the step of forming the first aperture, the surface of the drain electrode is damaged twice by dry etching for forming the first aperture and dry etching for forming the second aperture. This occasionally causes an increase in contact resistance between the pixel electrode and the drain electrode. On the other hand, when the first aperture and the second aperture are simultaneously formed, one more aperture should be formed to connect the common electrode with the common wiring, and thus an area ratio of contact holes within a pixel region increases.

Further, when a planarizing film (organic planarizing film) whose material is organic resin is used, the organic planarizing film remains in a region other than the apertures at terminal portions. For this reason, a new countermeasure against weakening of an adhesion at packaging time is necessary.

SUMMARY OF THE INVENTION

The present invention is devised in order to solve the above problem, and its object is to reduce a step load while repressing an increase in an area of contact holes and obtain stable contact resistance in a thin film transistor array substrate having a planarizing film.

A thin film transistor array substrate of the present invention includes a thin film transistor formed on a substrate, a common wiring formed on the substrate, a first interlayer insulating film formed on the thin film transistor and the common wiring, a second interlayer insulating film formed on the first interlayer insulating film, a common electrode formed on the second interlayer insulating film, a third interlayer insulating film formed on the common electrode, and a pixel electrode formed on the third interlayer insulating film. The pixel electrode is connected with the drain electrode of the thin film transistor via a first aperture formed on the second interlayer insulating film, a second aperture that includes a bottom portion of the first aperture and is formed on the common electrode, a third aperture that includes at least a part of the bottom portion of the first aperture, is included in the second aperture and is formed on the third interlayer insulating film, and a fourth aperture that has a shape similar to a region where the third aperture and the bottom portion of the first aperture are overlapped and is formed on the first interlayer insulating film.

According to the present invention, even when a structure where a thick insulating film is formed on a source wiring is introduced, the reduction in an aperture ratio of a pixel can be repressed.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a cross sectional view illustrating a configuration of a liquid crystal display device according to a first preferred embodiment;

FIG. 2 is plan view illustrating a configuration of an array substrate according to the first preferred embodiment;

FIG. 3 is a plan view of a pixel of the array substrate according to the first preferred embodiment;

FIG. 33 is a cross sectional view illustrating the step of manufacturing the array substrate according to the second preferred embodiment;

FIG. 35 is a cross sectional view illustrating the step of manufacturing the array substrate according to the second preferred embodiment;

FIG. 37 is a plan view illustrating an arrangement example of an aperture (H8) of a third interlayer insulating film and an aperture (H11) of a second interlayer insulating film according to the second preferred embodiment;

FIG. 40 is a cross sectional view of the main section of the array substrate according to the modified preferred example of the second preferred embodiment;

FIG. 47 is a plan view illustrating the step of manufacturing the array substrate according to the third preferred embodiment;

FIG. 51 is a plan view of the pixel of the array substrate according to a first modified preferred example of the third preferred embodiment;

FIG. 52 is a cross sectional view of the main section of the array substrate according to the first modified preferred example of the third preferred embodiment;

FIG. 53 is a cross sectional view illustrating a step of manufacturing the array substrate according to a second modified preferred example of the third preferred embodiment;

FIG. 58 is a cross sectional view of the wiring converter of the array substrate according to the second modified preferred example of the third preferred embodiment;

FIG. 59 is a cross sectional view of the wiring converter of the array substrate according to the second modified preferred example of the third preferred embodiment;

FIG. 61 is a cross sectional view of the main section of the array substrate according to the third modified preferred example of the third preferred embodiment;

FIG. 63 is a cross sectional view of the main section of the array substrate according to the third modified preferred example of the third preferred embodiment.

DESCRIPTION OF THE PREFERRED EMBODIMENTS

First Preferred Embodiment

Figure 4:
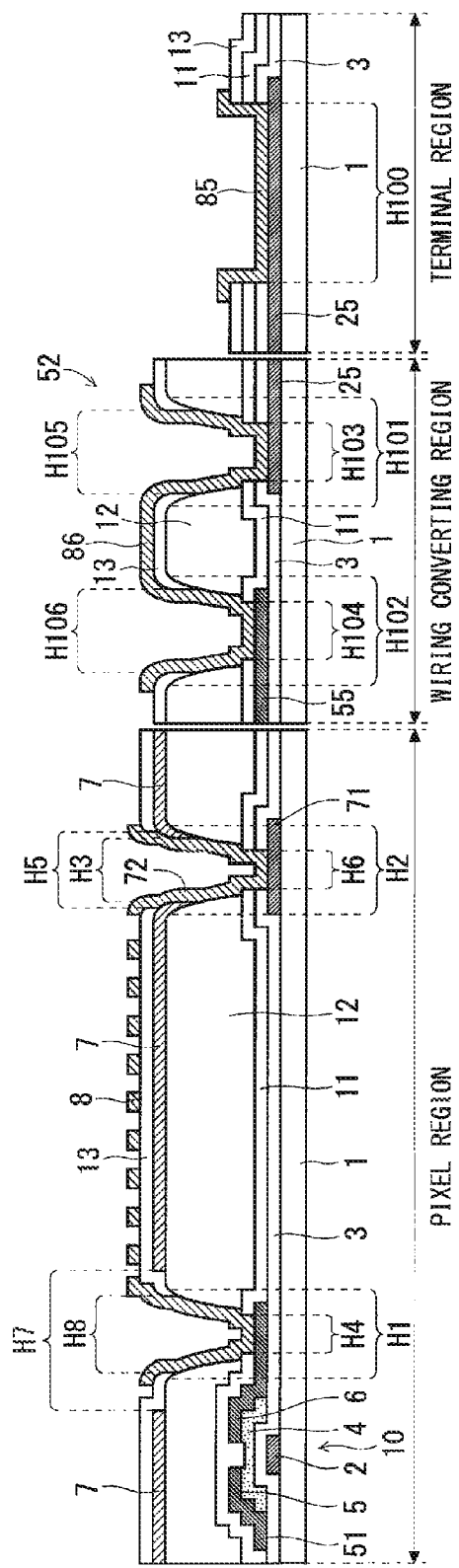
FIG. 4 is a cross sectional view of a main section of the array substrate according to the first preferred embodiment.

Preferred embodiments of the present invention will be described. The preferred embodiments described below are examples, and the application of the present invention is not limited to them. Further, like members in the drawings are denoted by like symbols, and overlapped description is suitably omitted.

FIG. 1 is a cross sectional view illustrating a configuration of a liquid crystal display device 100 according to the first preferred embodiment. The liquid crystal display device 100 includes a liquid crystal display panel that has a structure where an array substrate 110 and a counter substrate 120 are arranged so as to be opposed to each other and a liquid crystal layer 130 is held therebetween. The counter substrate 120 that is arranged on a front surface side (visible side) of the liquid crystal display panel is, for example, a color filter substrate having a color filter 121 and a black matrix (BM) 122. Further, the array substrate 110 that is arranged on a rear surface side (invisible side) is, for example, a thin film transistor array substrate where TFTs are arranged into an array pattern (matrix pattern). Oriented films 131 and 132 are formed on surfaces of the array substrate 110 and the counter substrate 120 on the side of the liquid crystal layer 130, respectively.

Optical films 141 and 142, such as polarization plates and phase difference plates, are provided on a rear surface side of the array substrate 110 and a front surface side of the counter substrate 120, respectively. Further, a backlight unit 145 is arranged on a rear surface side of the optical film 141.

FIG. 2 is a plan view illustrating a configuration of the array substrate 110. The array substrate 110 is divided into a display region 115 where pixels 111 having a TFT 10 are arranged into a matrix pattern, and a frame region 116 that surrounds the outside of the display region 115. A plurality of gate wirings 21 (scanning signal lines) and a plurality of source wirings 51 (display signal lines) are disposed on the display region 115. The plurality of gate wirings 21 are disposed in parallel with each other, and the plurality of source wirings 51 are also arranged in parallel with each other. The plurality of gate wirings 21 and the plurality of the source wirings 51 cross each other. Since an area surrounded by the adjacent gate wirings 21 and the adjacent source wirings 51 is the pixel 111, the pixels 111 are arranged on the display region 115 into a matrix pattern. Detailed structure of the pixels 111 will be described later.

In the present preferred embodiment, a common wiring 71 for supplying a predetermined electric potential (common electric potential) to each common electrode (not shown) of each of the pixels 111 is provided so as to be parallel with each of each gate wiring 21. The common wirings 71 may be provided so as to be parallel with the source wirings 51 depending on an aperture ratio design of the pixels 111.

Not shown but on the frame region 116, a terminal for connecting an external wiring is provided to the ends of lead-out wirings extending from the gate wirings 21 and the source wirings 51. In the present preferred embodiment, these terminals are formed by using a conductive film on the same layer as the gate wirings 21. For this reason, the array substrate 110 in FIG. 2 has wiring converters 52 on the frame region 116. The wiring converters 52 connect the lead-out wirings on the same layer as the source wirings 51 with the lead-out wirings on the same layer as the gate wirings 21.

The TFT 10 functions as a switching element for supplying a display voltage (display signal) to a pixel electrode (not shown) of the pixel 111, and a gate signal (scanning signal) given from the gate wiring 21 to a gate electrode of the TFT 10 controls an on/off state of the TFT 10. When the TFT 10 is turned on, the display voltage supplied from the source wiring 51 to a drain electrode of the TFT 10 is applied to the pixel electrode, and an electric field according to a display voltage is generated between the pixel electrode and the common electrode. This electric field drives the liquid crystal of the liquid crystal layer 130, and the oriented direction changes.

When the oriented direction of the liquid crystal changes, a polarization state of light transmitting through the liquid crystal changes. Therefore, when light from the backlight unit 145 that passes through the optical film 141 on the side of the array substrate 110 so as to become linearly polarized light passes through the liquid crystal layer 130, a planarization state of that light changes. A quantity of the light passing through the optical film 142 on the side of the counter substrate 120 changes due to the polarization state of the light passing through the liquid crystal layer 130. The oriented direction of the liquid crystal changes according to a display voltage applied to the pixel electrode. Therefore, control of the display voltage enables the quantity of the light passing through the optical film 142 to be controlled. In the liquid crystal display device 100, the display voltage to be applied to each of the pixels 111 is controlled based on display data, so that a desired image is displayed.

More detailed configuration of the array substrate 110 according to the first preferred embodiment will be described with reference to FIG. 3 and FIG. 4. FIG. 3 is a diagram illustrating a plan configuration of the pixel 111 on the array substrate 110, and FIG. 4 is a diagram illustrating a cross-sectional configuration of the liquid crystal display device 100. FIG. 4 illustrates cross sections of a forming region for the pixels 111 (pixel region), a forming region for the wiring converters 52 for connecting the lead-out wirings 55 of the source wirings 51 with lead-out wirings 25 on the same layer as the gate wirings 21 (wiring converting region), and a forming region (terminal region) of terminals provided to the ends of the gate wirings 21 or the source wirings 51. The cross section of the pixel region in FIG. 4 corresponds to a cross section taken along line A1-A2 in FIG. 3.

The array substrate 110 is formed by using a substrate 1 that is a transparent insulating substrate such as glass as shown in FIG. 4. A gate electrode 2 of the TFT 10, the gate wiring 21, and a common wiring 71 are formed in the pixel region on the substrate 1, and the lead-out wiring 25 on the same layer as the gate wiring 21 is formed in the wiring converting region and the terminal region. They are formed by using the same first conductive film. The gate electrode 2 is a portion of the gate wiring 21. That is to say, a portion that is branched from the gate wiring 21 and extends to the forming region for the TFT 10 becomes the gate electrode 2.

An insulating film 3 is formed on the gate electrode 2, the gate wiring 21, the common wiring 71, and the lead-out wiring 25. Since the insulating film 3 functions as a gate insulating film of the TFT 10, hereinafter it is called "gate insulating film".

A semiconductor film 4 is formed on the gate insulating film 3 so as to be overlapped with the gate electrode 2. A source electrode 5 and a drain electrode 6 of the TFT 10 are formed on the semiconductor film 4. Further, on the gate insulating film 3, the source wiring 51 for connection with the source electrode 5 is formed in the pixel region, and the lead-out wiring 55 for connection with the source wiring 51 extends to the wiring converting region. The source electrode 5, the drain electrode 6, the source wiring 51, and a lead-out wiring 55 are formed by using the same second conductive film. The source electrode 5 is a portion of the source wiring 51. That is to say, a portion that branches from the source wiring 51 and extends to the forming region for the TFT 10 (above the semiconductor film 4) becomes the source electrode 5.

A first interlayer insulating film 11 is formed on the semiconductor film 4, the source electrode 5, the drain electrode 6, the source wiring 51, and the lead-out wiring 55. Further, a thick second interlayer insulating film 12 (planarizing film) that is made of a photosensitive organic resin film, for example, is formed on the first interlayer insulating film 11. However, the second interlayer insulating film 12 is removed from the terminal region and its surrounding.

An aperture H1 and an aperture H2 are formed on the second interlayer insulating film 12. The aperture H1 is arranged on a position corresponding to the drain electrode 6 and reaches the first interlayer insulating film 11. The aperture H2 is arranged on a position corresponding to the common wiring 71 and reaches the first interlayer insulating film 11. Since the apertures H1 and H2 are formed by exposure of the organic resin film, the inner walls of the apertures H1 and H2 (the side surface of the second interlayer insulating film 12) have a gentle inclined plane as shown in FIG. 4. In the plane diagrams of the present specification, the shapes of the apertures H1 and H2 represent the outlines of bottom portions of the apertures H1 and H2.

A plate-shaped common electrode 7 made of a first transparent conductive film is formed on the second interlayer insulating film 12. An aperture H7 and an aperture H3 are formed on the common electrode 7. The aperture H7 is arranged on a position corresponding to the drain electrode 6 and includes the bottom portion of the aperture H1 of the second interlayer insulating film 12. The aperture H3 is arranged on a position corresponding to the common wiring 71 and is at least partially included in the aperture H2 of the second interlayer insulating film 12. The end of the aperture H3 is positioned on the inclined plane on the inner wall of the aperture H2, and a part of the common electrode 7 is formed on the inner wall of the aperture H2 as shown in FIG. 4.

A third interlayer insulating film 13 is formed on the common electrode 7. An aperture H8 and an aperture H5 are formed on the third interlayer insulating film 13. The aperture H8 is arranged on a position corresponding to the drain electrode 6 and is included in the aperture H7 of the common electrode 7. The aperture H5 is arranged on a position corresponding to the common wiring 71 and includes at least a part of the aperture H3 of the common electrode 7.

The aperture H8 of the third interlayer insulating film 13 is arranged so as to include at least a part of the bottom portion of the aperture H1 of the second interlayer insulating film 12. An aperture H4 that reaches the drain electrode 6 is formed on the first interlayer insulating film 11 in a region where the bottom portion of the aperture H8 and the aperture H1 overlap with each other. The shape of the aperture H4 is similar to the shape of a region where the bottom portion of the aperture H1 and the aperture H8 overlap with each other. In examples of FIG. 3 and FIG. 4, since the aperture H8 includes the entire bottom portion of the aperture H1, the aperture H4 has a shape similar to the bottom position of the aperture H1.

Since the aperture H5 of the third interlayer insulating film 13 includes at least a part of the aperture H3 of the common electrode 7, a part of the common electrode 7 formed on the inner wall of the aperture H2 is exposed inside the aperture H5. Further, the aperture H5 is arranged so as to include at least a part of the bottom portion of the aperture H2 of the second interlayer insulating film 12. An aperture H6 that reaches the common wiring 71 is formed on the first interlayer insulating film 11 and the gate insulating film 3 in a region where the aperture H5, the aperture H3, and the bottom portion of the aperture H2 overlap with one another. The shape of the aperture H6 is similar to the shape of the region where the bottom portion of the aperture H2, the aperture H3, and the aperture H5 overlap with one another. In the examples of FIG. 3 and FIG. 4, since the aperture H5 includes the aperture H3 entirely, and the aperture H3 includes the entire bottom portion of the aperture H2, an aperture H6 has a shape similar to the bottom portion of the aperture H2.

A pixel electrode 8 and a contact electrode 72 made of a second transparent conductive film are formed on the third interlayer insulating film 13. The pixel electrode 8 has a lattice shape or a pectinate shape having a slit, and a part of the pixel electrode 8 is connected with the drain electrode 6 via the aperture H7 of the common electrode 7, the aperture H8 of the third interlayer insulating film 13, the aperture H1 of the second interlayer insulating film 12 and the aperture H4 of the first interlayer insulating film 11. Further, the contact electrode 72 is formed in at least a part of the aperture H5 of the third interlayer insulating film 13, and is connected with a part of the common electrode 7 exposed in the aperture H5, and is connected also with the common wiring 71 via the aperture H6. That is to say, the contact electrode 72 electrically connects the common wiring 71 and the common electrode 7.

The pixel electrode 8 is thus connected with the drain electrode 6 of the TFT 10 via the aperture H7 formed on the common electrode 7, the aperture H8 that is included in the aperture H7 and is formed on the third interlayer insulating film 13, the aperture H1 at least whose bottom portion is partially included in the aperture H8 and that is formed on the second interlayer insulating film 12, and the aperture H4 that is included in the bottom portion of the aperture H1 and is formed on the first interlayer insulating film 11. Further, the common electrode 7 is electrically connected with the common wiring 71 by the contact electrode 72 via the aperture H2 formed on the second interlayer insulating film 12, and the aperture H6 that is included in the aperture H2 and is formed on the first interlayer insulating film 11 and the gate insulating film 3.

On the other hand, in the terminal region, the gate insulating film 3, the first interlayer insulating film 11, and the third interlayer insulating film 13 are formed on the lead-out wiring 25 on the same layer as the gate wiring 21 (as described above, the second interlayer insulating film 12 is removed in the terminal region). An aperture H100 is formed on the gate insulating film 3, the first interlayer insulating film 11, and the third interlayer insulating film 13 so as to pierce through them and reaches the lead-out wiring 25. Further, a terminal pad 85 for connection with the lead-out wiring 25 via the aperture H100 is formed on the third interlayer insulating film 13 by using the second transparent conductive film that is the same as the pixel electrode 8.

Further, in the wiring converting region, the gate insulating film 3 is formed on the lead-out wiring 25 on the same layer as the gate wiring 21, and the lead-out wiring 55 on the same layer as the source wiring 51 is formed on the gate insulating film 3. The first interlayer insulating film 11, the second interlayer insulating film 12, and the third interlayer insulating film 13 are formed so as to cover the gate insulating film 3 and the lead-out wiring 55. An aperture H101 and an aperture H102 are formed on the second interlayer insulating film 12. The aperture H101 is arranged on a position corresponding to the lead-out wiring 25 and reaches the first interlayer insulating film 11. The aperture H102 is arranged on a position corresponding to the lead-out wiring 55 and reaches the first interlayer insulating film 11. Since the apertures H101, H102 are formed by exposing the organic resin film, the inner walls of the apertures H101 and H102 (the side surface of the second interlayer insulating film 12) have a gentle inclined plane.

An aperture H105 and an aperture H106 are formed on the third interlayer insulating film 13. The aperture H105 is arranged on a position corresponding to the lead-out wiring 25 and includes at least a part of a bottom portion of the aperture H101. The aperture H106 is arranged on a position corresponding to the lead-out wiring 55 and includes at least a part of the bottom portion of the aperture H102. An aperture H103, which pierces the gate insulating film 3 and the first interlayer insulating film 11 and reaches the lead-out wiring 25, is formed in a region where the aperture H105 and the bottom portion of the aperture H101 overlap with each other. An aperture H104, which pierces the first interlayer insulating film 11 and reaches the lead-out wiring 55, is formed in a region where the aperture H106 and the bottom portion of the aperture H102 overlap with each other.

Therefore, the shape of the aperture H103 is similar to a shape of the region where the bottom portion of the aperture H101 and the aperture H105 overlap with each other. Further, the shape of the aperture H104 is similar to the shape of the region where the bottom portion of the aperture H102 and the aperture H106 overlap with each other. In the example of FIG. 4, since the aperture H105 includes the entire bottom portion of the aperture H101, the aperture H103 has a shape similar to the bottom portion of the aperture H101. Further, since the aperture H106 includes the entire bottom portion of the aperture H102, the aperture H104 has a shape similar to the bottom portion of the aperture H102.

Further, a connection pattern 86 is formed on the third interlayer insulating film 13 by using the second transparent conductive film that is also used for the pixel electrode 8. The connection pattern 86 is connected with the lead-out wiring 25 via the apertures H101, H103, and H105, and is connected with the lead-out wiring 55 via the apertures H102, H104, and H106. The connection pattern 86 is formed across the lead-out wiring 25 exposed from the aperture H103 and the lead-out wiring 55 exposed from the aperture H104, and electrically connects the lead-out wiring 25 and the lead-out wiring 55.

The array substrate 110 having the configuration shown in FIG. 3 and FIG. 4 enables an area of contact holes necessary for connecting the common wiring 71 and the common electrode 7 to be reduced in the pixel region, and thus enables an aperture ratio of the array substrate 110 to be heightened. When the aperture ratio of the array substrate 110 can be heightened, a loss of the light in the liquid crystal display panel can be made small. For this reason, luminance of the light to be outputted from the backlight unit 145 can be reduced, so that power consumption can be repressed.

Further, since the aperture H8 of the third interlayer insulating film 13 includes at least a part of the bottom portion of the aperture H1 of the second interlayer insulating film 12, the second interlayer insulating film 12 is exposed on the inner wall of a contact hole for connecting the pixel electrode 8 and the drain electrode 6. That is to say, a portion where the first interlayer insulating film 11 does not contact with the third interlayer insulating film 13 is formed on the inner wall of the contact hole. When the first interlayer insulating film 11 and the third interlayer insulating film 13 are laminated on the entire periphery of the inner wall of the contact hole, a wedge-shaped gap is easily generated between the first interlayer insulating film 11 and the third interlayer insulating film 13, but the generation of such a gap can be prevented. As a result, the reliability of the electric connection between the drain electrode 6 and the pixel electrode 8 is improved.

On the other hand, since the thick second interlayer insulating film 12 (organic resin film) is removed in the terminal region, an adhesion between the array substrate 110 and its mounting member can be improved. For example, even when an IC (Integrated Circuit) or an FPC (Flexible Printed Circuit) having narrow-pitch terminals is packaged into the array substrate 110, stable connection can be obtained, and deterioration of yield caused by faulty connection can be repressed.

A method for manufacturing the liquid crystal display device 100 according to the first preferred embodiment is described below with reference to FIG. 5 to FIG. 16.

The first conductive film (for example, Al alloy with thickness of 200 nm) is deposited on the substrate 1 by a sputtering method. A resist mask is formed in a first photo-engraving step, and the first conductive film is patterned by etching using the resist mask as a mask, so that the gate electrode 2, the gate wiring 21, the common wiring 71, and the lead-out wiring 25 are formed. The Al alloy can be etched by using, for example, a mixed solution of phosphoric acid, nitric acid, and acetic acid. Thereafter, the resist mask is removed by using a peeling solution.

The gate insulating film 3 (for example, silicon nitride with thickness of 400 nm) is deposited by a CVD (Chemical Vapor Deposition) method. Further, intrinsic amorphous Si and n type amorphous Si are sequentially deposited on the gate insulating film 3 by the CVD method. A resist mask is formed in the second photoengraving step, and an amorphous Si film is patterned by dry etching using the resist mask as a mask, so that the semiconductor film 4 of the TFT 10 is formed. Thereafter, the resist mask is removed by the peeling solution.

Subsequently, a second conductive film (for example, a laminated film whose upper layer is Al alloy and whose lower layer is Mo metal alloy) is deposited by a sputtering method. A resist mask is formed by a third photoengraving step, and a second conductive film is patterned by etching using the resist mask as a mask, so that the source electrode 5, the drain electrode 6, the source wiring 51, and the lead-out wiring 55 are formed. The Al alloy and the Mo alloy can be etched by using a mixed solution of, for example, phosphoric acid, nitric acid, and acetic acid.

Figure 5:
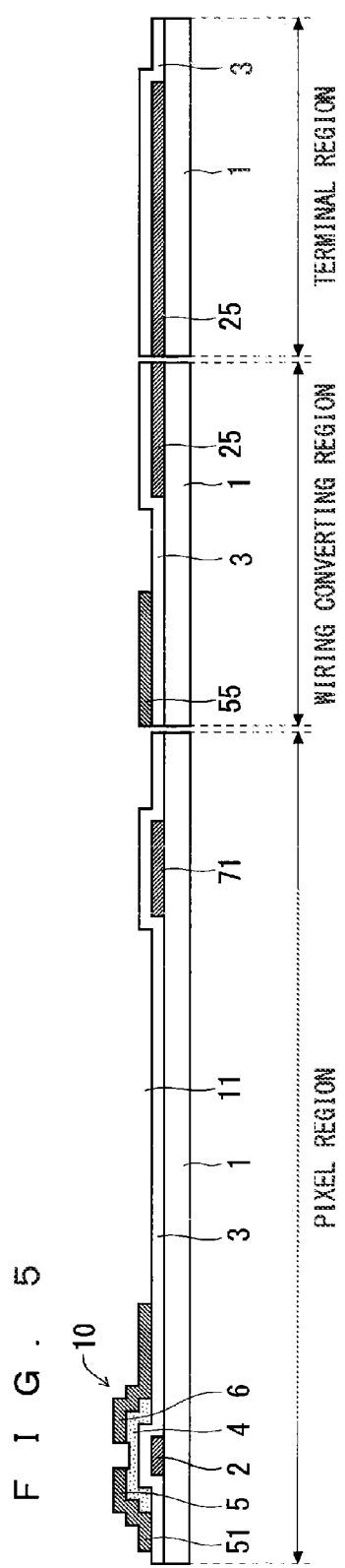
FIG. 5 is a cross sectional view illustrating a step of manufacturing the array substrate according to the first preferred embodiment.
Figure 6:
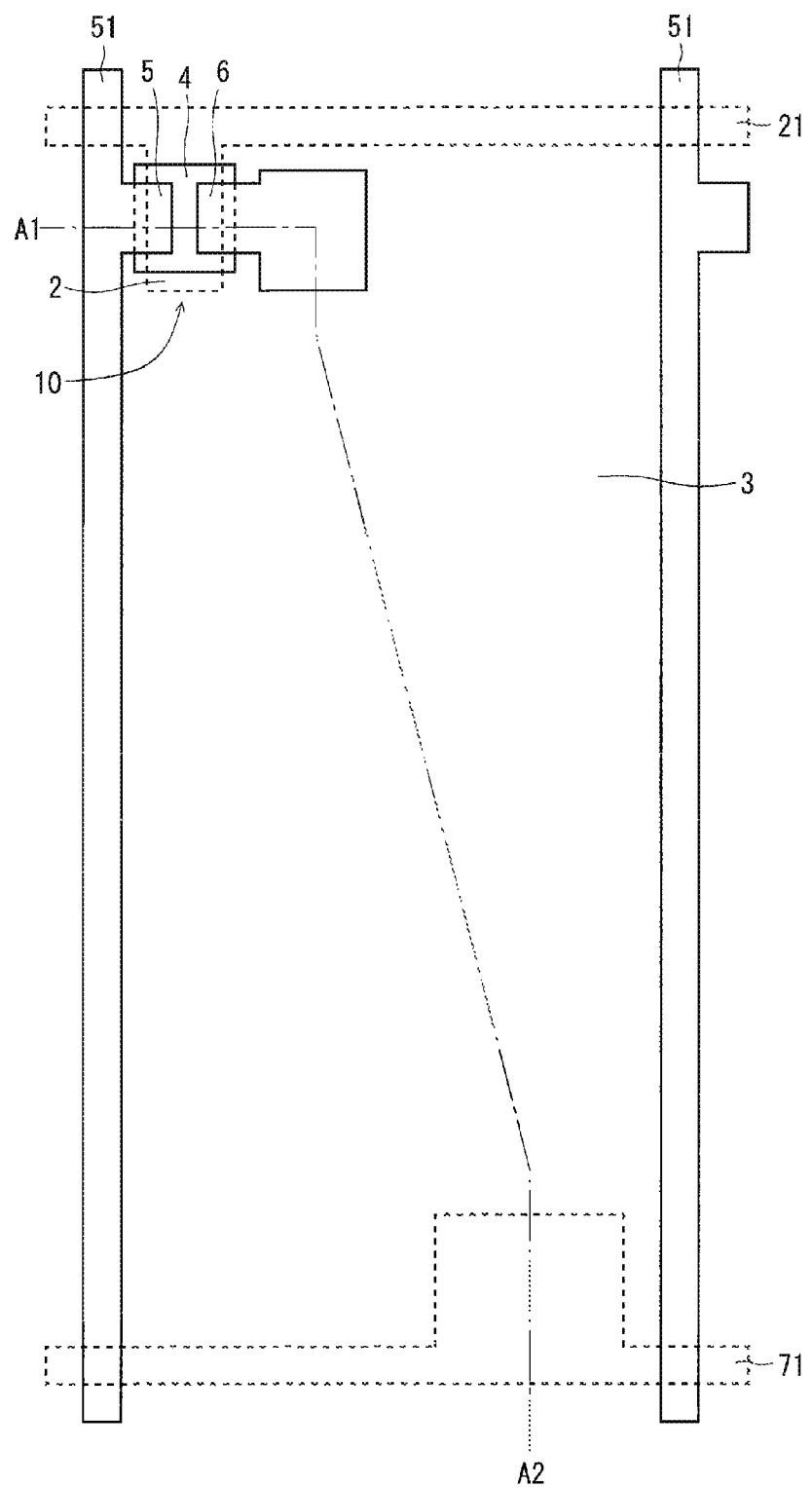
FIG. 6 is a plan view illustrating the step of manufacturing the array substrate according to the first preferred embodiment.

Thereafter, dry etching is performed on the exposed upper surface of the semiconductor film 4. As a result, the semiconductor film 4, namely, a channel region of the TFT 10 between the source electrode 5 and the drain electrode 6 are etched. Thereafter, when the resist mask is removed by the peeling solution, a state shown in FIG. 5 is obtained. Further, FIG. 6 shows a plan view of the pixel region in this state.

The above describes the example where the formation of the semiconductor film 4, and the formation of the source wiring 51, the source electrode 5, and the drain electrode 6 are performed by using different resist masks. However, for example, the resist mask is exposed by using a multi-gradation photomask, and a resist mask with different thickness portions is obtained, so that they are formed by using one resist mask. That is to say, the second photoengraving step and the third photoengraving step can be executed as one step.

Figure 7:
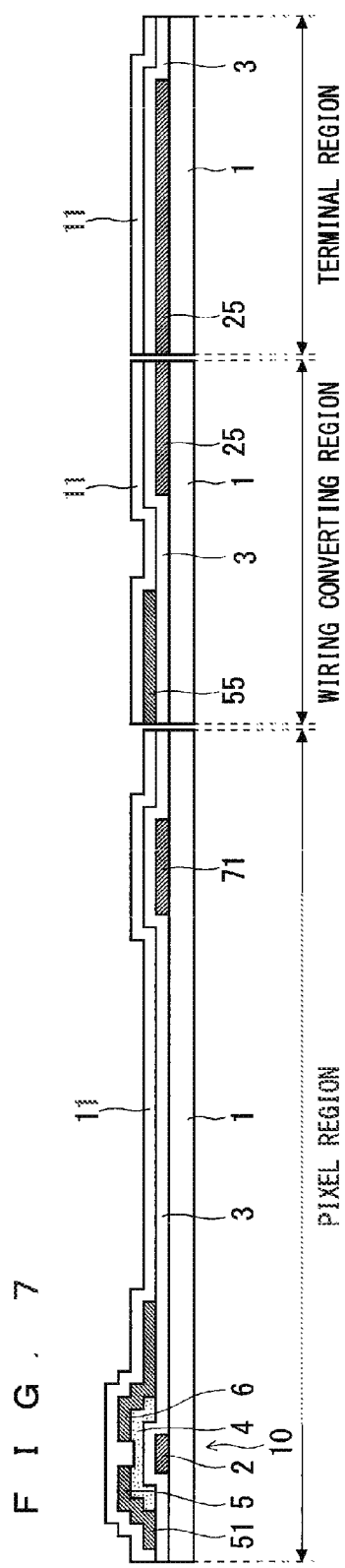
FIG. 7 is a cross sectional view illustrating the step of manufacturing the array substrate according to the first preferred embodiment.
Figure 8:
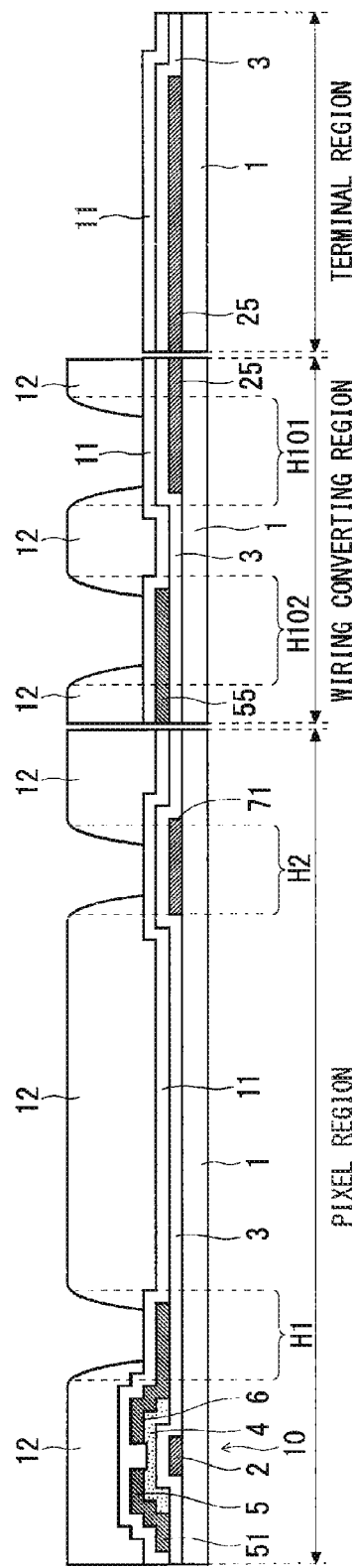
FIG. 8 is a cross sectional view illustrating the step of manufacturing the array substrate according to the first preferred embodiment.
Figure 9:
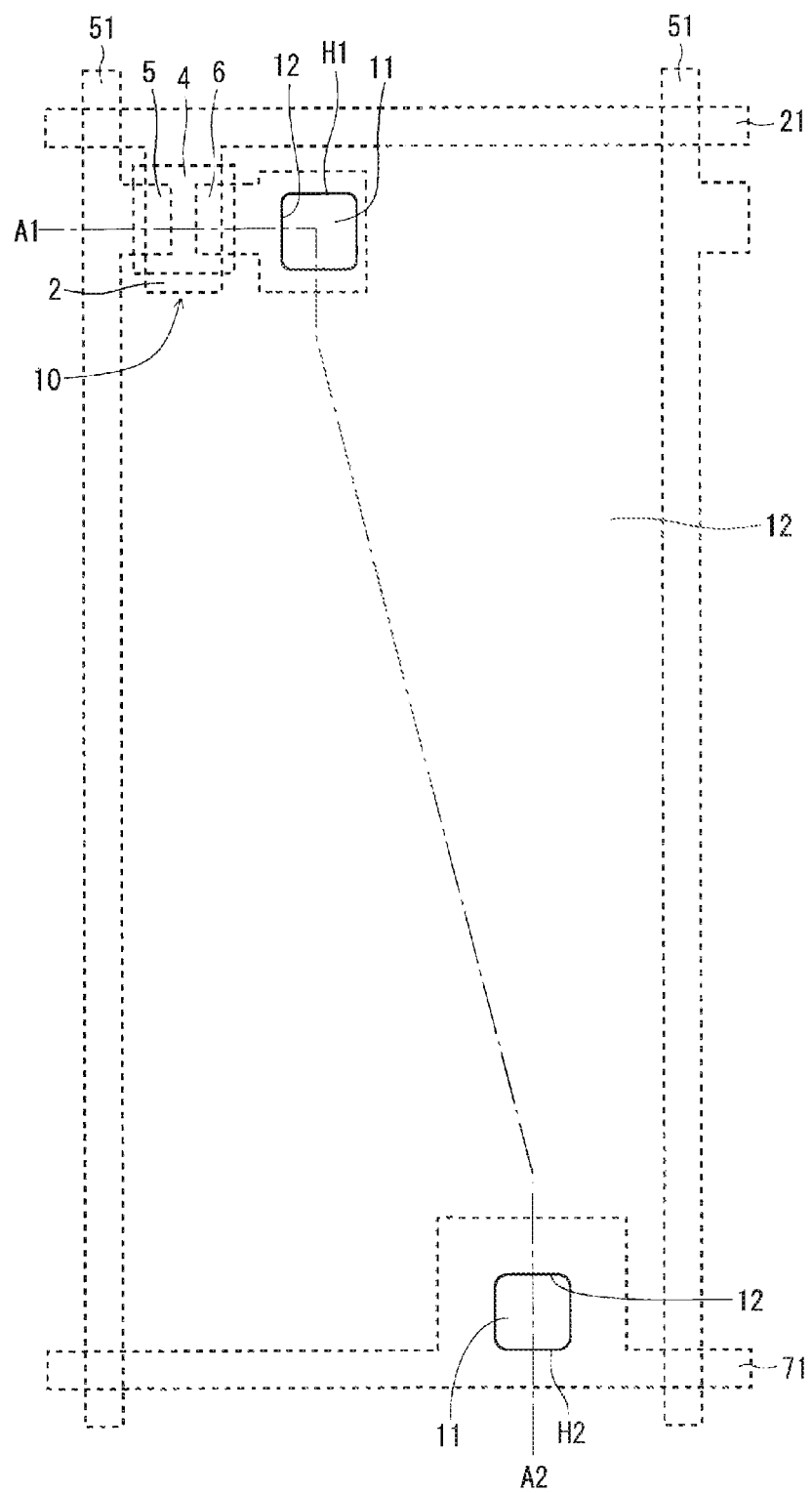
FIG. 9 is a plan view illustrating the step of manufacturing the array substrate according to the first preferred embodiment.

Subsequently, the first interlayer insulating film 11 (for example, silicon nitride of 200 nm) is deposited by using the CVD method (FIG. 7). A photosensitive organic resin film is applied so that the second interlayer insulating film 12 is formed, and the second interlayer insulating film 12 is exposed and developed in the fourth photoengraving step. As a result, the aperture H1 is formed above the drain electrode 6, and the aperture H2 is formed above the common wiring 71. At the same time, the aperture H101 is formed above the lead-out wiring 25 on the same layer as the gate wiring 21, and the aperture H102 is formed above the lead-out wiring 55 on the same layer as the source wiring 51 on the second interlayer insulating film 12 of the wiring converting region. At this time, the second interlayer insulating film 12 in the terminal region is removed. As a result, a state shown in FIG. 8 is obtained. Further, FIG. 9 shows a plan view of the pixel region in this state. The first interlayer insulating film 11 is exposed on the bottoms of the apertures H1 and H2.

Figure 10:
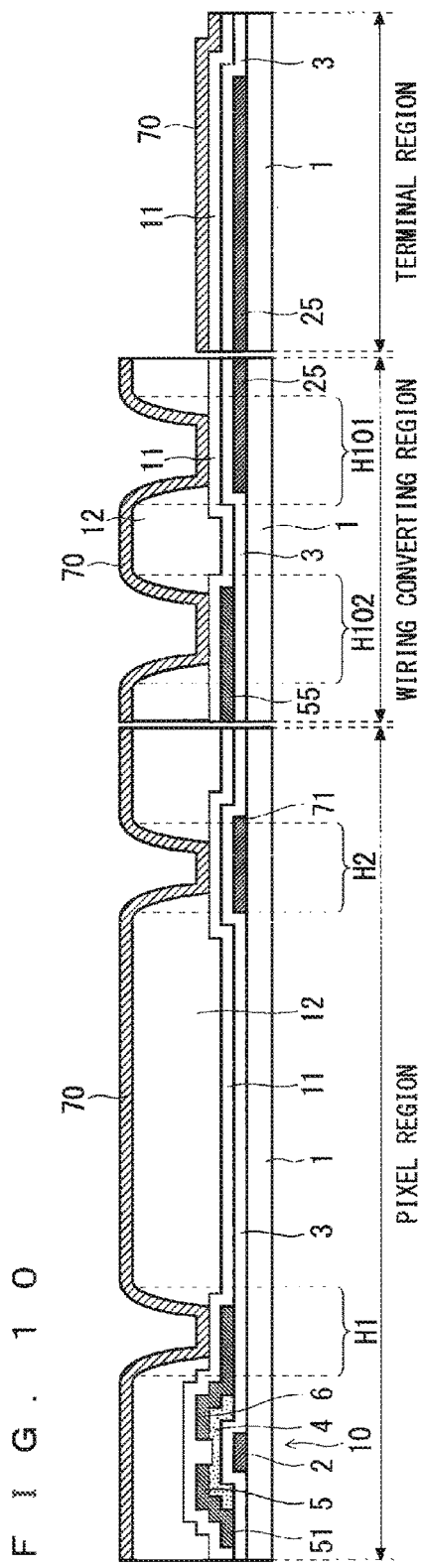
FIG. 10 is a cross sectional view illustrating the step of manufacturing the array substrate according to the first preferred embodiment.
Figure 11:
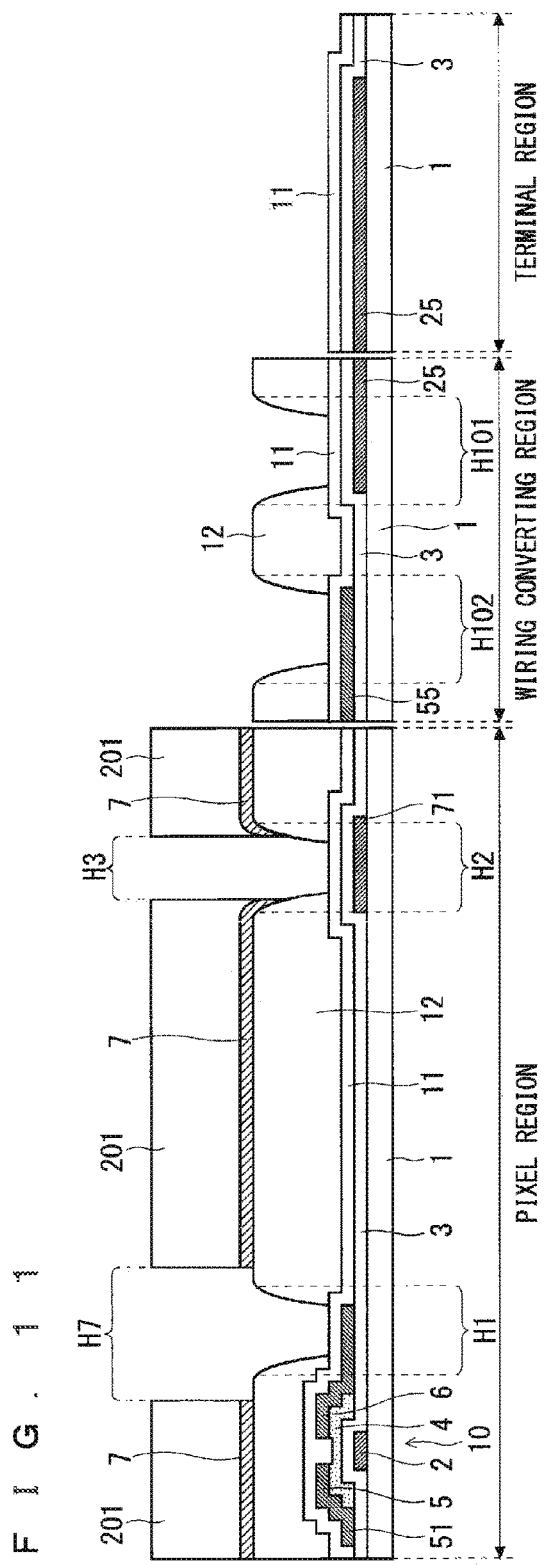
FIG. 11 is a cross sectional view illustrating the step of manufacturing the array substrate according to the first preferred embodiment.

A first transparent conductive film 70 (for example, IZO with thickness of 80 nm) is deposited by using the sputtering method (FIG. 10). A resist mask 201 is formed in the fifth photoengraving step, the first transparent conductive film 70 is patterned by etching using the resist mask as a mask, so that the common electrode 7 is formed (FIG. 11). The IZO can be etched by using, for example, oxalic acid. At this time, on the common electrode 7, the aperture H7 is formed on a position of the second interlayer insulating film 12 corresponding to the aperture HE and the aperture H3 is formed on a position of the second interlayer insulating film 12 corresponding to the aperture H2. The aperture H7 is formed so as to include the bottom portion of the aperture H1. The aperture H7 includes the aperture H1 entirely. The aperture H3 is formed so that at least a part of the aperture H3 is included in the aperture H2. Here, the aperture H3 includes the bottom portion of the aperture H2, and the end of the aperture H3 is positioned above the inclined plane on the inner wall of the aperture H2.

Figure 12:
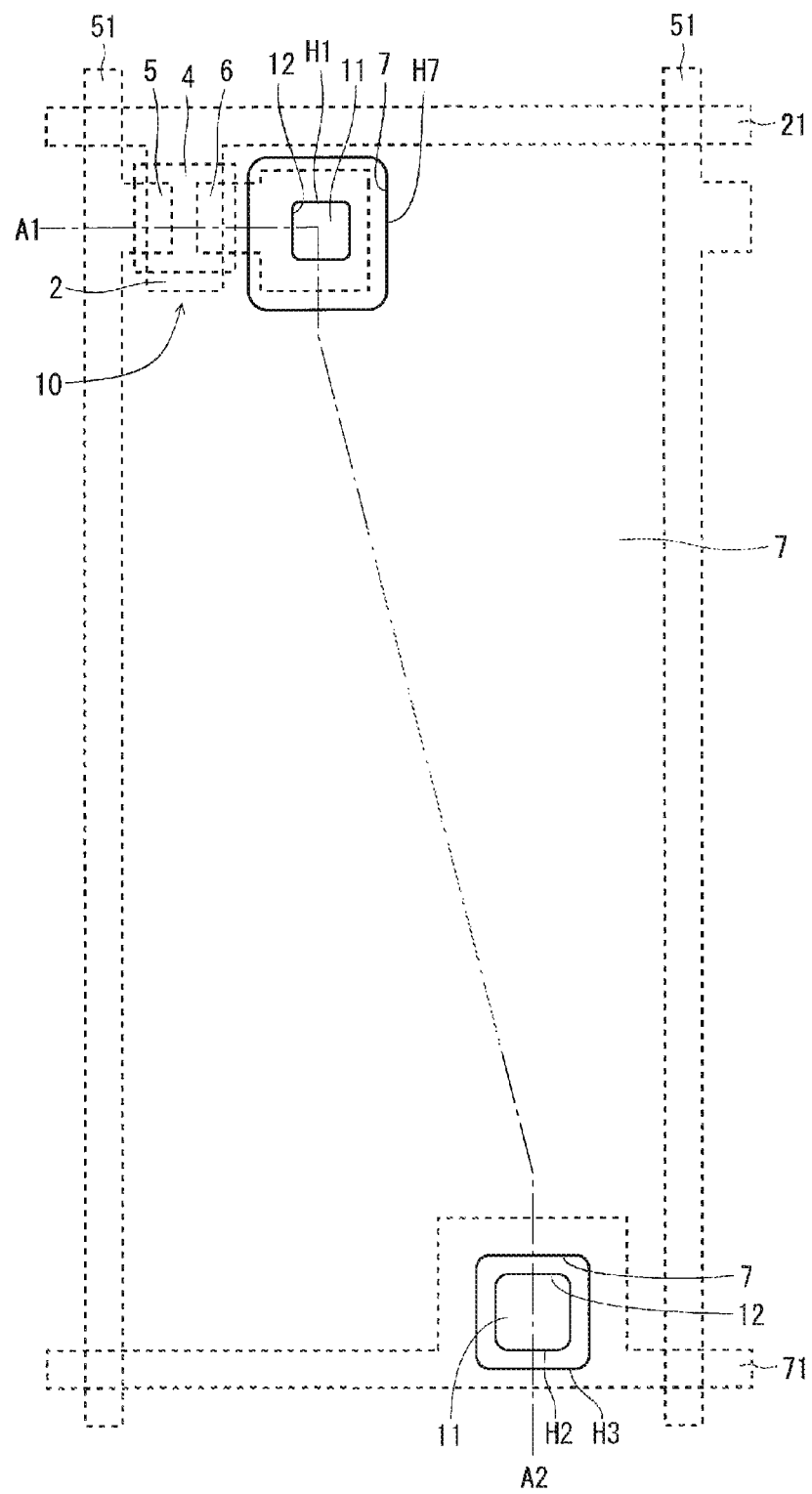
FIG. 12 is a plan view illustrating the step of manufacturing the array substrate according to the first preferred embodiment.

Thereafter, the resist mask 201 is removed by the peeling solution. FIG. 12 illustrates a plan view of the pixel region in this state. The TFT 10, the gate wiring 21, and the source wiring 51 are covered with the common electrode 7. The first interlayer insulating film 11 at the bottom of the aperture H1 is exposed inside the aperture H7. The first interlayer insulating film 11 at the bottom of the aperture H2 is exposed inside the aperture H3.

Figure 13:
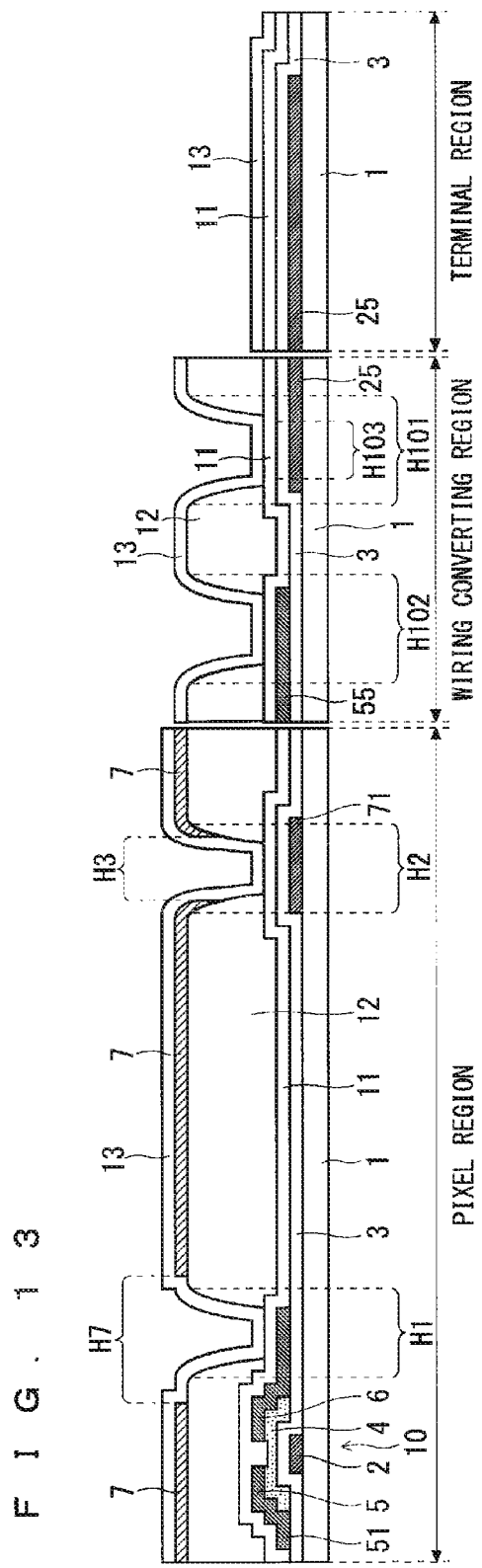
FIG. 13 is a cross sectional view illustrating the step of manufacturing the array substrate according to the first preferred embodiment.

The third interlayer insulating film 13 (for example, silicon nitride with thickness of 200 nm) is deposited by using the CVD method (FIG. 13). A resist mask 202 is formed in the sixth photoengraving step, and the aperture H8 and the aperture H5 are formed on the third interlayer insulating film 13 by dry etching using the resist mask 202 as a mask. The aperture H8 is included in the aperture H7 of the common electrode 7. The aperture H5 includes at least a part of the aperture H3 of the common electrode 7 so as to allow a part of the common electrode 7 to be exposed.

When the aperture H8 is formed on the third interlayer insulating film 13, the second interlayer insulating film 12 (the inner wall of the aperture H1) is exposed inside the aperture H8. However, when the etching is further continued, the second interlayer insulating film 12 becomes a mask and the first interlayer insulating film 11 at the bottom of the aperture H2 is removed, so that the aperture H4 that reaches the drain electrode 6 is formed. Further, when the aperture H5 is formed on the third interlayer insulating film 13, the common electrode 7 and the second interlayer insulating film 12 (the inner wall of the aperture H2) are exposed inside the aperture H5. When the etching is further continued, the common electrode 7 and the second interlayer insulating film 12 become masks, and the first interlayer insulating film 11 and the gate insulating film 3 at the bottom of the aperture H2 are removed, so that the aperture H6 that reaches the common wiring 71 is formed (FIG. 14).

Since the aperture H4 is thus formed by using the second interlayer insulating film 12 (the inner wall of the aperture H1) exposed inside the aperture H8 as a mask in a self-alignment manner, its shape is similar to the portion where the aperture H8 and the bottom portion of the aperture H2 overlap with each other. In the present preferred embodiment, since the aperture H8 includes the entire bottom portion of the aperture H2, the aperture H4 has a shape similar to the bottom portion of the aperture H2. Further, since the aperture H6 is formed by using the common electrode 7 and the second interlayer insulating film 12 (the inner wall of the aperture H2) exposed inside the aperture H5 as masks in a self-alignment manner, its shape is similar to a portion where the aperture H5, the aperture H3, and the bottom portion of the aperture H2 overlap with each other. In the present preferred embodiment, since the aperture H5 includes the aperture H3 entirely, and the aperture H3 includes the entire bottom portion of the aperture H2, the aperture H6 has a shape similar to the bottom portion of the aperture H2.

Figure 14:
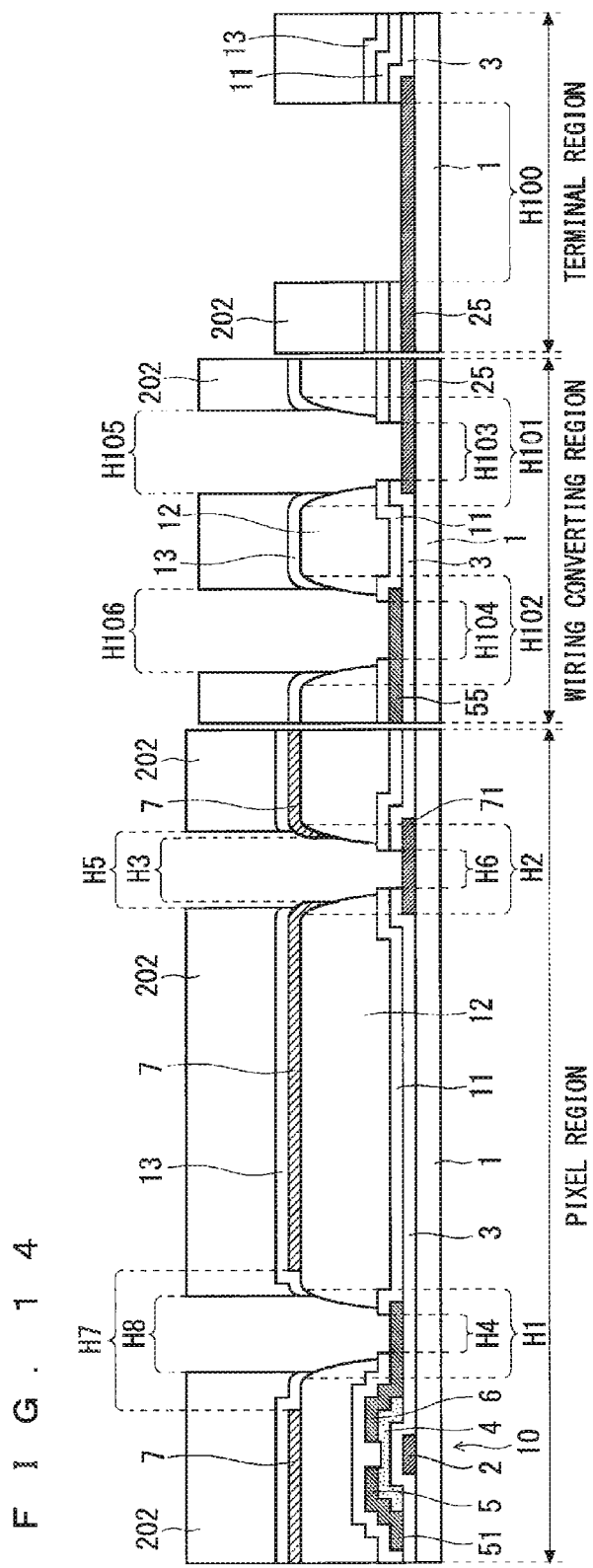
FIG. 14 is a cross sectional view illustrating the step of manufacturing the array substrate according to the first preferred embodiment.

Further, the aperture H105 and the aperture H106 are formed on the third interlayer insulating film 13 on the wiring converting region in the etching step shown in FIG. 14. The aperture H105 includes at least a part of the bottom portion of the aperture H101 of the second interlayer insulating film 12. The aperture H106 includes at least a part of the bottom portion of the aperture H102 of the second interlayer insulating film 12. When the aperture H105 is formed, the second interlayer insulating film 12 (the inner wall of the aperture H101) is exposed inside the aperture H105. However, when the etching is further continued, the second interlayer insulating film 12 becomes a mask, and the first interlayer insulating film 11 and the gate insulating film 3 at the bottom of the aperture H101 are removed, so that the aperture H103 that reaches the lead-out wiring 25 on the same layer as the gate wiring 21 is formed. Similarly, when the aperture H106 is formed, the second interlayer insulating film 12 (the inner wall of the aperture H102) is exposed inside the aperture H106. However, when the etching is further continued, the second interlayer insulating film 12 becomes a mask and the first interlayer insulating film 11 at the bottom of the aperture H102 is removed so that the aperture H104 that reaches the lead-out wiring 55 on the same layer as the source wiring 51 is formed.

Further, the aperture H100 is formed in the terminal region in this etching step. The aperture H100 pierces the third interlayer insulating film 13, the first interlayer insulating film 11, and the gate insulating film 3, so as to reach the lead-out wiring 25 on the same layer as the gate wiring 21.

Figure 15:
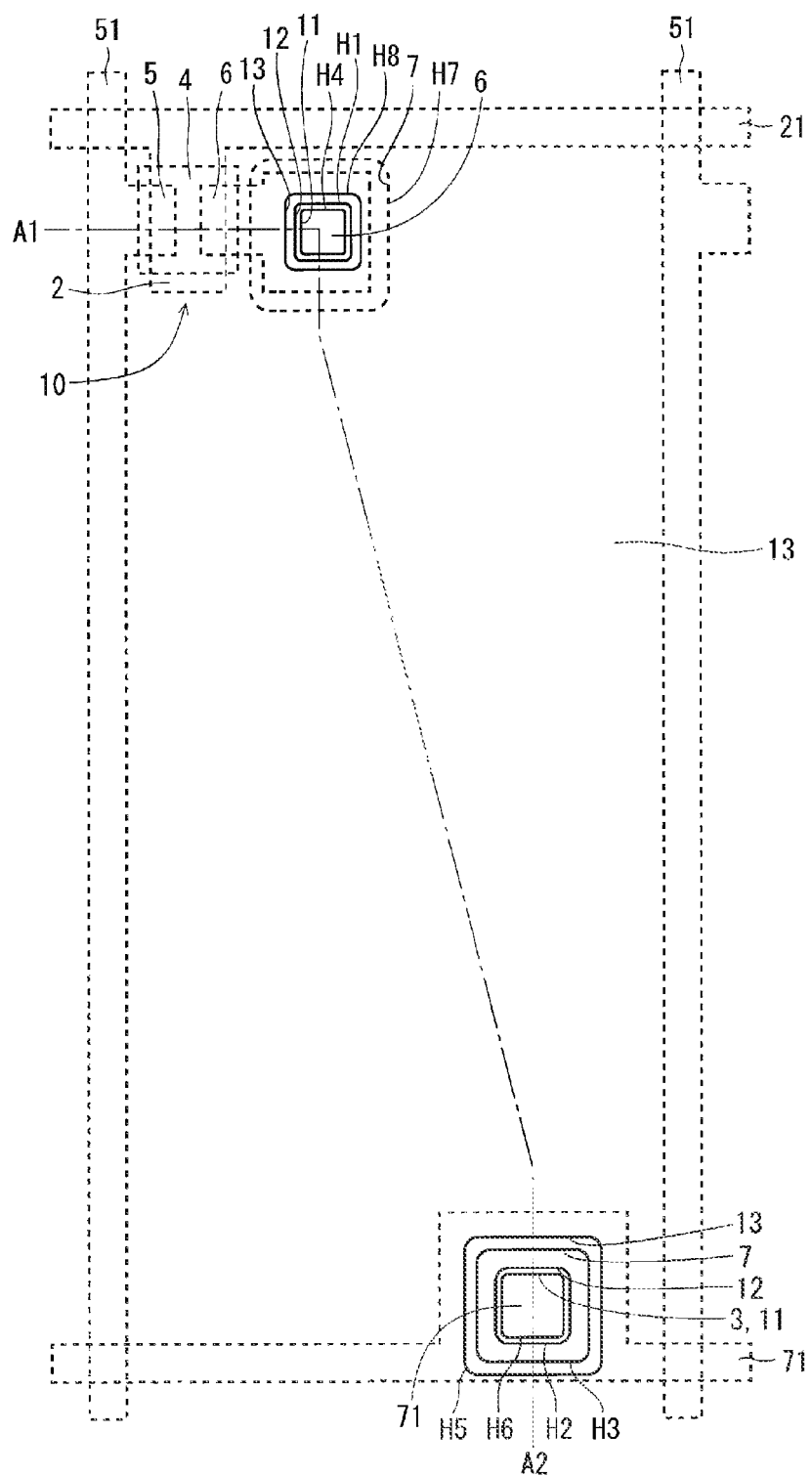
FIG. 15 is a plan view illustrating the step of manufacturing the array substrate according to the first preferred embodiment.

Thereafter, the resist mask 202 is removed by the peeling solution. FIG. 15 shows a plan view of the pixel region in this state. The drain electrode 6 at the bottom of the aperture H4 is exposed inside the aperture H8. The common electrode 7 is exposed on the edge portion of the aperture H5, and the common wiring 71 at the bottom of the aperture H6 is exposed on the bottom portion of the aperture H5.

Figure 16:
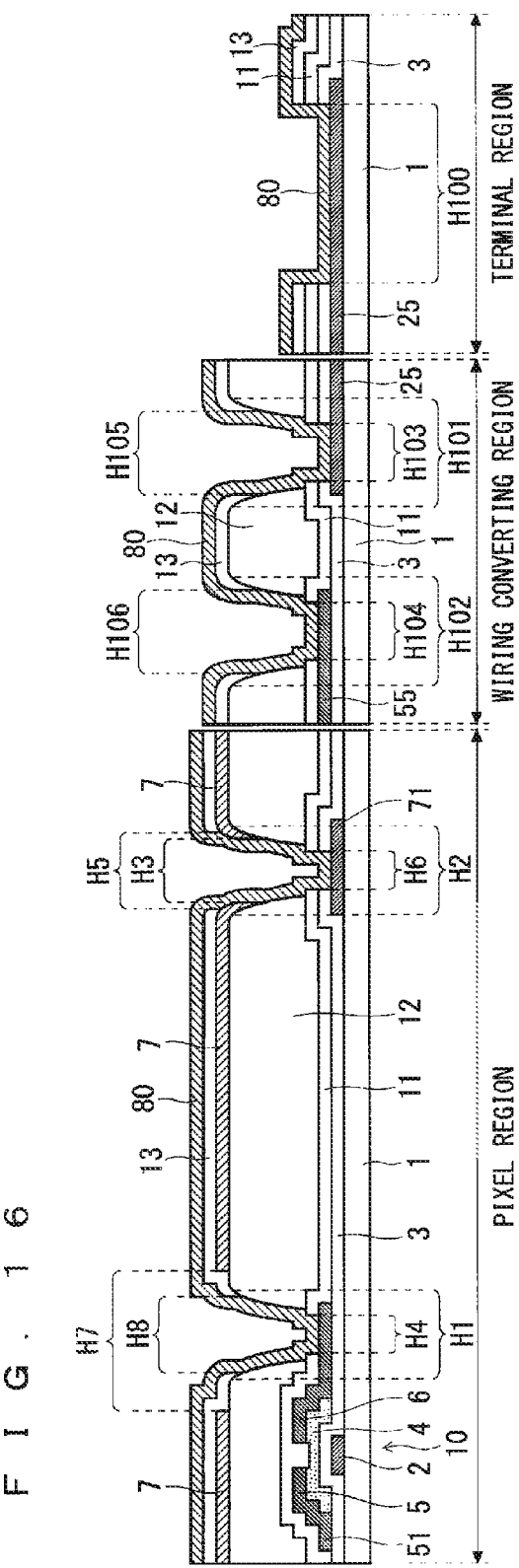
FIG. 16 is a cross sectional view illustrating the step of manufacturing the array substrate according to the first preferred embodiment.

Subsequently, a second transparent conductive film 80 (for example, IZO with thickness of 40 nm) is deposited by using the sputtering method (FIG. 16). A resist mask is formed in the seventh photoengraving step, and the second transparent conductive film 80 is patterned by etching using the resist mask as a mask, so that the pixel electrode 8 and the contact electrode 72 are formed. At this time, the terminal pad 85 is formed in the terminal region, and the connection pattern 86 is formed in the wiring converting region by using the second transparent conductive film 80. The IZO can be etched by using, for example, oxalic acid.

Thereafter, when the resist mask is removed by the peeling solution, the configuration shown in FIG. 3 and FIG. 4 can be obtained. The pixel electrode 8 is formed into a lattice shape or a pectinate shape having a slit, and is connected to the drain electrode 6 of the TFT 10 via the aperture H4 that pierces the third interlayer insulating film 13 and the first interlayer insulating film 11. The contact electrode 72 is formed on at least a part inside the aperture H5, and connects the common electrode 7 and the common wiring 71 exposed inside the aperture H5.

The terminal pad 85 in the terminal region is connected to the lead-out wiring 25 on the same layer as the gate wiring 21 via the aperture H100. The connection pattern 86 of the wiring converting region is connected with the lead-out wiring 25 on the same layer as the gate wiring 21 via the aperture H103, and is connected with the lead-out wiring 55 on the same layer as the source wiring 51 via the aperture H104, so as to electrically connect the lead-out wiring 25 and the lead-out wiring 55.

In a conventional method for manufacturing an array substrate having a planarizing film, a connecting portion of a pixel electrode on the drain electrode of TFT is normally subject to the dry etching twice, the wet etching once and the resist peeling three times. On the contrary, in the manufacturing method of the present preferred embodiment, the connecting portion of the pixel electrode 8 on the drain electrode 6 is subject only to the dry etching for forming the aperture H4 once and the resist peeling once. For this reason, a damage on the surface of the drain electrode 6 can be repressed.

Further, the aperture H6, which pierces the first interlayer insulating film 11 and the gate insulating film 3 to reach the common wiring 71, is formed on the bottom portion of the aperture H2 in a self-alignment manner by etching using the common electrode 7 and the second interlayer insulating film 12 exposed inside the aperture H5 of the third interlayer insulating film 13 as masks. For this reason, sizes of the aperture H3 of the common electrode 7 and the aperture H5 of the third interlayer insulating film 13 can be set considering only alignment of the aperture H3 and the aperture H5 with respect to the aperture H2 (alignment of the aperture H6 does not have to be taken into consideration), and an area of a contact hole that connects the common wiring 71 with the common electrode 7 can be made small.

Further, the aperture H4, which pierces the first interlayer insulating film 11 to reach the drain electrode 6, is formed on the bottom portion of the aperture H1 in a self-alignment manner by etching using the second interlayer insulating film 12 exposed inside the aperture H8 of the third interlayer insulating film 13 as a mask. For this reason, the size of the aperture H8 of the third interlayer insulating film 13 can be set considering only alignment of the aperture H8 with respect to the aperture H1 (alignment of the aperture H4 does not have to be taken into consideration), and an area of a contact hole for connecting the drain electrode 6 with the pixel electrode 8 can be made small.

In the first preferred embodiment, Al alloy is used as the first conductive film, and a laminated film of Al alloy and Mo alloy is used as the second conductive film, but another material may be used. The upper layer portions of the first conductive film and the second conductive film may be a low-resistant conductive film (or its laminated film), and the lower layer portion of the second conductive film may be a conductive film for enabling ohmic contact with silicon.

A semiconductor other than amorphous Si, such as an oxide semiconductor, poly Si or microcrystal Si may be used as the semiconductor film 4 of the TFT 10. An insulating film other than silicon nitride film, such as silicon oxide film, may be used as the gate insulating film 3, the first interlayer insulating film 11, and the third interlayer insulating film 13. A transparent conductive film other than IZO, such as ITO or ITZO, may be used as the first transparent conductive film and the second transparent conductive film.

Further, the second interlayer insulating film 12 is not limited to the photosensitive organic resin film, and a thick insulating film such as an SOG film may be used. In this case, the apertures H1, H2, H101, and H102 of the second interlayer insulating film 12 are formed by etching where selectivity between the first interlayer insulating film 11 and the gate insulating film 3 can be secured.

Further, in the first preferred embodiment, the channel region of the TFT 10 (the portion between the source electrode 5 and the drain electrode 6 on the semiconductor film 4) is covered with the common electrode 7, but the common electrode 7 above the channel region may be removed.

In the manufacturing method of the first preferred embodiment, the conductive film is formed by the sputtering method, and the insulating film is formed by the CVD method, but other methods may be used in these cases.

Further, a positional relationship among the aperture H2 of the second interlayer insulating film 12, the aperture H3 of the common electrode 7, the aperture H5 of the third interlayer insulating film 13, and the aperture H6 of the first interlayer insulating film 11 and the gate insulating film 3 provided to connect the common wiring 71 and the common electrode 7, may be such that the aperture H5 includes at least a part of the aperture H3 and at least a part of the bottom portion of the aperture H2. As a result, in the etching step of forming the aperture H5 (FIG. 14), the common wiring 71 is exposed inside the aperture H5, and the aperture H6 that reaches the common electrode 7 can be formed inside the aperture H2.

In the first preferred embodiment, the common wiring 71 is made of the first conductive film, and the common electrode 7 is connected with the common wiring 71 on the second interlayer insulating film 12 via the apertures H2 and H6. However, the common wiring 71 may be formed by using the first transparent conductive film on the second interlayer insulating film 12 according to the size of the array substrate 110 to be formed (namely, the common electrode 7 may be used directly as the common wiring). Further, the common wiring 71 formed by using a third conductive film (not shown) may be arranged above the second interlayer insulating film 12. When the common wiring 71 is arranged above the second interlayer insulating film 12, the common wiring 71 may be arranged above or below the common electrode 7 so as to be connected directly with the common electrode 7.

Further, the common wiring 71 made of the third conductive film is arranged above the third interlayer insulating film 13, and the common wiring 71 and the common electrode 7 may be connected via an aperture provided to the third interlayer insulating film 13. When the common wiring 71 made of the third conductive film is arranged above the third interlayer insulating film 13, the aperture H4 of the first interlayer insulating film 11 that is provided on the drain electrode 6 is desirably covered with the third conductive film. Further, the aperture H8 of the third interlayer insulating film 13 is also desirably covered with the third conductive film. When the drain electrode 6 is covered with the third conductive film, the drain electrode 6 can be prevented from causing a damage due to the etching of the third conductive film. Further, disconnection of the pixel electrode 8 due to a level difference of the aperture H8 can be prevented, and a point defect can be reduced.

Further, the third conductive film on an upper layer with respect to the second interlayer insulating film 12 may be used to form a pattern that covers the upper part of the TFT 10. As a result, light from above the array substrate 110 is shielded, and generation of an optical leak current can be repressed. In this case, when a material such as Mo with low reflectance is used for the bottom layer of the third conductive film, light from below the array substrate 110 can be prevented from being reflected from the third conductive film and from being emitted to the TFT 10, so that the optical leak current can be further reduced.

First Modified Preferred Example

Figure 17:
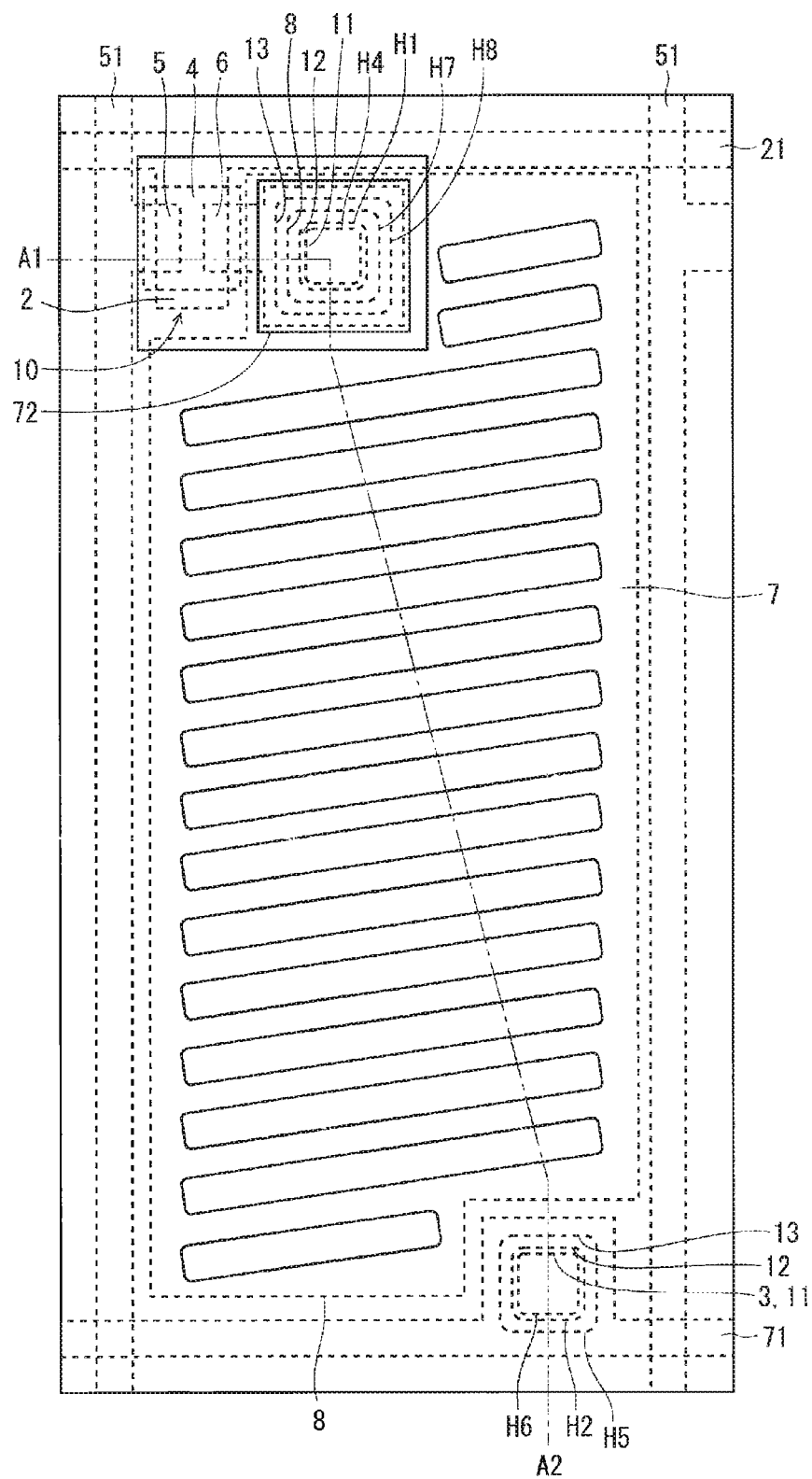
FIG. 17 is a plan view of the pixel of the array substrate according to a first modified preferred example of the first preferred embodiment.
Figure 18:
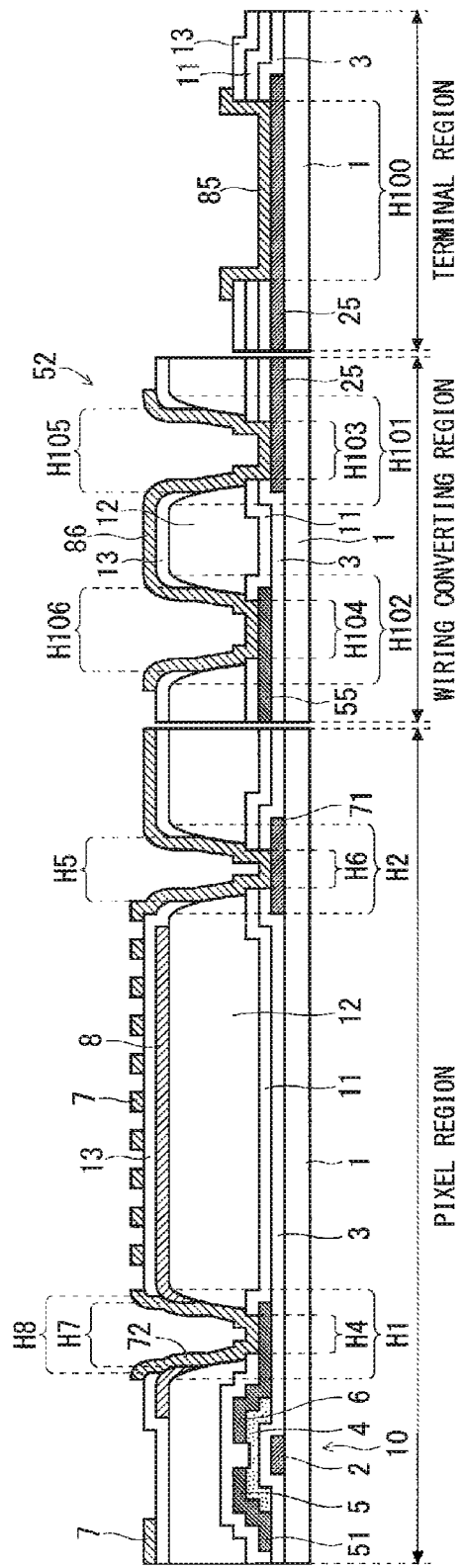
FIG. 18 is a cross sectional view of the main section of the array substrate according to the first modified preferred example of the first preferred embodiment.

The common electrode 7 is disposed under the pixel electrode 8 as shown in FIG. 3 and FIG. 4, however, the common electrode 7 may be disposed above the pixel electrode 8. That is to say, as shown in FIG. 17 and FIG. 18, the plate-shaped pixel electrode 8 made of the first transparent conductive film is disposed on the second interlayer insulating film 12, and the common electrode 7, which has the lattice shape or the pectinate shape and is made of the second transparent conductive film, may be disposed above the pixel electrode 8.

In this case, a part of the pixel electrode 8 is formed on the inner wall of the aperture H1 of the second interlayer insulating film 12 formed on a position corresponding to the drain electrode 6, and the contact electrode 72 made of the second transparent conductive film is formed inside the aperture H1. The contact electrode 72 is connected with the pixel electrode 8 on the inner wall of the aperture H1, and is connected with the drain electrode 6 via the aperture H4 of the first interlayer insulating film 11 formed inside the aperture H1. As a result, the drain electrode 6 and the pixel electrode 8 are electrically connected with each other. Further, the common electrode 7 is connected with the common wiring 71 via the aperture H2 of the second interlayer insulating film 12 formed on the position corresponding to the common wiring 71 and the aperture H6 of the first interlayer insulating film 11 formed inside the aperture H2.

This configuration can be realized by changing the sizes and the positions of the aperture H7 of the first transparent conductive film (the pixel electrode 8), the aperture H5 and the aperture H8 of the third interlayer insulating film 13, with respect to FIG. 3 and FIG. 4, and forming the contact electrode 72 at least a part inside the aperture H8.

The method for manufacturing the array substrate 110 shown in FIG. 17 and FIG. 18 will be described below. The methods for forming the terminal region and the wiring converting region are similar to those in the first preferred embodiment, description about the forming methods are therefore omitted.

Figure 19:
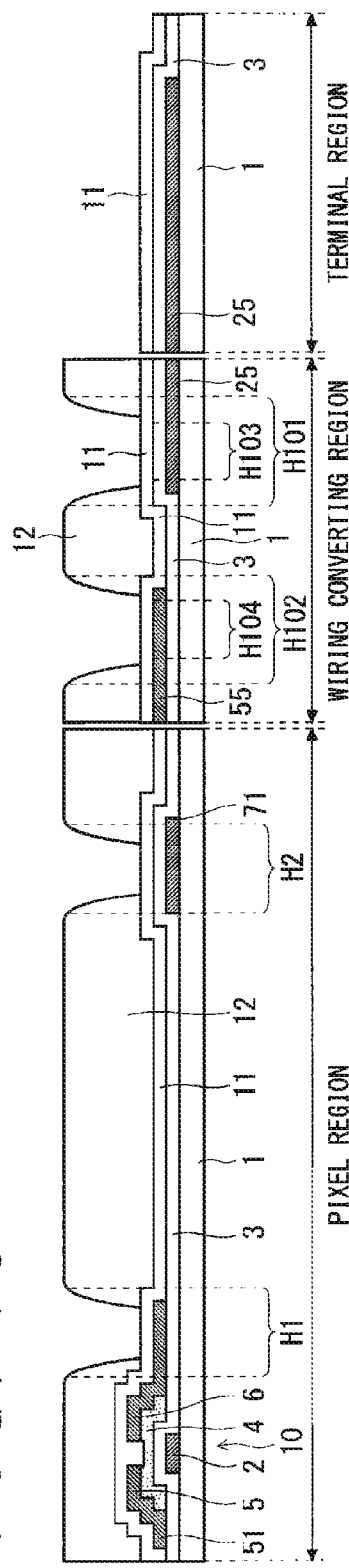
FIG. 19 is a cross sectional view illustrating a step of manufacturing the array substrate according to the first modified preferred example of the first preferred embodiment.
Figure 20:
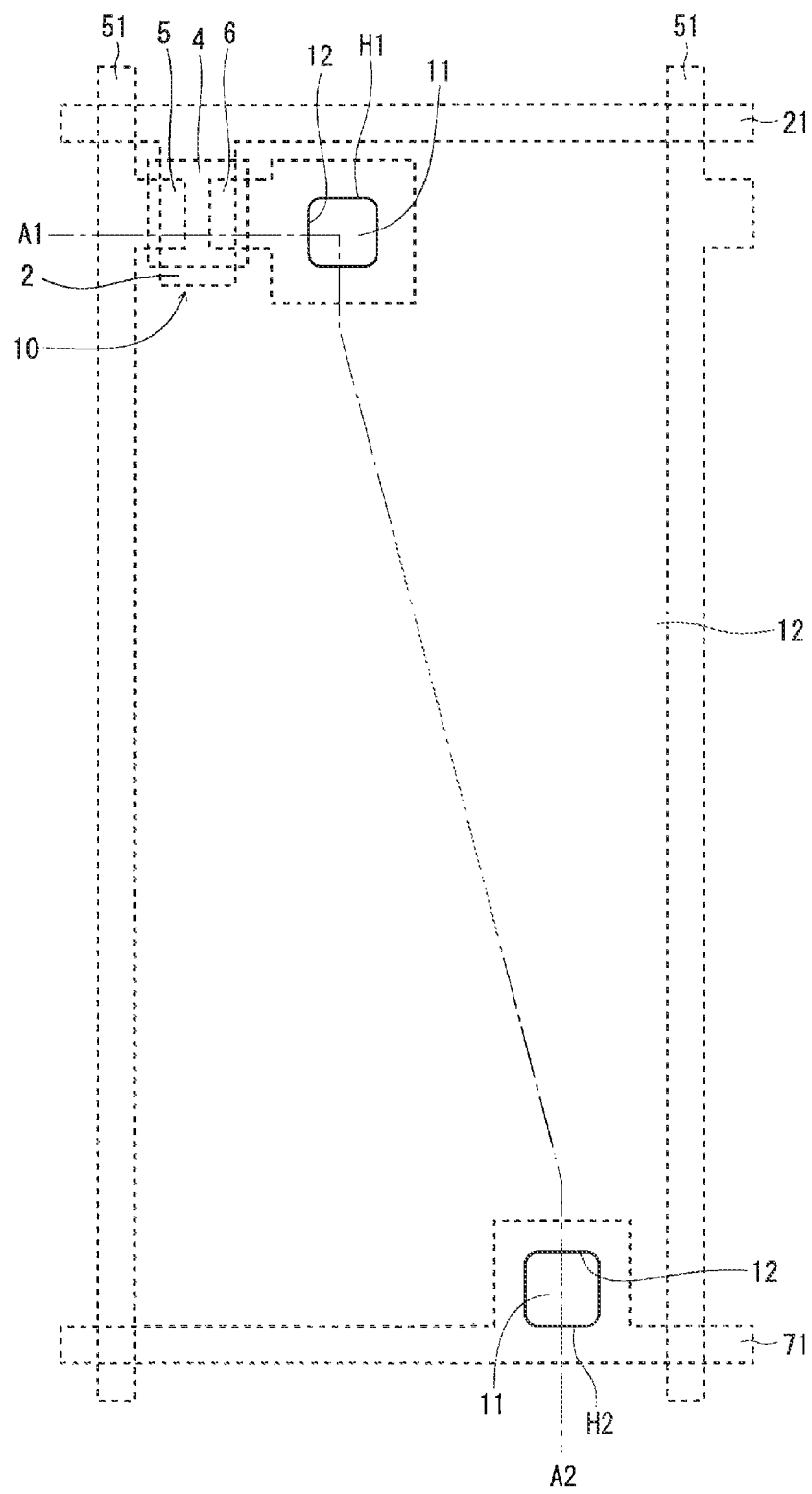
FIG. 20 is a plan view illustrating the step of manufacturing the array substrate according to the first modified preferred example of the first preferred embodiment.

The TFT 10, the first interlayer insulating film 11, and the second interlayer insulating film 12 are formed on the substrate 1, and the apertures H1 and H2 are formed on the second interlayer insulating film 12 by the method similar to the steps described with reference to FIG. 5 to FIG. 8 (FIG. 19). FIG. 20 shows a plan view of the pixel region in this state. The photoengraving step has been executed four times.

Figure 21:
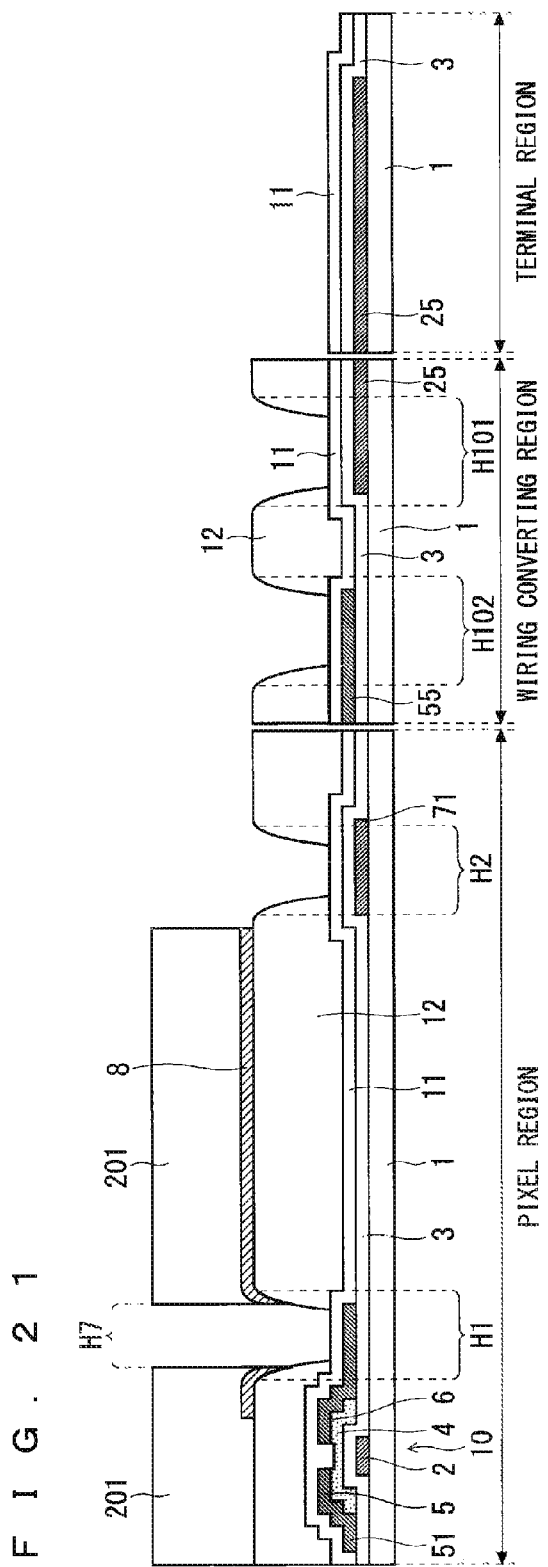
FIG. 21 is a cross sectional view illustrating the step of manufacturing the array substrate according to the first modified preferred example of the first preferred embodiment.

A first transparent conductive film (for example, IZO with thickness of 80 nm) is deposited, and the resist mask 201 is formed thereon in the fifth photoengraving step. The first transparent conductive film is patterned by etching using the resist mask 201 as a mask, so that the pixel electrode 8 is formed (FIG. 21). At this time, the aperture H7 is formed on a position of the second interlayer insulating film 12 corresponding to the aperture H1 on the pixel electrode 8. The aperture H7 is arranged so that its part is included in the aperture HE and a part of the pixel electrode 8 is formed on the inner wall of the aperture H1. Further, the aperture H7 is arranged so as to include at least a part of the bottom portion of the aperture H1. The pixel electrode 8 is formed so as not to be overlapped with the aperture H2.

Figure 22:
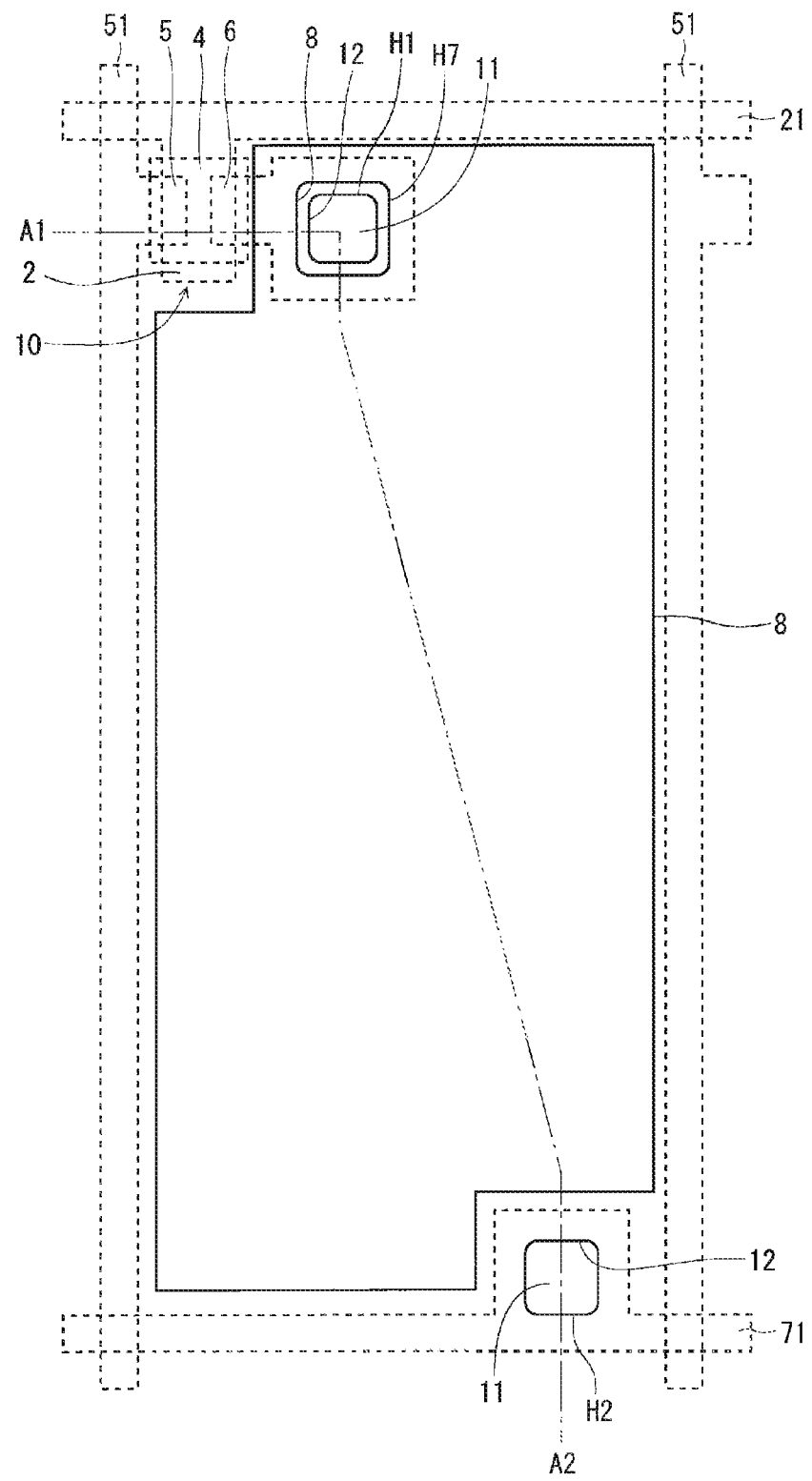
FIG. 22 is a plan view illustrating the step of manufacturing the array substrate according to the first modified preferred example of the first preferred embodiment.

Thereafter, the resist mask 201 is removed by the peeling solution. FIG. 22 shows a plan view of the pixel region in this state. The first interlayer insulating film 11 at the bottom of the aperture H1 is exposed inside the aperture H7. The first interlayer insulating film 11 at the bottom of the aperture H2 is exposed on the region separated from the pixel electrode 8.

The third interlayer insulating film 13 (for example, silicon nitride with thickness of 200 nm) is deposited by using the CVD method, and the resist mask 202 is formed thereon in the sixth photoengraving step. The aperture H8 that includes at least a part of the aperture H7 of the pixel electrode 8, and the aperture H5 that includes at least a part of the bottom portion of the second interlayer insulating film 12 are formed by dry etching using the resist mask 202 as a mask.

Figure 23:
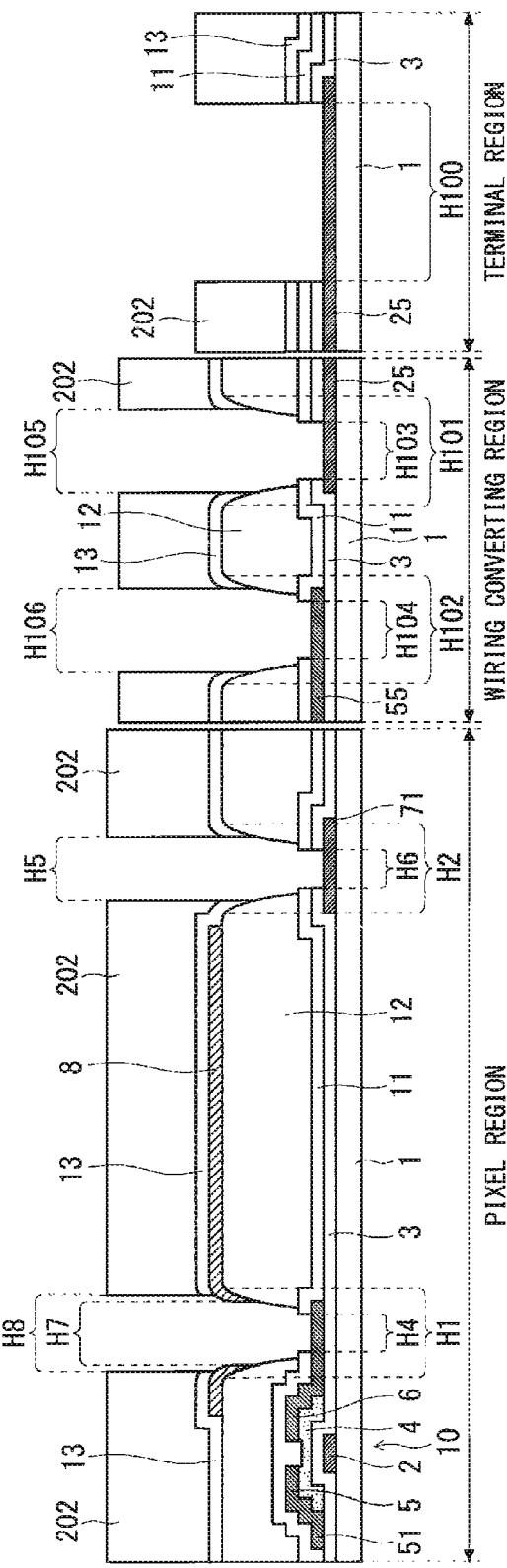
FIG. 23 is a cross sectional view illustrating the step of manufacturing the array substrate according to the first modified preferred example of the first preferred embodiment.

When the aperture H8 is formed on the third interlayer insulating film 13, the pixel electrode 8 and the second interlayer insulating film 12 (the inner wall of the aperture H1) are exposed inside the aperture H8. However, when the etching is further continued, the pixel electrode 8 and the second interlayer insulating film 12 become masks and the first interlayer insulating film 11 at the bottom of the aperture H1 is removed, so that the aperture H4 that reaches the drain electrode 6 is formed. Further, when the aperture H5 is formed on the third interlayer insulating film 13, the second interlayer insulating film 12 (the inner wall of the aperture H2) is exposed inside the aperture H5. When the etching is further continued, the second interlayer insulating film 12 becomes a mask, and the first interlayer insulating film 11 and the gate insulating film 3 at the bottom of the aperture H2 are removed, so that the aperture H6 that reaches the common wiring 71 is formed (FIG. 23).

Since the aperture H4 is formed by using the pixel electrode 8 and the second interlayer insulating film 12 exposed inside the aperture H8 as masks in a self-alignment manner, its shape is similar to the region where the aperture H8, the aperture H7, and the bottom portion of the aperture H2 overlap with each other. Further, since the aperture H6 is formed by using the second interlayer insulating film 12 exposed inside the aperture H5 as a mask in a self-alignment manner, its shape is similar to the region where the aperture H6 and the bottom portion of the aperture H2 overlap with each other.

Figure 24:
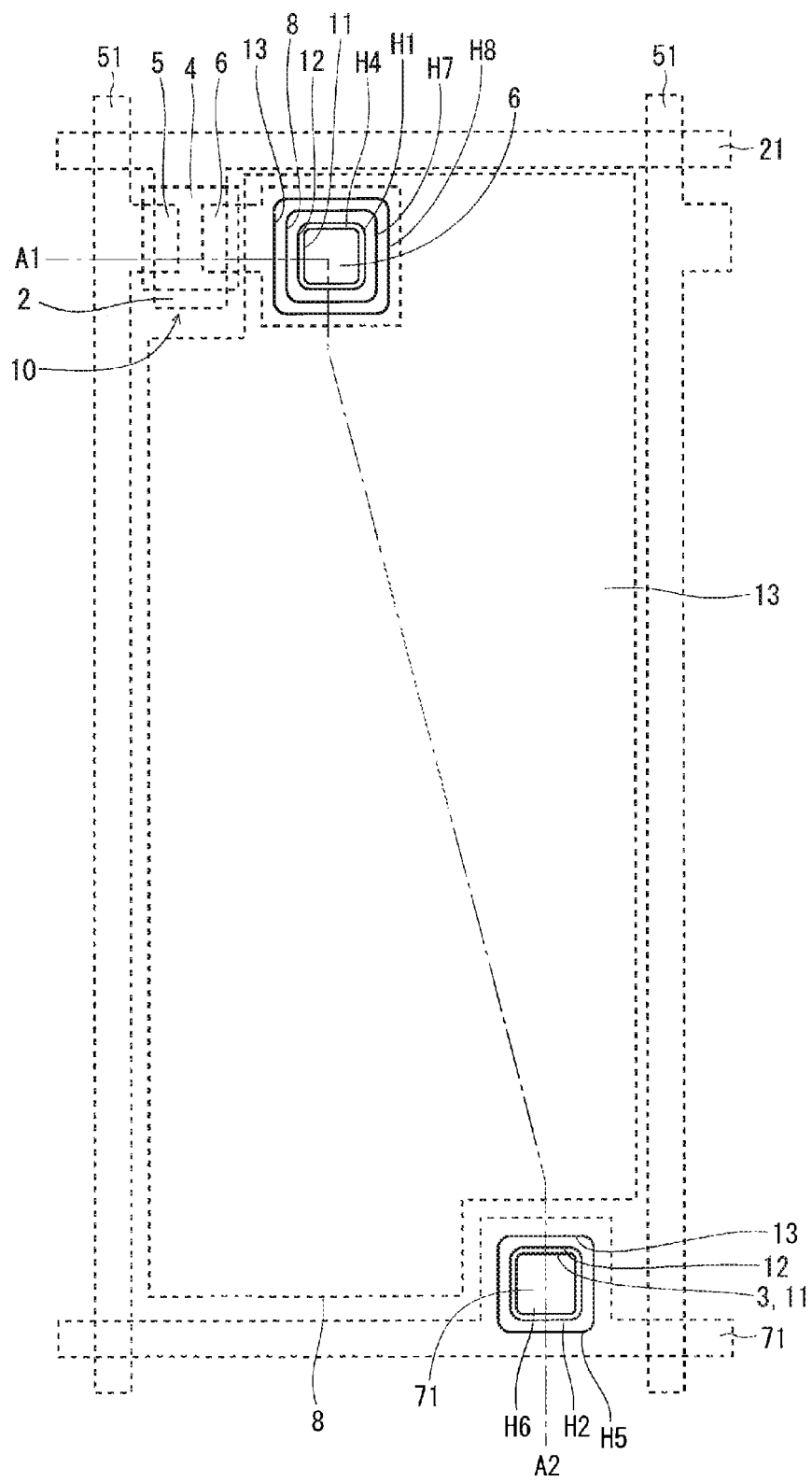
FIG. 24 is a plan view illustrating the step of manufacturing the array substrate according to the first modified preferred example of the first preferred embodiment.

Thereafter, the resist mask 202 is removed by the peeling solution. FIG. 24 shows a plan view of the pixel region in this state. The pixel electrode 8 on the inner wall of the aperture H1 and the drain electrode 6 at the bottom portion of the aperture H4 are exposed inside the aperture H8. Further, the common wiring 71 at the bottom of the aperture H6 is exposed inside the aperture H5.

Subsequently, the second transparent conductive film (for example, IZO with thickness of 40 nm) is deposited by using the sputtering method, and a resist mask is formed thereon in the seventh photoengraving step. The second transparent conductive film is patterned by using the resist mask as a mask, so that the common electrode 7 and the contact electrode 72 are formed.

The common electrode 7 is formed into a lattice shape or a pectinate shape having a slit, and is connected with the common wiring 71 via the apertures H5, H2, and H6. The contact electrode 72 is formed on at least a part inside the aperture H8, and contacts with the pixel electrode 8 exposed inside the aperture H8 and the drain electrode 6 exposed on the bottom of the aperture H4, so that the pixel electrode 8 and the drain electrode 6 are electrically connected.

Thereafter, when the resist mask is removed by the peeling solution, a configuration shown in FIG. 17 and FIG. 18 is obtained.

Second Modified Preferred Example

Figure 25:
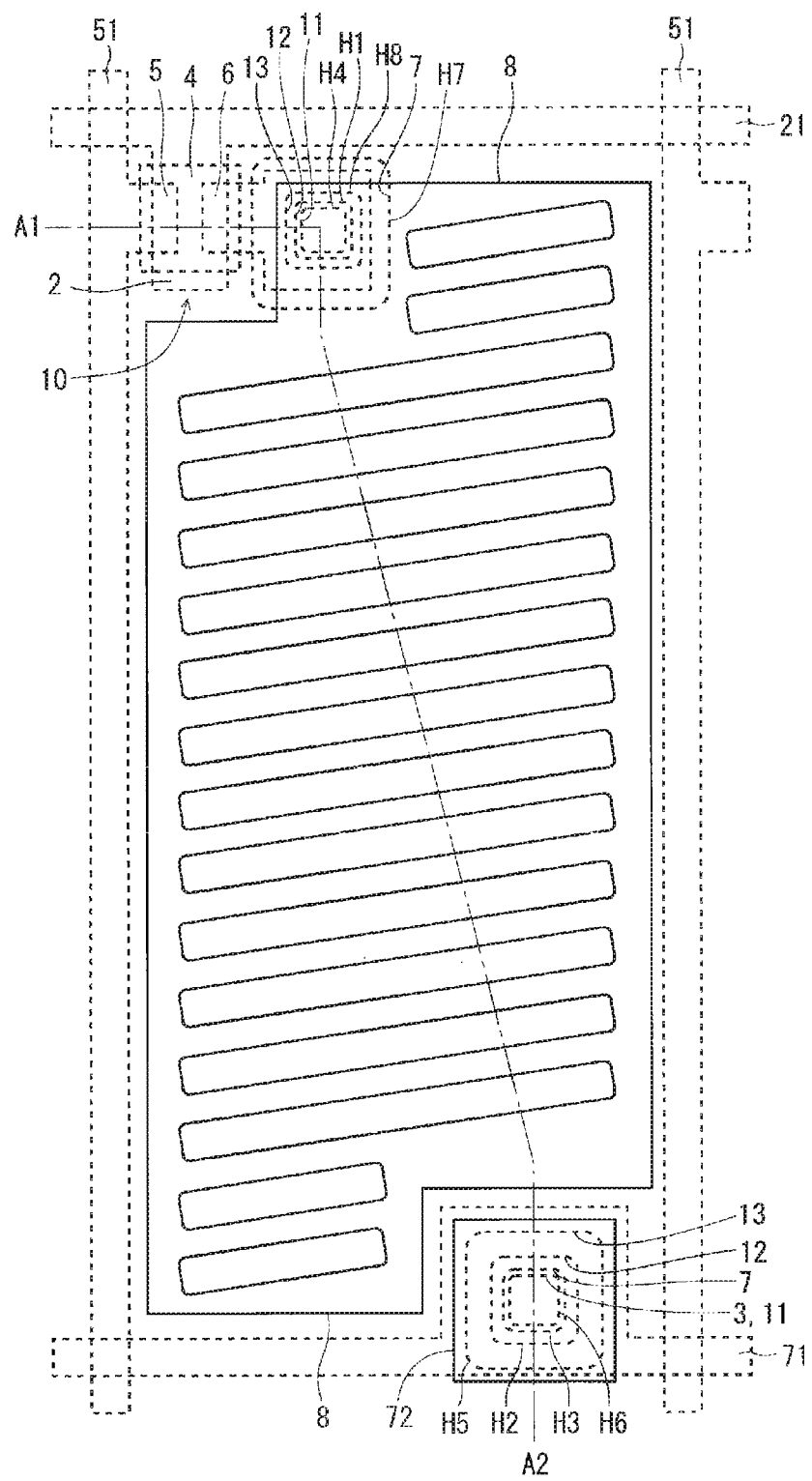
FIG. 25 is a plan view of the pixel of the array substrate according to a second modified preferred example of the first preferred embodiment.
Figure 26:
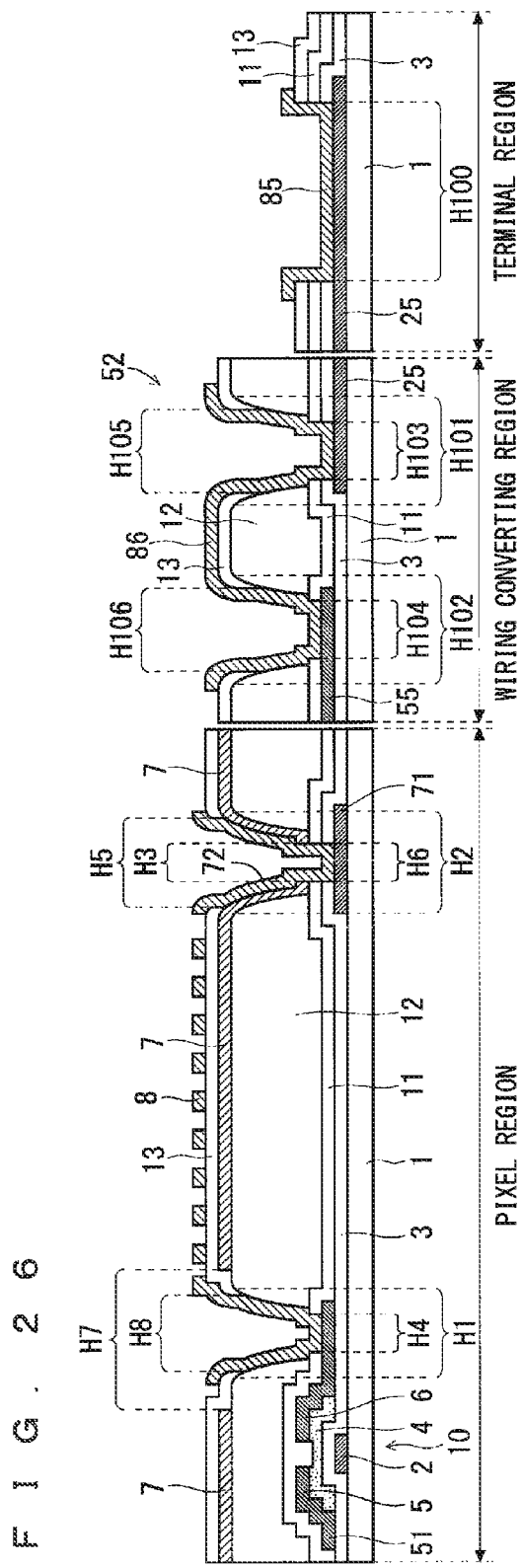
FIG. 26 is a cross sectional view of the main section of the array substrate according to the second modified preferred example of the first preferred embodiment.

In the first preferred embodiment, the aperture H3 that is made of the first transparent conductive film and is provided with the common electrode 7 should include at least a part of the bottom portion of the aperture H2 of the second interlayer insulating film 12, but the inner wall of the aperture H2 does not always have to be exposed inside the aperture H3. For this reason, as shown in FIG. 25 and FIG. 26, the aperture H3 may be entirely included in the bottom portion of the aperture H2.

In this case, the common electrode 7 formed on the inner wall of the aperture H2 reaches the first interlayer insulating film 11 at the bottom of the aperture H2. Further, the aperture H6 that pierces the gate insulating film 3 and the first interlayer insulating film 11 and reaches the common wiring 71 is formed inside the aperture H3 of the common electrode 7 in a self-alignment manner, the aperture H6 is similar to the aperture H3 in shape.

In the present modified preferred example, the area of the aperture H3 can be made smaller than that in the first preferred embodiment. Therefore, even when a design rule of an overlapping pattern of the aperture H3 and the aperture H5 for defining the region where the common electrode 7 is exposed inside the aperture H5 is set to be equivalent to that in the first preferred embodiment, the area of the aperture H5 can be made smaller than that in the first preferred embodiment. Therefore, the occupancy area of the contact electrode 72 can be reduced, and the region of the pixel electrode 8 can be widened. As a result, the aperture ratio of pixels 111 can be heightened, and the power consumption of the backlight unit 145 can be repressed.

Figure 27:
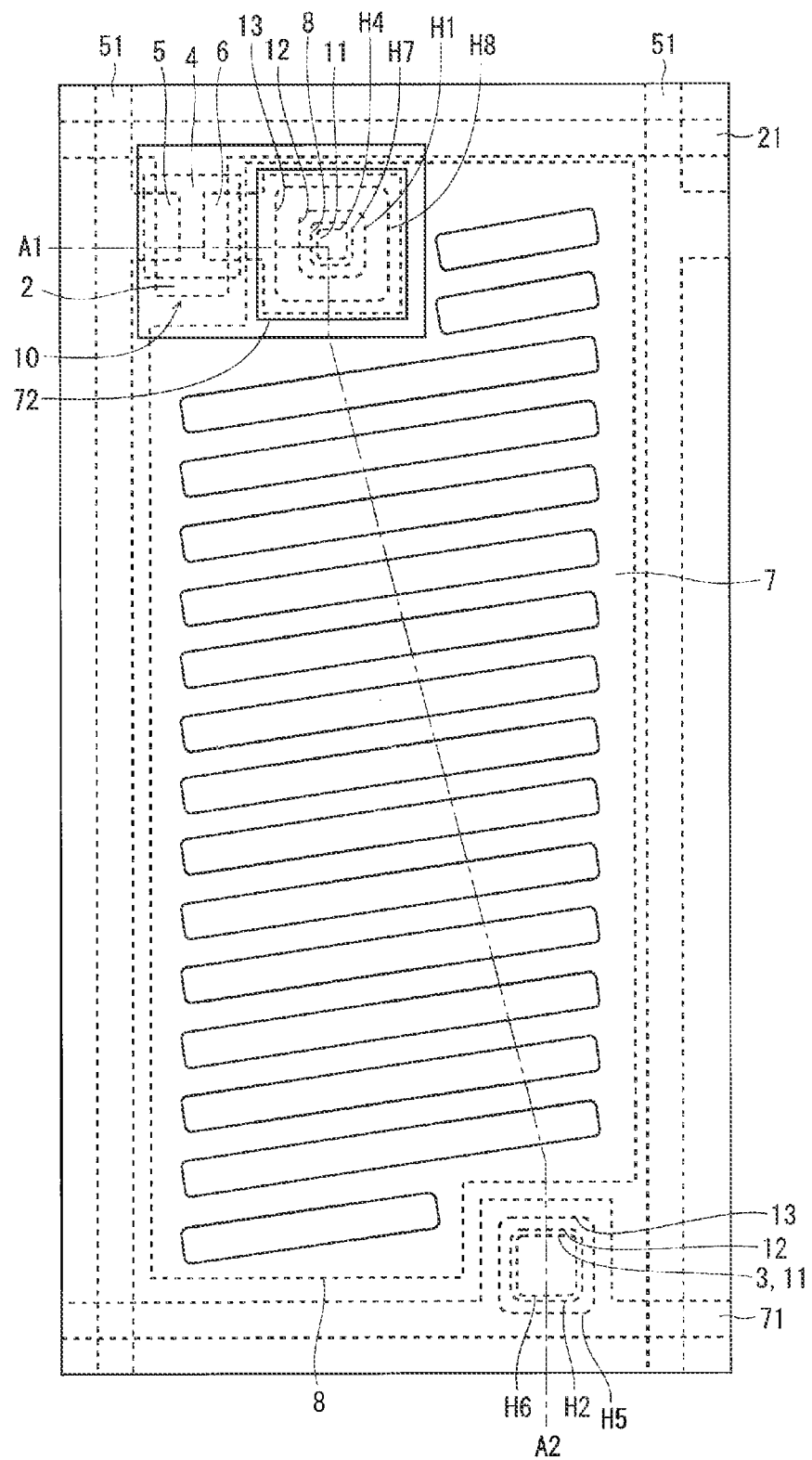
FIG. 27 is a plan view of the pixel of the array substrate according to the second modified preferred example of the first preferred embodiment.
Figure 28:
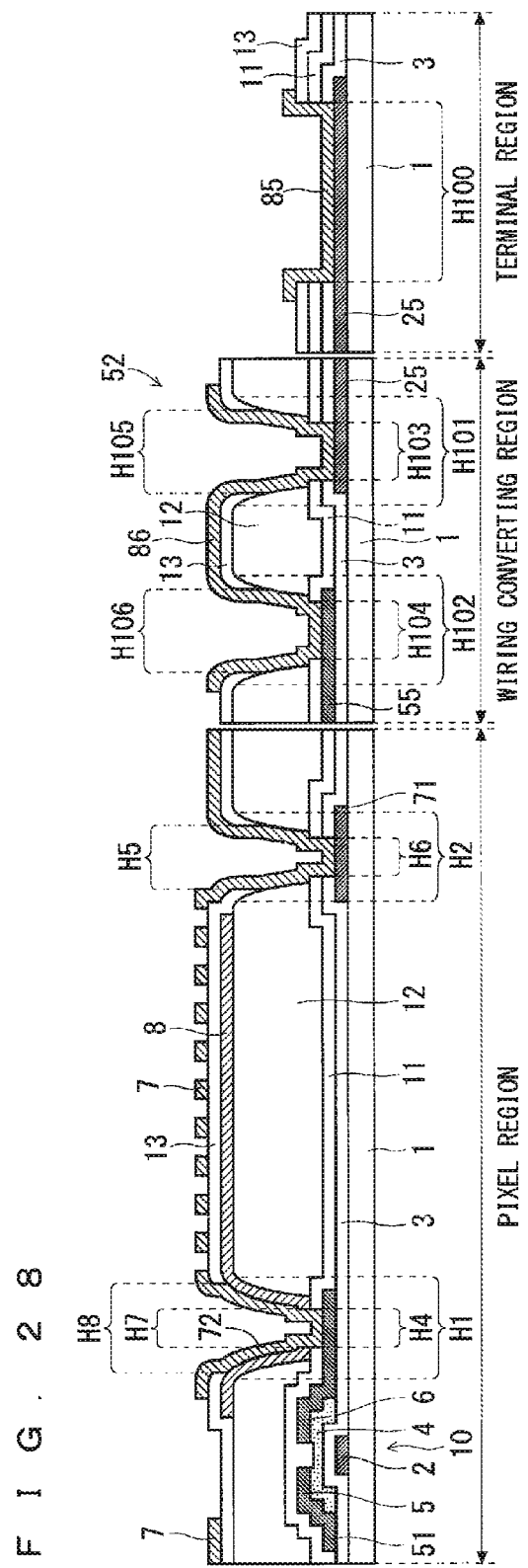
FIG. 28 is a cross sectional view of the main section of the array substrate according to the second modified preferred example of the first preferred embodiment.

The present modified preferred example can be applied also to the first modified preferred example. That is to say, as shown in FIG. 27 and FIG. 28, in the configuration where the common electrode 7 made of the second transparent conductive film is disposed above the pixel electrode 8 made of the first transparent conductive film, the entire aperture H7 provided with the pixel electrode 8 may be included in the bottom portion of the aperture H1 of the second interlayer insulating film 12.

In this case, the pixel electrode 8 formed on the inner wall of the aperture H1 reaches the first interlayer insulating film 11 at the bottom of the aperture H1. Further, since the aperture H4 that pierces the first interlayer insulating film 11 to reach the drain electrode 6 is formed inside the aperture H7 of the pixel electrode 8 in a self-alignment manner, the aperture H4 is similar to the aperture H7 in shape.

Second Preferred Embodiment

Figure 29:
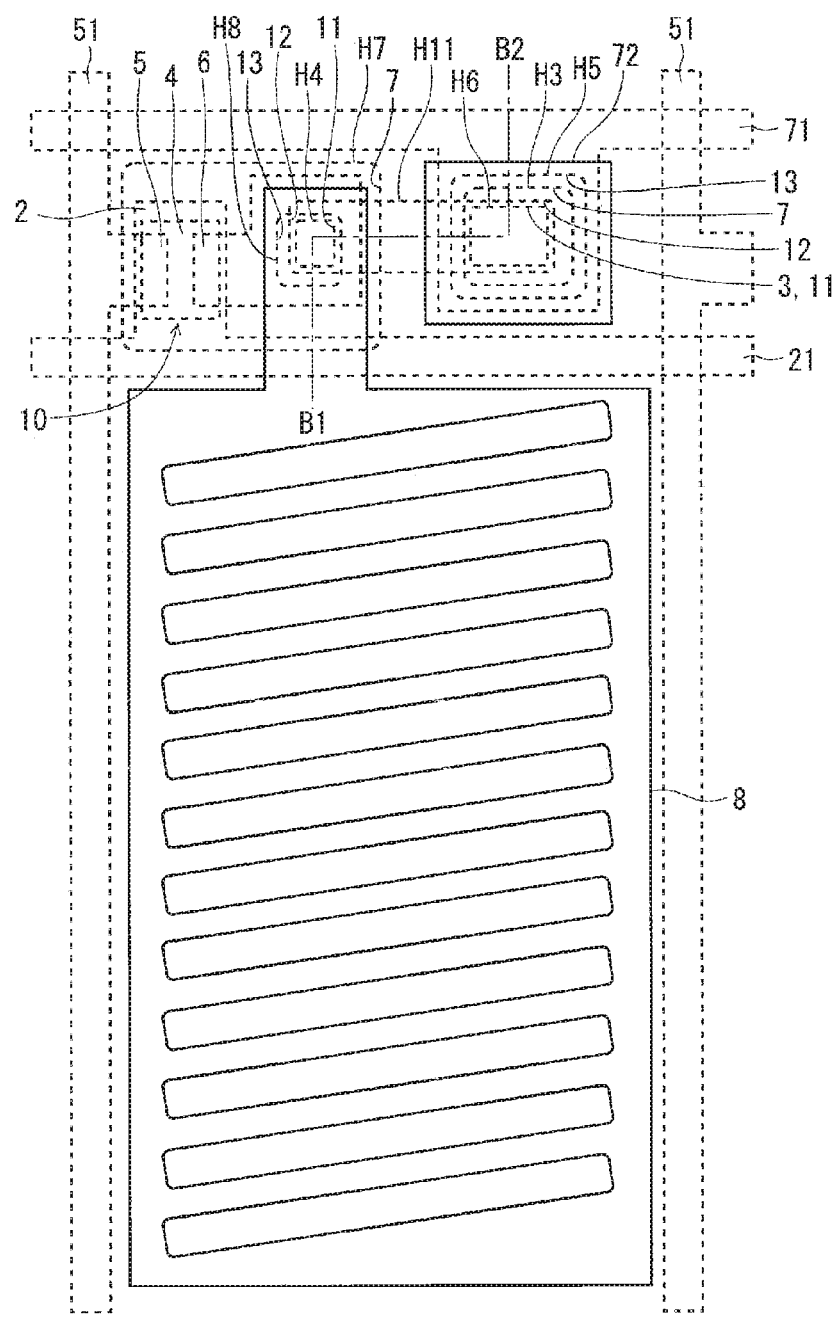
FIG. 29 is a plan view of the pixel of the array substrate according to a second preferred embodiment.
Figure 30:
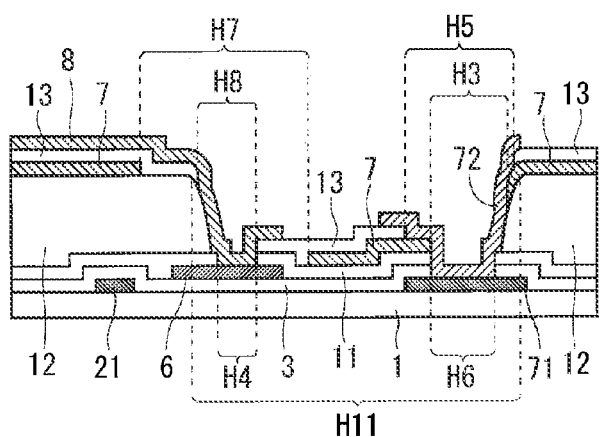
FIG. 30 is a cross sectional view of the main section of the array substrate according to the second preferred embodiment.

FIG. 29 and FIG. 30 are diagrams illustrating a configuration of an array substrate 110 according to the second preferred embodiment. FIG. 29 is the diagram illustrating a plan configuration of the pixels 111 in the array substrate 110. FIG. 30 is the diagram illustrating a cross-sectional configuration of the forming region (pixel region) for the pixels 111 and corresponds to a cross section taken along line B1-B2 shown in FIG. 29. Since configurations of a forming region (a wiring converting region) for a wiring converter 52 that connects a lead-out wiring 55 of a source wiring 51 with a lead-out wiring 25 on the same layer as a gate wiring 21 and a forming region (a terminal region) for terminals to be provided with end portions of the gate wirings 21 or the source wirings 51 are similar to those in the first preferred embodiment, illustration and description about them are omitted.

In the first preferred embodiment, an aperture H1 of a second interlayer insulating film 12 provided above a drain electrode 6 is separated from an aperture H2 of the second interlayer insulating film 12 provided above a common wiring 71, but in the second preferred embodiment, the apertures H1 and H2 are connected to be formed. That is to say, the drain electrode 6 and the common wiring 71 are arranged so as to be close to each other, and an aperture H11 is provided across the drain electrode 6 and the common wiring 71 on the second interlayer insulating film 12 as shown in FIG. 29 and FIG. 30. The shape of the aperture H11 in the plan view is an outline of the bottom portion of the aperture H11.

An aperture H7 is formed on a position corresponding to the drain electrode 6, and an aperture H3 is formed on a position corresponding to the common wiring 71 on a common electrode 7 made of a first transparent conductive film. The aperture H7 includes a part of the bottom portion of the aperture H11. A part of the end of the aperture H7 is positioned outside the bottom portion of the aperture H11. At least a part of the aperture H3 is included in the aperture H11. A part of the end portion of the aperture H3 is positioned on the inclined plane of the inner wall of the aperture H11 on the side of the common electrode 7. Therefore, a part of the common electrode 7 is formed on the inner wall of the aperture H11 on the side of the common wiring 71.

An aperture H8 included in the aperture H7 of the common electrode 7, and an aperture H5 including at least a part of the aperture H3 of the common electrode 7 are formed on a third interlayer insulating film 13 that covers the common electrode 7. An aperture H4 that pierces a first interlayer insulating film 11 to reach the drain electrode 6 is formed in a region where the aperture H8 and the bottom portion of the aperture H11 overlap with each other. The shape of the aperture H4 is similar to the region where the bottom portion of the aperture H11 and the aperture H8 overlap with each other.

A portion around the aperture H3 on the common electrode 7 (including a portion formed on the inner wall of the aperture H11) is exposed inside the aperture H5 of the third interlayer insulating film 13. Further, an aperture H6 that pierces the first interlayer insulating film 11 and a gate insulating film 3 to reach the common wiring 71 is formed in a region where the bottom portion of the aperture H11, the aperture H5 and the aperture H3 overlap with each other. That is to say, the shape of the aperture H6 is similar to the region where the bottom portion of the aperture H11, the aperture H5, and the aperture H3 overlap with each other.

A pixel electrode 8 and a contact electrode 72 that are made of a second transparent conductive film are formed on the third interlayer insulating film 13. A part of the pixel electrode 8 is connected with the drain electrode 6 via the aperture H4. Further, the contact electrode 72 is formed inside the aperture H5, and is connected with the common wiring 71 via the aperture H6 and with the common electrode 7 exposed inside the aperture H5. That is to say, the contact electrode 72 electrically connects the common wiring 71 and the common electrode 7.

In the second preferred embodiment, the two apertures H1 and H2 formed on the second interlayer insulating film 12 in the pixel region in the first preferred embodiment are unified as the aperture H11. For this reason, the aperture area of the second interlayer insulating film 12 can be made small, and the aperture ratio of the pixels 111 is improved. Further, defective orientation of the liquid crystal easily occurs near a level different portion of the second interlayer insulating film 12, but the reduction in the apertures reduces regions where the defective orientation occurs, so that the display quality is improved. Further, in the rubbing process for oriented films, a portion that is subject to an insufficient orientation process or a region which contacts with an orientation cloth for a long time is reduced, and thus this configuration can contribute to the improvement of the display quality. Particularly, when a long side direction of the aperture H11 is made to match with a rubbing direction, the orientation process is further improved.

A method for manufacturing a liquid crystal display device 100 according to the second preferred embodiment will be described. The methods for forming the terminal region and the wiring converting region are similar to those in the first preferred embodiment, description about the forming methods will be omitted.

A TFT 10 and the first interlayer insulating film 11 are formed on a substrate 1 by the method similar to the steps described with reference to FIG. 5 to FIG. 7 in the first preferred embodiment. However, the layout should be changed so that the drain electrode 6 of the TFT 10 and the common wiring 71 are close to each other. The photoengraving step has been executed three times.

Figure 31:
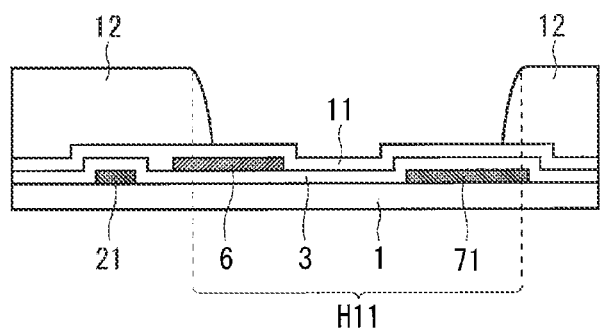
FIG. 31 is a cross sectional view illustrating a step of manufacturing the array substrate according to the second preferred embodiment.
Figure 32:
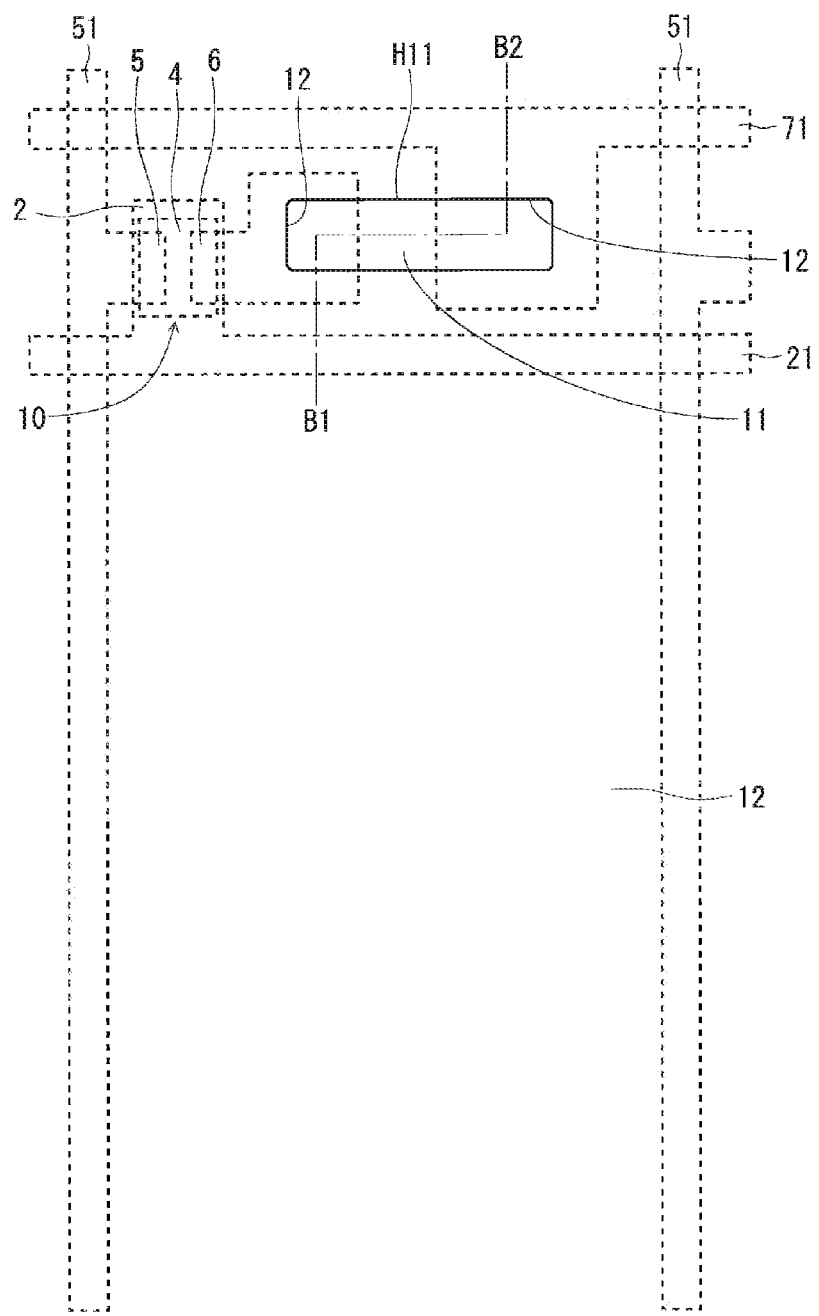
FIG. 32 is a plan view illustrating the step of manufacturing the array substrate according to the second preferred embodiment.

A photosensitive organic resin film is applied so that the second interlayer insulating film 12 is formed, and the second interlayer insulating film 12 is exposed and developed in the fourth photoengraving step, and the aperture H11 is formed across the drain electrode 6 and the common wiring 71 as shown in FIG. 31. Further, FIG. 32 shows a plan view of the pixel region in this state. The first interlayer insulating film 11 is exposed at the bottom of the aperture H11.

Subsequently, a first transparent conductive film (for example, IZO with thickness of 80 nm) is deposited by using a sputtering method. A resist mask is formed by the fifth photoengraving step, and the first transparent conductive film is patterned by etching using the resist mask as a mask, so that the common electrode 7 is formed. At this time, on the common electrode 7, the aperture H7 is formed on a position corresponding to the drain electrode 6, and the aperture H3 is formed on a position corresponding to the common wiring 71.

Figure 34:
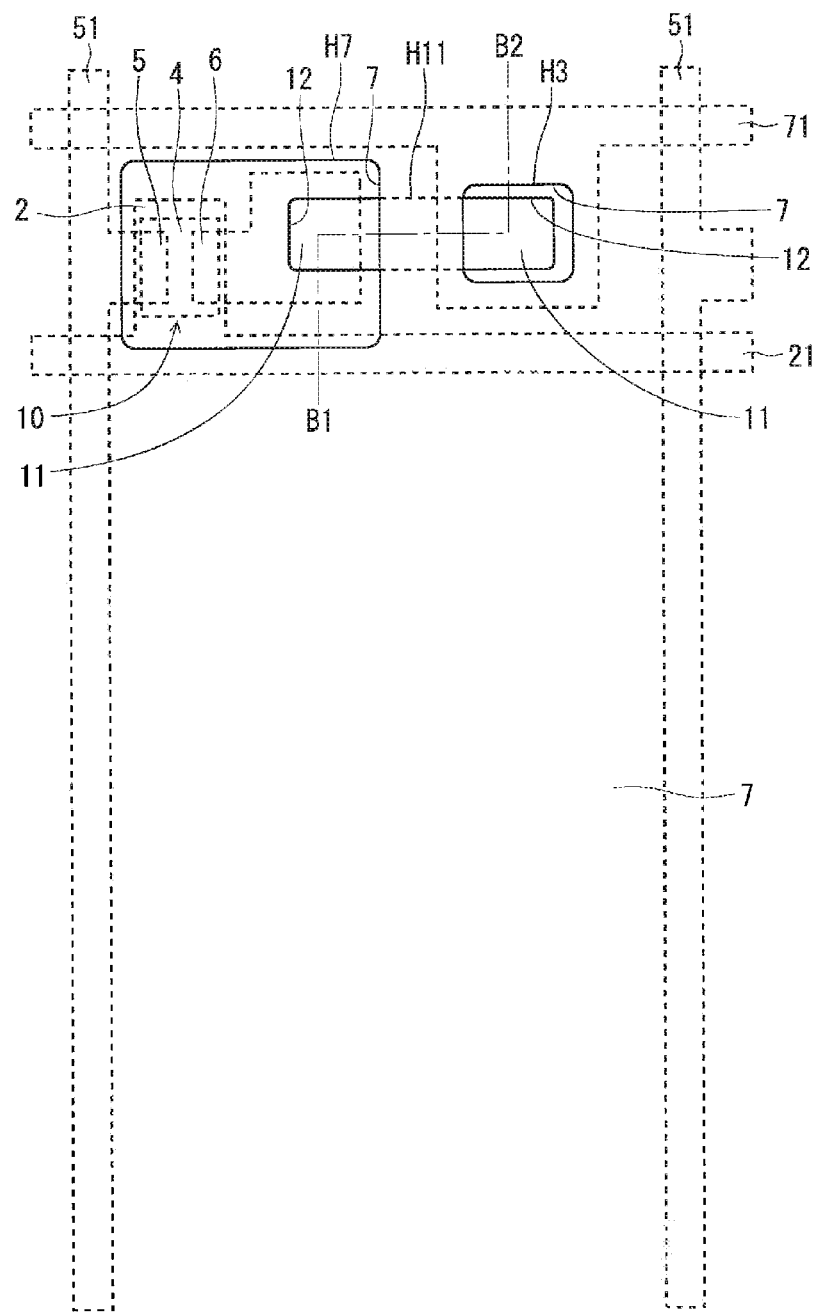
FIG. 34 is a plan view illustrating the step of manufacturing the array substrate according to the second preferred embodiment.

Thereafter, a resist mask 201 is removed by a peeling solution (FIG. 33). FIG. 34 shows a plan view of the pixel region in this state. The gate wiring 21 and the source wiring 51 are covered with the common electrode 7. The first interlayer insulating film 11 at the bottom of the aperture H11 is exposed inside the apertures H3 and H7.

The third interlayer insulating film 13 (for example, silicon nitride with thickness of 200 nm) is deposited by using a CVD method. A resist mask 202 is formed in the sixth photoengraving step, and the aperture H8 is formed on a position corresponding to the drain electrode 6, and the aperture H5 is formed on a position corresponding to the drain electrode 6 on the third interlayer insulating film 13 by dry etching using the resist mask 202 as a mask.

When the aperture H8 is formed on the third interlayer insulating film 13, the second interlayer insulating film 12 (the inner wall of the aperture H11) is exposed inside the aperture H8. However, when the etching is further continued, the second interlayer insulating film 12 becomes a mask, and the first interlayer insulating film 11 at the bottom of the aperture H11 is removed, so that the aperture H4 that reaches the drain electrode 6 is formed. Further, when the aperture H5 is formed on the third interlayer insulating film 13, the common electrode 7 and the second interlayer insulating film 12 (the inner wall of the aperture H11) are exposed inside the aperture H5. However, when the etching is further continued, the common electrode 7 and the second interlayer insulating film 12 become masks, and the first interlayer insulating film 11 and the gate insulating film 3 at the bottom of the aperture H11 are removed, so that the aperture H6 that reaches the common wiring 71 is formed (FIG. 35).

Therefore, the shape of the aperture H4 is similar to a shape of the region where the bottom portion of the aperture H11, the aperture H7, and the aperture H8 overlap with each other. Further, the shape of the aperture H6 is similar to a shape of a region where the bottom portion of the aperture H11, the aperture H3, and the aperture H5 overlap with each other.

Figure 36:
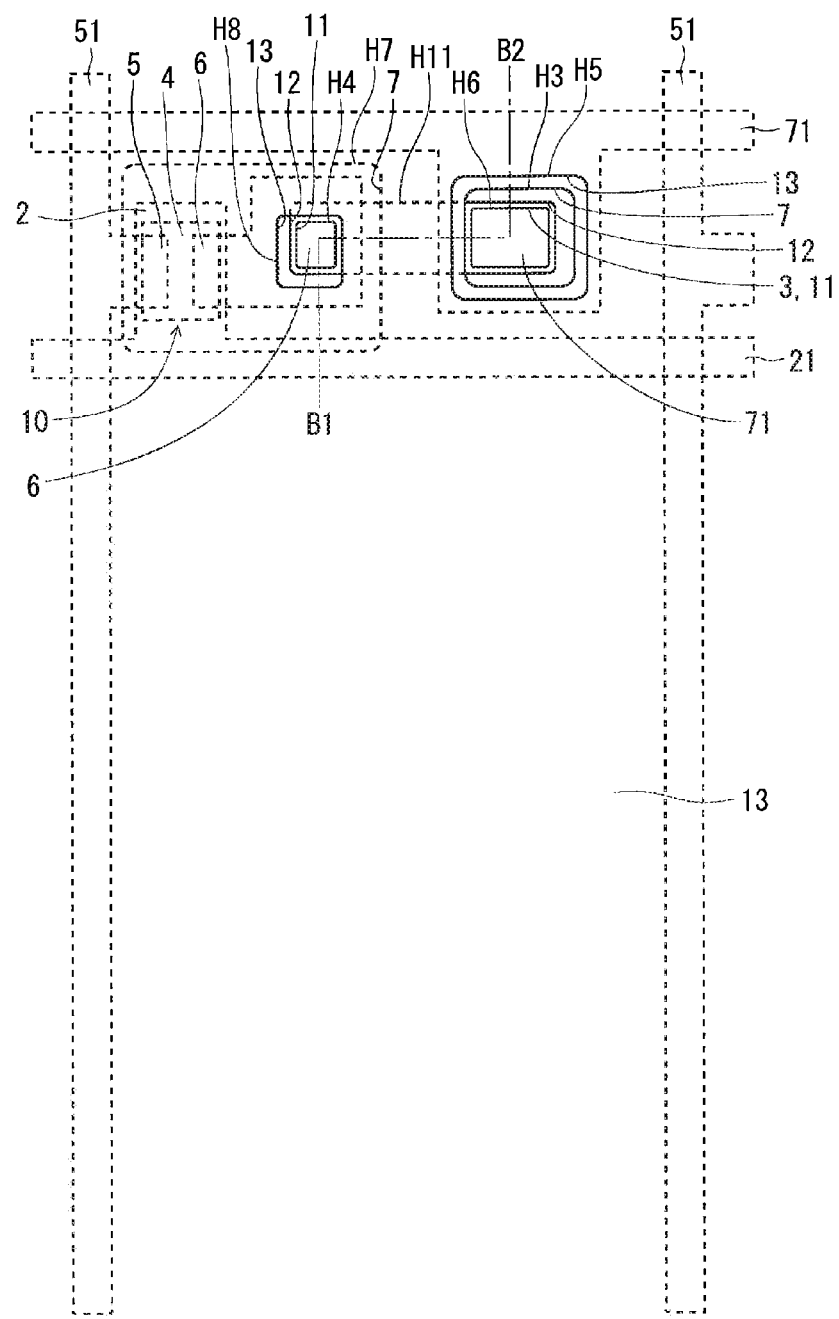
FIG. 36 is a plan view illustrating the step of manufacturing the array substrate according to the second preferred embodiment.

Thereafter, the resist mask 202 is removed by the peeling solution. FIG. 36 shows a plan view of the pixel region in this state. The drain electrode 6 of the TFT 10 is exposed at the bottom of the aperture H4. The common electrode 7 is exposed on an edge portion of the aperture H5, and the common wiring 71 is exposed on a bottom portion of the aperture H5.

A second transparent conductive film is deposited by the method similar to the step described with reference to FIG. 16 in the first preferred embodiment. A resist mask is formed in the seventh photoengraving step, and the second transparent conductive film is patterned by etching using the resist mask as a mask, so that the pixel electrode 8 and the contact electrode 72 are formed. The pixel electrode 8 is connected with the drain electrode 6 of the TFT 10 via the aperture H4 that pierces the third interlayer insulating film 13 and the first interlayer insulating film 11. The contact electrode 72 is formed on at least a part inside the aperture H5, and electrically connects the common electrode 7 with the common wiring 71 exposed inside the aperture H5.

Thereafter, when the resist mask is removed by the peeling solution, a configuration shown in FIG. 29 and FIG. 30 is obtained.

When a second aperture is formed in a first aperture formed on the second interlayer insulating film 12 with large thickness, the narrow first aperture might disable the second aperture to be satisfactorily formed due to insufficient exposure. In the second preferred embodiment, since the first aperture formed on the second interlayer insulating film 12 is the aperture H11 with a large diameter obtained by connecting the apertures H1 and H2, the aperture H4 can be stably formed as the second aperture.

Further, in the plan view of FIG. 29, a channel region of the TFT 10 (a portion between a source electrode 5 and the drain electrode 6 on a semiconductor film 4) is not covered with the common electrode 7, but the upper part of the channel region may be covered with the common electrode 7.

Figure 38:
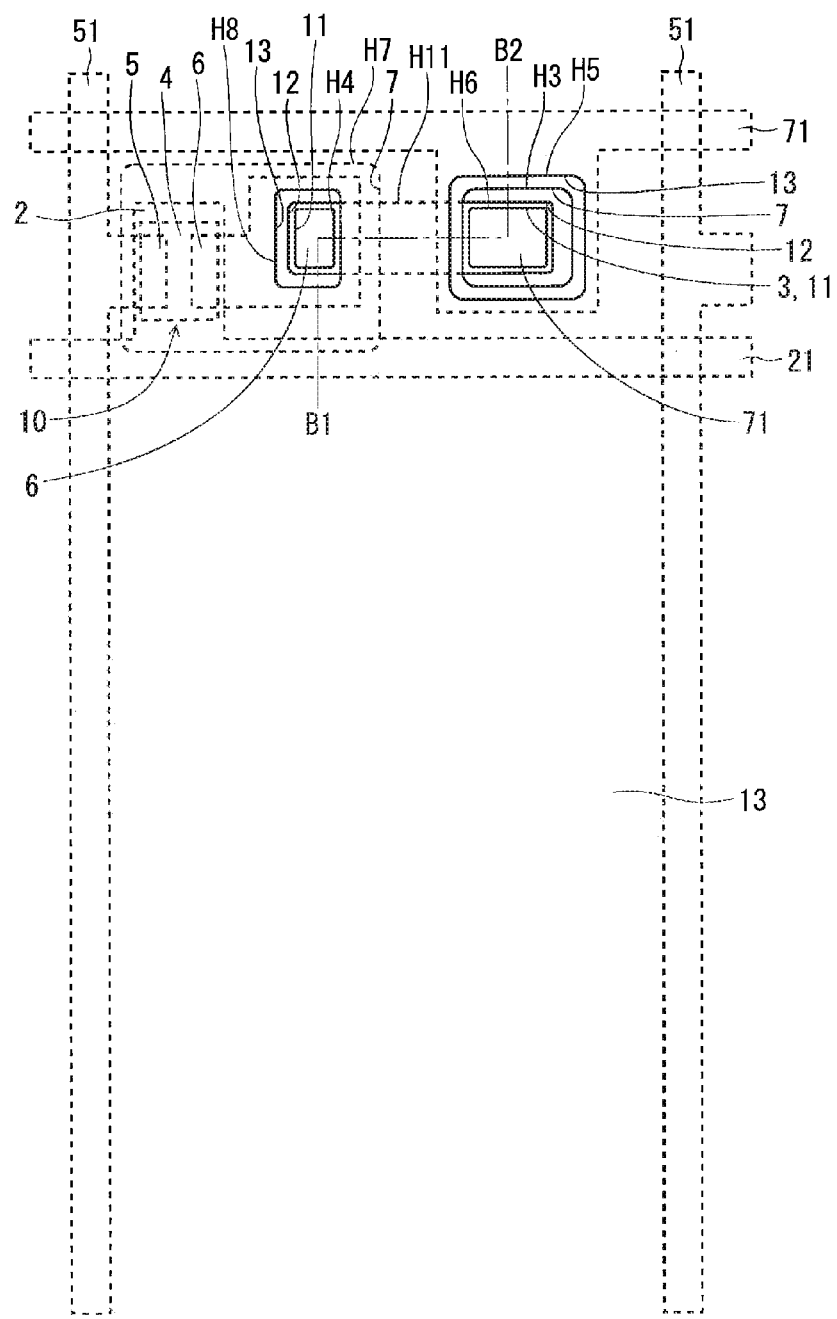
FIG. 38 is a plan view illustrating the arrangement example of the aperture (H8) of the third interlayer insulating film and the aperture (H11) of the second interlayer insulating film according to the second preferred embodiment.

Further, a plan view of FIG. 29 illustrates the example where the aperture H8 is arranged across adjacent two sides of the bottom portion of the aperture H11 as to a position relationship between the aperture H8 of the third interlayer insulating film 13 and the aperture H11 of the second interlayer insulating film 12. However, for example, the aperture H8 may be arranged across only one side of the bottom portion of the aperture H11 as shown in FIG. 37, or the aperture H8 may be arranged across three sides including one side of the bottom portion of the aperture H11 as shown in FIG. 38. FIG. 37 and FIG. 38 illustrate a state just after the aperture H8 and the aperture H5 are formed on the third interlayer insulating film 13 and the resist mask 202 is removed (corresponding to FIG. 36).

Modified Preferred Example

Figure 39:
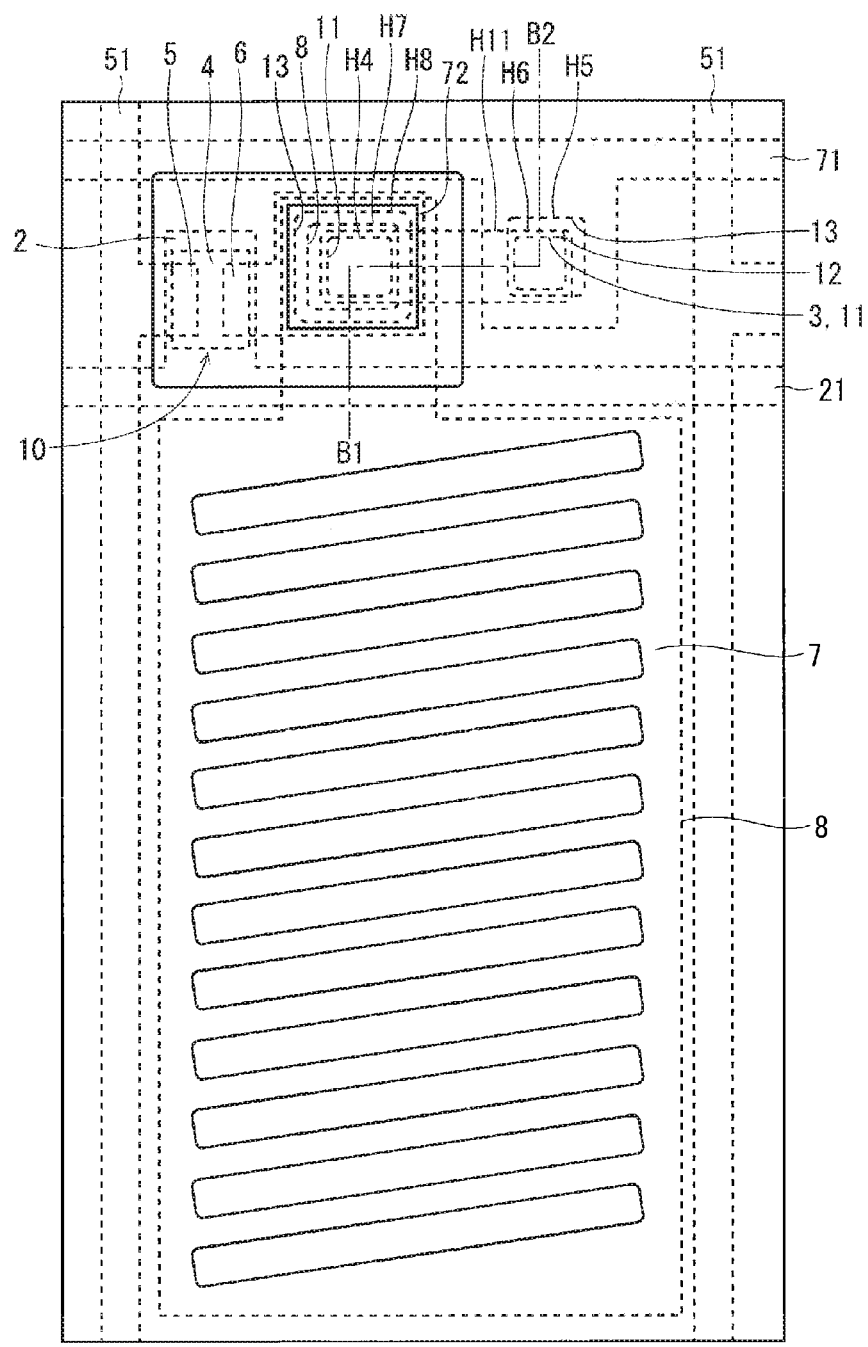
FIG. 39 is a plan view of the pixel of the array substrate according to a modified preferred example of the second preferred embodiment.

Also in the second preferred embodiment, the common electrode 7 is disposed under the pixel electrode 8 as shown in FIG. 29 and FIG. 30, however, the common electrode 7 may be disposed above the pixel electrode 8. That is to say, as shown in FIG. 39 and FIG. 40, the plate-shaped pixel electrode 8 made of the first transparent conductive film is disposed on the second interlayer insulating film 12, and the common electrode 7 having a lattice or pectinate shape made of the second transparent conductive film may be disposed above the pixel electrode 8.

In this case, a part of the pixel electrode 8 is formed on the inner wall inside the aperture H11 of the second interlayer insulating film 12 on the side of the drain electrode 6. The contact electrode 72 made of the second transparent conductive film is connected to the pixel electrode 8 on the inner wall of the aperture H11, and is connected with the drain electrode 6 via the aperture H4 of the first interlayer insulating film 11 formed at the bottom of the aperture H11. As a result, the drain electrode 6 and the pixel electrode 8 are electrically connected with each other. Further, the common electrode 7 is connected with the common wiring 71 via the aperture H6 of the first interlayer insulating film 11 formed at the bottom of the aperture H11.

This configuration is realized by changing the sizes and the positions of the aperture H7 of the first transparent conductive film (the pixel electrode 8), the aperture H5 of the third interlayer insulating film 13, and the aperture H8 with respect to FIG. 29 and FIG. 30, and forming the contact electrode 72 on at least a part inside the aperture H8.

Concretely, the configuration is such that a part of the pixel electrode 8 is formed on the inner wall of the aperture H11 of the second interlayer insulating film 12 on the side of the drain electrode 6, and at least a part of the aperture H7 of the pixel electrode 8 is included in the aperture H11. Further, the aperture H8 includes at least a part of the aperture H7 so that a part of the pixel electrode 8 (a portion formed on the inner wall of the aperture H11) is exposed inside the aperture H8 of the third interlayer insulating film 13. Since the aperture H4 of the first interlayer insulating film 11 is formed in a self-alignment manner by using the pixel electrode 8 and the second interlayer insulating film 12 (the inner wall of the aperture H11) exposed inside the aperture H8 as masks, its shape is similar to a shape of a region where the aperture H8, the aperture H7, and the bottom portion of the aperture H11 overlap with each other. The contact electrode 72 is formed so as to be connected with the pixel electrode 8 on the inner wall of the aperture H11 and the drain electrode 6 exposed inside the aperture H11.

Further, the aperture H5 of the third interlayer insulating film 13 formed on a position corresponding to the common wiring 71 is formed so as to include a part of the aperture H11, and does not expose the pixel electrode 8. Since the aperture H6 that pierces the first interlayer insulating film 11 and the gate insulating film 3 is formed in a self-alignment manner by using the second interlayer insulating film 12 (the inner wall of the aperture H11) exposed inside the aperture H5 as a mask, its shape is similar to the shape of a region where the aperture H6 and the bottom portion of the aperture H11 overlaps with each other. The common electrode 7 is formed so that a part of it is connected to the common wiring 71 via the aperture H5 and the aperture H6.

In the present modified preferred example, as shown in FIG. 39, only a part of the aperture H5 of the third interlayer insulating film 13 is included in the bottom portion of the aperture H11 of the second interlayer insulating film 12 (namely, the aperture H5 crosses an outline of the bottom portion of the aperture H11 of the second interlayer insulating film 12). As a result, as shown in FIG. 40, the second interlayer insulating film 12 is exposed on the inner wall of a contact hole for connecting the common electrode 7 with the common wiring 71. That is to say, a portion where the first interlayer insulating film 11 does not contact with the third interlayer insulating film 13 is formed on the inner wall of the contact hole. On this portion, the third interlayer insulating film 13 is prevented from having an eaves shape, and defective connection between the common wiring 71 and the common electrode 7 is prevented. As a result, yield is improved.

Third Preferred Embodiment

Figure 41:
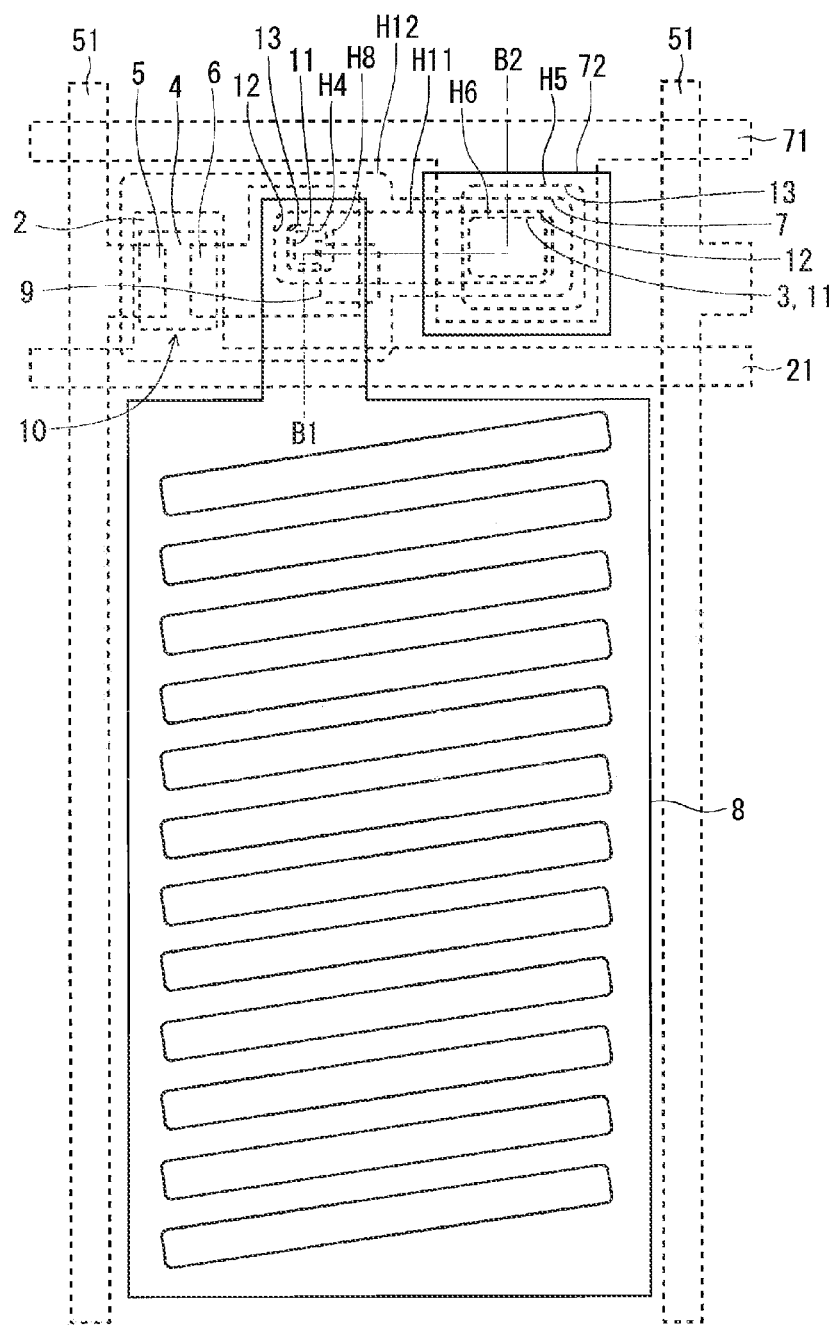
FIG. 41 is a plan view of the pixel of the array substrate according to a third preferred embodiment.
Figure 42:
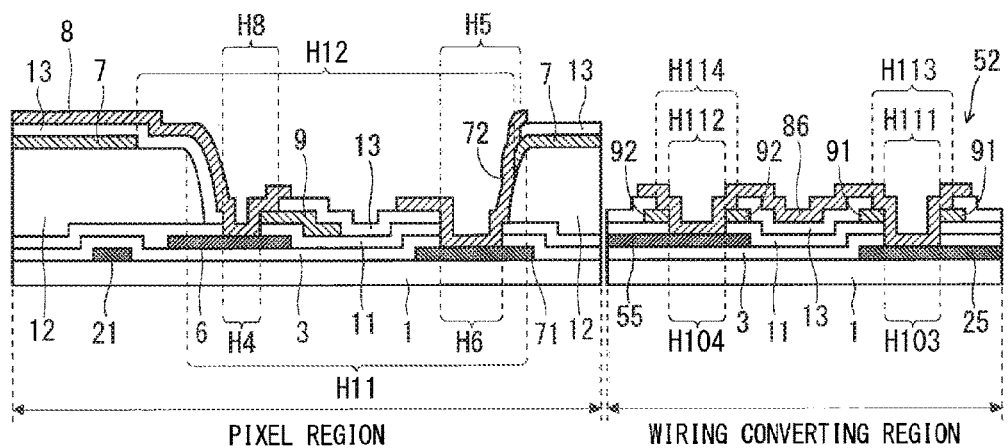
FIG. 42 is a cross sectional view of the main section of the array substrate according to the third preferred embodiment.

FIG. 41 and FIG. 42 are diagrams illustrating a configuration of an array substrate 110 according to the third preferred embodiment. FIG. 41 is a diagram illustrating a plan configuration of a pixel 111 in the array substrate 110. FIG. 42 is a diagram illustrating a cross-sectional configuration of a forming region (pixel region) for the pixels 111, and a forming region (a wiring converting region) for a wiring converter 52 for connecting a lead-out wiring 55 of a source wiring 51 with a lead-out wiring 25 on the same layer as a gate wiring 21. The cross section of the pixel region shown in FIG. 42 corresponds to a cross section taken along line B1-B2 shown in FIG. 41. Since a configuration of the forming region (a terminal region) provided with the end portion of the gate wiring 21 or the source wiring 51 is similar to that in the first preferred embodiment, illustration and description thereof are omitted.

In the second preferred embodiment, an aperture H7 of a common electrode 7 provided to a position corresponding to a drain electrode 6 is separated from the aperture H3 of the common electrode 7 provided to a position corresponding to a common wiring 71, but the apertures H3 and H7 are connected to be integrally formed in the third preferred embodiment. That is to say, as shown in FIG. 41 and FIG. 42, an aperture H12 is provided across the drain electrode 6 and the common wiring 71 on the common electrode 7. The aperture H12 includes a bottom portion of an aperture H11, and an end of the aperture H12 on the side of the drain electrode 6 is positioned outside the aperture H11. An end of the aperture H12 on the side of the common wiring 71 is positioned on an inclined plane on the inner wall of the aperture H11.

Further, a pad 9 is made of a first transparent conductive film that is the same as the common electrode 7 and is formed near the drain electrode 6 inside the aperture H12. The pad 9 is an island-shaped pattern separated from the common electrode 7, and is electrically insulated from the common electrode 7.

An aperture H8 arranged on a position corresponding to the drain electrode 6, and an aperture H5 arranged on a position corresponding to the common wiring 71 are formed on the third interlayer insulating film 13 that covers the common electrode 7. The aperture H8 is formed so as to include a part of the bottom portion of the aperture H11, and overlaps with a part of the pad 9. An aperture H4 that reaches the drain electrode 6 is formed on a first interlayer insulating film 11 in a region where the aperture H8, the bottom portion of the aperture H11, and a non-forming region for the pad 9 overlap with each other. The shape of the aperture H4 is similar to the shape of the region where the aperture H8, the bottom portion of the aperture H11, and the non-forming region for the pad 9 overlap with each other.

The aperture H5 of the third interlayer insulating film 13 includes a part of the bottom portion of the aperture H11, and a part of the end of the aperture H5 is positioned outside the aperture H12. For this reason, a portion around the aperture H12 on the common electrode 7 (a portion of the common electrode 7 formed on the inner wall of the aperture H11) is exposed inside the aperture H5. Further, an aperture H6 that pierces the first interlayer insulating film 11 and a gate insulating film 3 to reach the common wiring 71 is formed in a region where the aperture H5 and the bottom portion of the aperture H11 overlap with each other. The shape of the aperture H6 is similar to the shape of the region where the aperture H5 and the bottom portion of the aperture H11 overlap with each other.

A pixel electrode 8 and a contact electrode 72 that are made of a second transparent conductive film are formed on the third interlayer insulating film 13. A part of the pixel electrode 8 is connected with the drain electrode 6 via the aperture H4. Further, the contact electrode 72 is formed on at least a part inside the aperture H5, is connected with the common wiring 71 via the aperture H6, and is connected also with the common electrode 7 exposed inside the aperture H5. That is to say, the contact electrode 72 electrically connects the common wiring 71 and the common electrode 7.

On the other hand, a gate insulating film 3 is formed on the lead-out wiring 25 on the same layer as the gate wiring 21, and the lead-out wiring 55 on the same layer as the source wiring 51 is formed on the gate insulating film 3 in the wiring converting region. The first interlayer insulating film 11 is formed so as to cover the gate insulating film 3 and the lead-out wiring 55. A second interlayer insulating film 12 is removed in the wiring converting region.

A pad 91 and a pad 92 made of the first transparent conductive film that is the same as the common electrode 7 are formed on the first interlayer insulating film 11. The pad 91 is formed on a position corresponding to the lead-out wiring 25 on the same layer as the gate wiring 21, and has an aperture H111 that partially overlaps with the lead-out wiring 25. The pad 92 is formed on a position corresponding to the lead-out wiring 55 on the same layer as the source wiring 51, and has an aperture H112 that partially overlaps with the lead-out wiring 55.

The third interlayer insulating film 13 is formed on the pads 91 and 92. An aperture H113 and an aperture H114 are formed on the third interlayer insulating film 13. The aperture H113 includes at least a part of the aperture H111 of the pad 91, and the aperture H114 includes at least a part of the aperture H112 of the pad 92. The aperture H113 is arranged so as to overlap with a part of the pad 91, and the part of the pad 91 is exposed inside the aperture H113. The aperture H114 is arranged so as to overlap with a part of the pad 92, and the part of the pad 92 is exposed inside the aperture H114.

An aperture H103 that pierces the first interlayer insulating film 11 and the gate insulating film 3 to reach the lead-out wiring 25 is formed in a region where the aperture H113 and the aperture H111 overlap with each other. Further, an aperture H104 that pierces the first interlayer insulating film 11 to reach the lead-out wiring 55 is formed in a region where the aperture H114 and the aperture H112 overlap with each other. The shape of the aperture H103 is similar to the shape of a region where the aperture H113 and the aperture H111 overlap with each other, and the shape of the aperture H104 is similar to the shape of the region where the aperture H114 and the aperture H112 overlap with each other.

Further, a connection pattern 86 is formed on the third interlayer insulating film 13 by using the second transparent conductive film that is the same as the pixel electrode 8. The connection pattern 86 is connected with the lead-out wiring 25 via the apertures H103, H111, and H113, and is connected with the lead-out wiring 55 via the apertures H104, H112, and H114. The connection pattern 86 is formed across the lead-out wiring 25 exposed from the aperture H103 and the lead-out wiring 55 exposed from the aperture H104, and electrically connects the lead-out wiring 25 and the lead-out wiring 55.

A portion where the first interlayer insulating film 11 and the third interlayer insulating film 13 do not touch each other is formed on the inner wall of each contact hole on the array substrate 110 according to the third preferred embodiment. For example, a portion where the pad 9 is exposed is formed between the first interlayer insulating film 11 and the third interlayer insulating film 13 on an inner wall of the contact hole that connects the drain electrode 6 with the pixel electrode 8. Further, a portion where the second interlayer insulating film 12 is exposed is formed between the first interlayer insulating film 11 and the third interlayer insulating film 13 on the inner wall of the contact hole for connecting the common wiring 71 with the common electrode 7.

Also in the wiring converting region, a portion where the pad 91 is exposed between the first interlayer insulating film 11 and the third interlayer insulating film 13 is formed on the inner wall of the contact hole for connecting the lead-out wiring 25 on the same layer as the gate wiring 21 with the connection pattern 86. Further, a portion where the pad 92 is exposed is formed between the first interlayer insulating film 11 and the third interlayer insulating film 13 on the inner wall of the contact hole for connecting the lead-out wiring 55 on the same layer as the source wiring 51 with the connection pattern 86.

The third interlayer insulating film 13 is prevented from having an eaves shape on these portions, level difference coatability of the second transparent conductive film (the pixel electrode 8, the contact electrode 72, the connection pattern 86, and the like) is improved inside each contact hole, and stable electrical connection can be obtained. For this reason, yield is improved.

Figure 43:
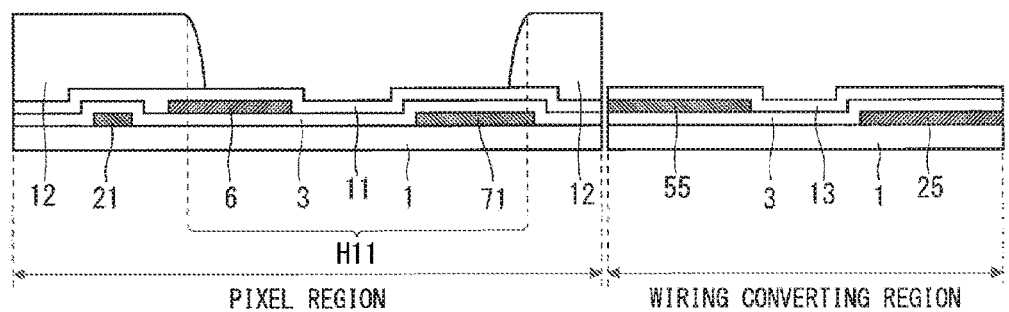
FIG. 43 is a cross sectional view illustrating a step of manufacturing the array substrate according to the third preferred embodiment.

A method for manufacturing a liquid crystal display device 100 according to the third preferred embodiment is described. First, in the method similar to the second preferred embodiment, a TFT 10, the first interlayer insulating film 11 and the second interlayer insulating film 12 are formed on a substrate 1, and the aperture H11 is formed on the second interlayer insulating film 12. However, the aperture H11 is formed and simultaneously the second interlayer insulating film 12 on the wiring converting region is removed in the third preferred embodiment (FIG. 43). The photoengraving step has been executed four times.

A first transparent conductive film (for example, IZO with thickness of 80 nm) is deposited by using a sputtering method. A resist mask is formed by the fifth photoengraving step, and the first transparent conductive film is patterned by etching using the resist mask as a mask. As a result, the common electrode 7 and the pad 9 are formed in the pixel region, and the pad 91 and the pad 92 are formed in the wiring converting region.

The aperture H12 is formed across the drain electrode 6 and the common wiring 71 on the common electrode 7 in this etching step. Further, the aperture H111 is formed on the pad 91 so as to overlap with the lead-out wiring 25 on the same layer as the gate wiring 21, and the aperture H112 is formed on the pad 92 so as to overlap with the lead-out wiring 55 on the same layer as the source wiring 51.

Figure 44:
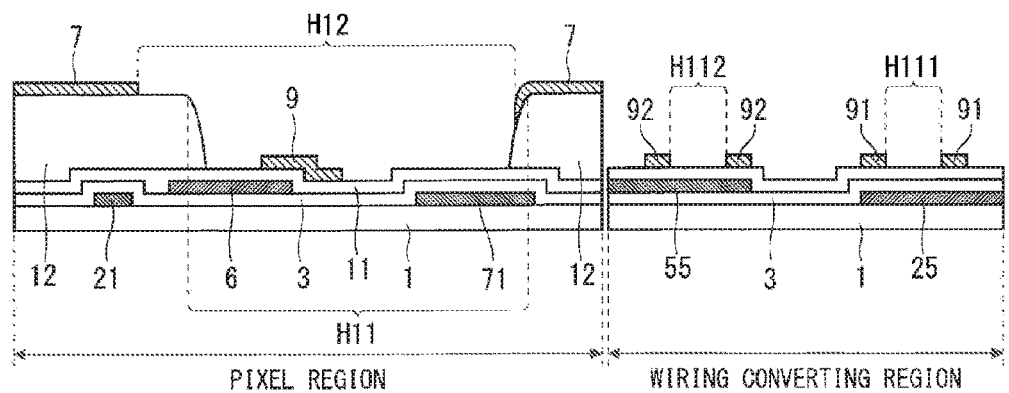
FIG. 44 is a cross sectional view illustrating the step of manufacturing the array substrate according to the third preferred embodiment.
Figure 45:
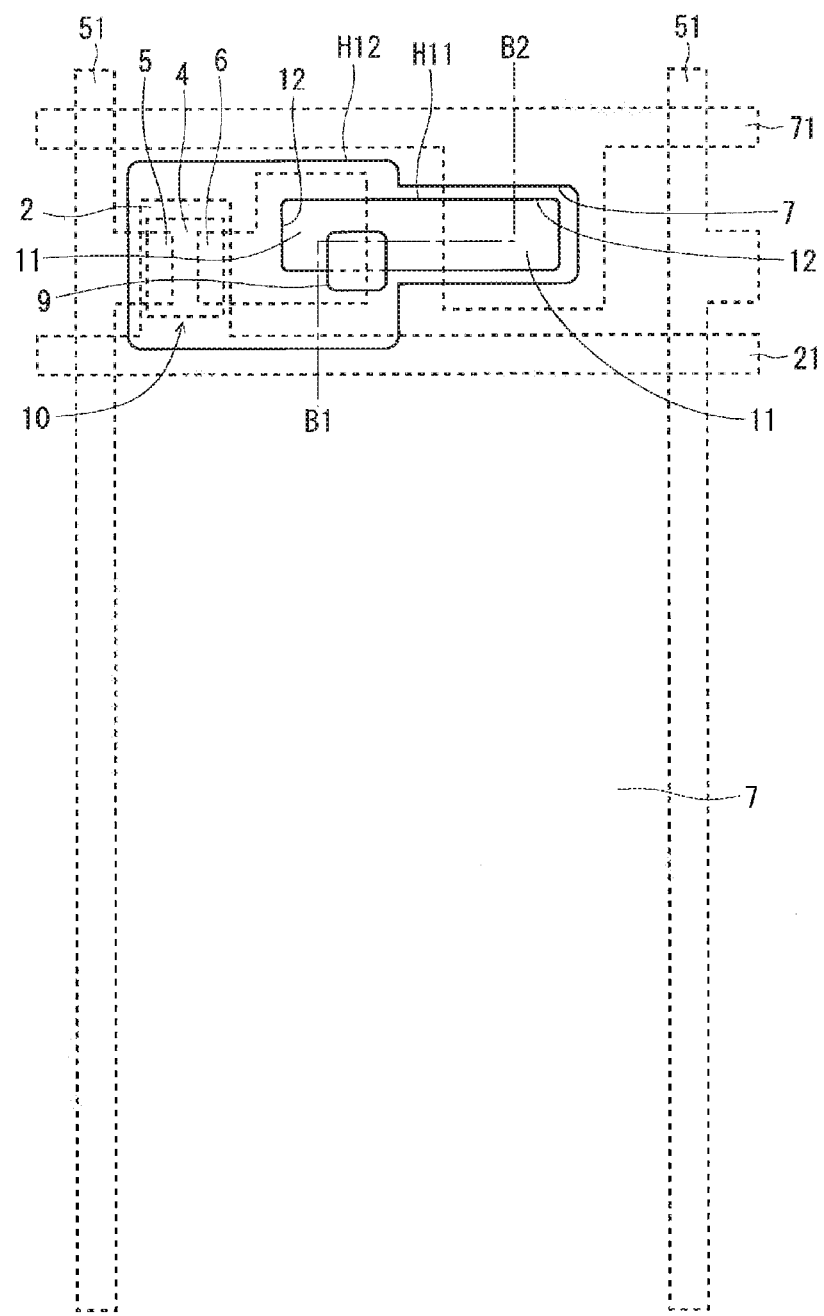
FIG. 45 is a plan view illustrating the step of manufacturing the array substrate according to the third preferred embodiment.

Thereafter, the resist mask 201 is removed by a peeling solution (FIG. 44). FIG. 45 shows a plan view of the pixel region in this state. The gate wiring 21 and the source wiring 51 are covered with the common electrode 7. The first interlayer insulating film 11 at the bottom of the aperture H11 is exposed inside the aperture H12. Further, the pad 9 is formed so that at least a part of it overlaps with the drain electrode 6 inside the aperture H11.

Figure 46:
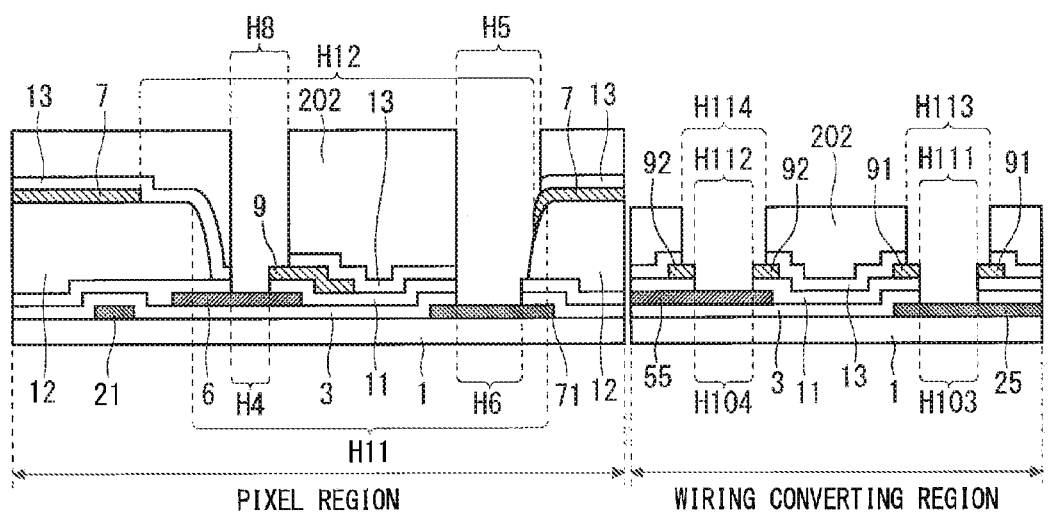
FIG. 46 is a cross sectional view illustrating the step of manufacturing the array substrate according to the third preferred embodiment.

The third interlayer insulating film 13 (for example, silicon nitride with thickness of 200 nm) is deposited by using a CVD method. A resist mask 202 is formed by the sixth photoengraving step, and the third interlayer insulating film 13 is patterned by etching using the resist mask 202 as a mask (FIG. 46).

The aperture H8 is formed on a position of the third interlayer insulating film 13 of the pixel region corresponding to the drain electrode 6, and the aperture H5 is formed on a position corresponding to the drain electrode 6 in this etching step. When the aperture H8 is formed, a part of the pad 9 is exposed inside the aperture H8. However, when the etching is further continued, the first interlayer insulating film 11 at the bottom of the aperture H8 is removed by using the pad 9 as a mask, so that the aperture H4 that reaches the drain electrode 6 is formed. Further, when the aperture H5 is formed, the common electrode 7 and the second interlayer insulating film 12 (the inner wall of the aperture H12 on the side of the contact electrode 72) is exposed. However, when the etching is further continued, the first interlayer insulating film 11 and the gate insulating film 3 at the bottom of the aperture H2 are removed by using the common electrode 7 and the second interlayer insulating film 12 as masks, so that the aperture H6 that reaches the common wiring 71 is formed.

Further, the aperture H113 and the aperture H114 are formed on the third interlayer insulating film 13 of the wiring converting region. The aperture H113 overlaps with at least a part of the aperture H111 of the pad 91, and the aperture H114 overlaps with at least a part of the aperture H112 of the pad 92. When the aperture H113 is formed, a part of the pad 91 is exposed inside the aperture H113. However, when the etching is further continued, the first interlayer insulating film 11 and the gate insulating film 3 at the bottom of the aperture H111 are removed by using the pad 91 as a mask, and the aperture H103 that reaches the lead-out wiring 25 on the same layer as the gate wiring 21 is formed. Further, when the aperture H114 is formed, a part of the pad 92 is exposed inside the aperture H114. However, the etching is further continued, the first interlayer insulating film 11 at the bottom of the aperture H112 is removed by using the pad 92 as a mask, and the aperture H104 that reaches the lead-out wiring 55 on the same layer as the source wiring 51 is formed.

Thereafter, the resist mask 202 is removed by the peeling solution. FIG. 47 shows a plan view of the pixel region in this state. The drain electrode 6 at the bottom of the aperture H4 is exposed inside the aperture H8. The common electrode 7 on the inner wall of the aperture H11 and the common wiring 71 at the bottom of the aperture H6 are exposed inside the aperture H5.

A second transparent conductive film is deposited by the method similar to the step described with reference to FIG. 16 in the first preferred embodiment. A resist mask is formed by the seventh photoengraving step, and the second transparent conductive film is patterned by etching using the resist mask as a mask. As a result, the pixel electrode 8 and the contact electrode 72 are formed in the pixel region, and the connection pattern 86 is formed in the wiring converting region. The pixel electrode 8 is connected with the drain electrode 6 of the TFT 10 via the aperture H4 that pierces the third interlayer insulating film 13 and the first interlayer insulating film 11. The contact electrode 72 is formed on at least a part of the aperture H5, and electrically connects the common electrode 7 exposed inside the aperture H5 with the common wiring 71. The connection pattern 86 is formed across the lead-out wiring 25 exposed in the aperture H103 and the lead-out wiring 55 exposed in the aperture H104, and electrically connects the lead-out wiring 25 with the lead-out wiring 55.

Thereafter, when the resist mask is removed by the peeling solution, the configuration shown in FIG. 41 and FIG. 42 is obtained.

In the third preferred embodiment, the pad made of the first transparent conductive film is exposed between the first interlayer insulating film 11 and the third interlayer insulating film 13 on at least a part of the inner wall of each contact hole. As a result, even when film quality of the third interlayer insulating film 13 deposited on the second interlayer insulating film 12 made of a coating type insulating film such as an organic resin film changes due to a manufacturing process, a region where the third interlayer insulating film 13 does not have an eaves shape on the inner wall of the contact hole can be secured. Therefore, a depositing process for the third interlayer insulating film 13 that is not limited to structures can be configured.

Further, in the plan view of FIG. 41, a channel region of the TFT 10 (a portion on a semiconductor film 4 between a source electrode 5 and the drain electrode 6) is not covered with the common electrode 7, but the upper portion of the channel region may be covered with the common electrode 7.

Figure 48:
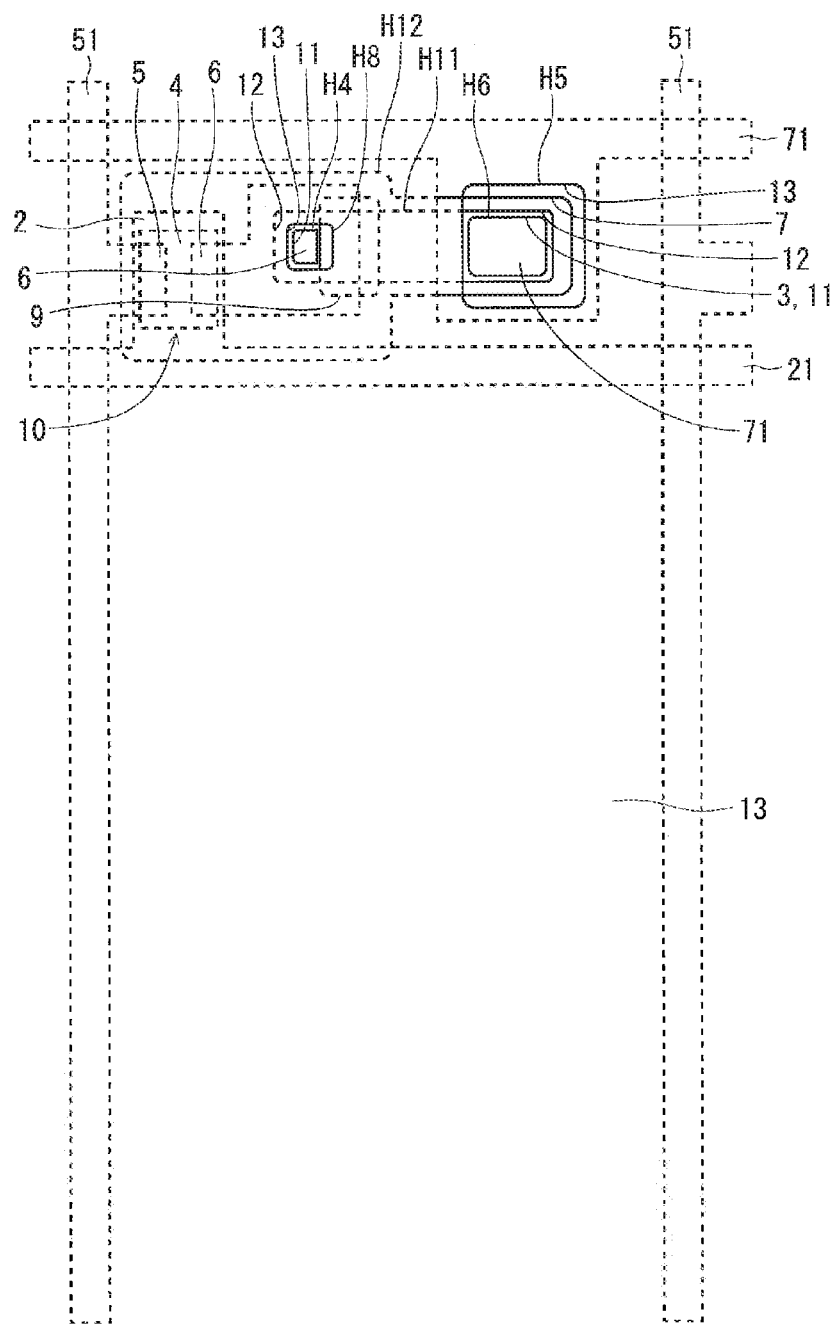
FIG. 48 is a plan view illustrating an arrangement example of a pad made of a first transparent conductive film according to the third preferred embodiment.
Figure 49:
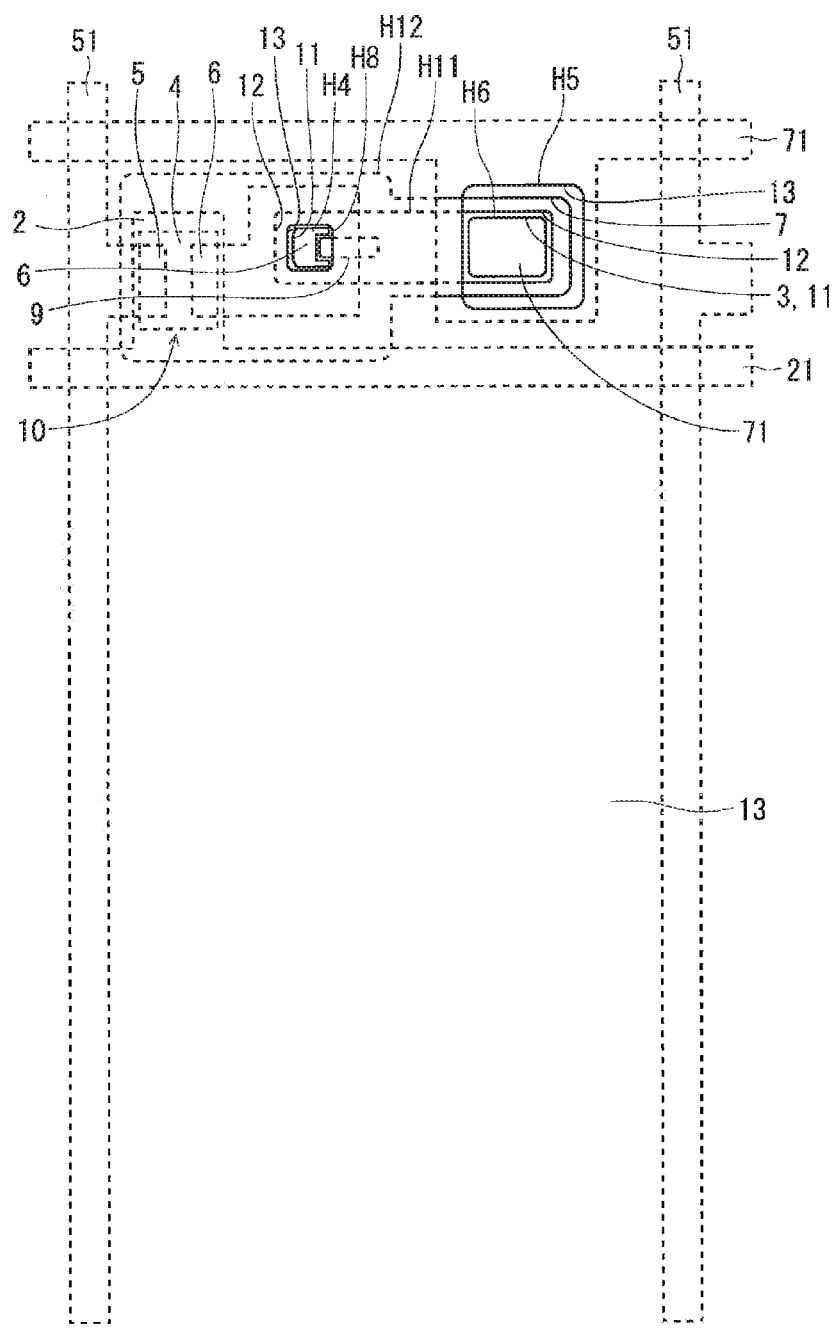
FIG. 49 is a plan view illustrating an arrangement example of the pad made of the first transparent conductive film according to the third preferred embodiment.
Figure 50:
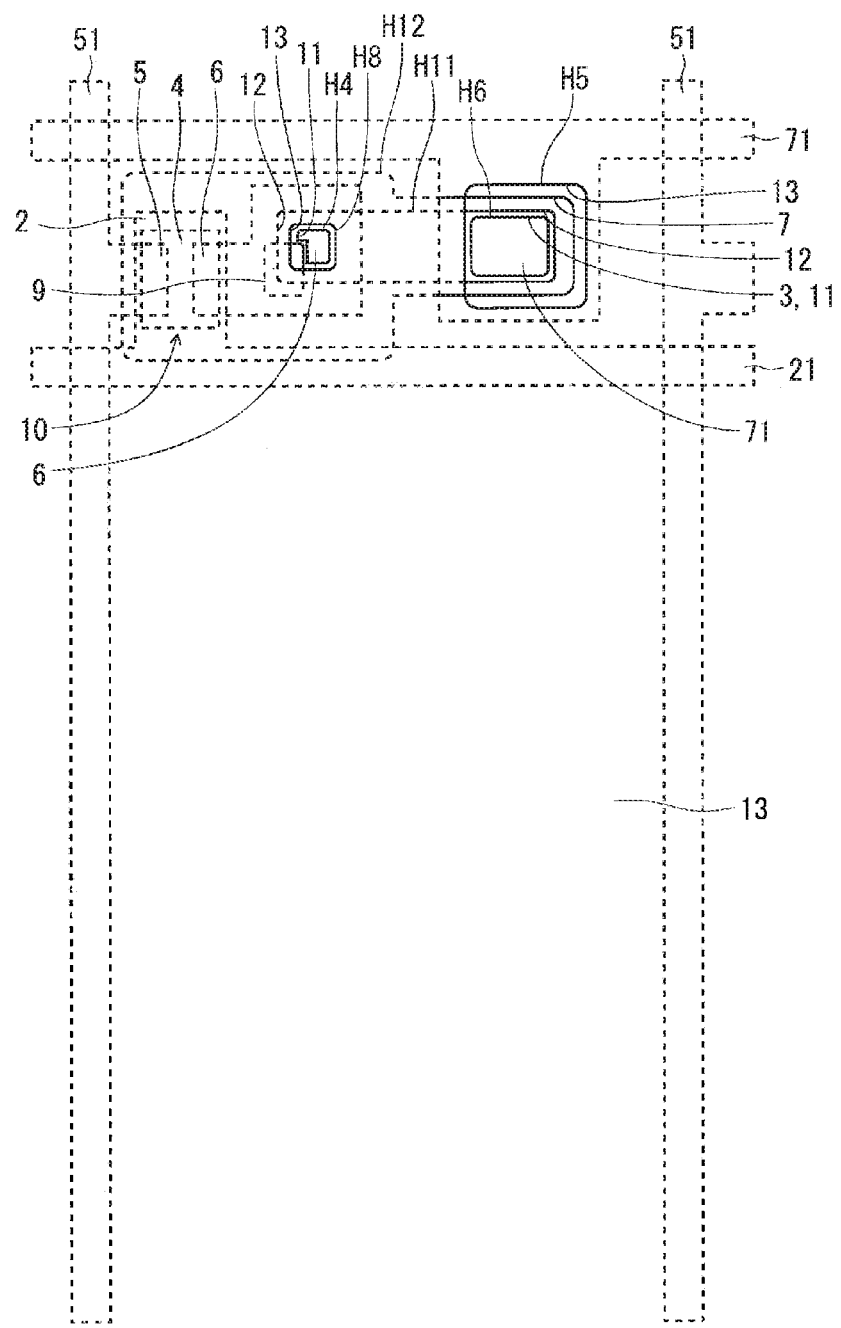
FIG. 50 is a plan view illustrating an arrangement example of the pad made of the first transparent conductive film according to the third preferred embodiment.

As to the arrangement of the pad 9 to be formed in the pixel region, the plan view of FIG. 41 illustrates an example where the pad 9 is arranged across one side of the aperture H11 of the second interlayer insulating film 12 and across two sides of the aperture H8 of the third interlayer insulating film 13. However, the pad 9 may be arranged so that a part of it is included in the aperture H8 of the third interlayer insulating film 13, and the arrangement is not limited to the example of FIG. 41. For example, the pad 9 may be arranged across two sides opposed to the bottom portion of the aperture H11 as shown in FIG. 48, the pad 9 may be entirely included in the bottom portion of the aperture H11 as shown in FIG. 49, and the pad 9 may be arranged across adjacent two sides on the bottom portion of the aperture H11 as shown in FIG. 50. In all these configurations, since the pad 9 is exposed on the end of the aperture H4 of the first interlayer insulating film 11, the effect according to the third preferred embodiment is obtained. FIG. 48 to FIG. 50 illustrate a state just after the aperture H8 and the aperture H5 are formed on the third interlayer insulating film 13 and then the resist mask 202 is removed (corresponding to FIG. 47).

Further, when the pad 9 is arranged so as to be partially included in the aperture H8 of the third interlayer insulating film 13 and the pad 9 is exposed on the end of the aperture H4 of the first interlayer insulating film 11, the aperture H11 of the second interlayer insulating film 12 may be separated into an aperture H1 that is arranged on a position corresponding to the drain electrode 6 and the aperture H2 that is arranged on a position corresponding to the common wiring 71 like the first preferred embodiment.

Further, the common wiring 71 may be formed by using the first transparent conductive film that is the same as the common electrode 7, or may be formed on an upper layer with respect to the second interlayer insulating film 12 by using a third conductive film (not shown). When the common wiring 71 made of the third conductive film is disposed on the upper layer with respect to the second interlayer insulating film 12, the pads 9, 91, and 92 may be made of not the first transparent conductive film but the third conductive film, or may have a two-layer structure including the third conductive film and the first transparent conductive film. That is to say, the pads 9, 91, and 92 may be made of a conductive film of one or more layers between the second interlayer insulating film 12 and the third interlayer insulating film 13.

First Modified Preferred Example

In FIG. 41 and FIG. 42, the aperture H8 of the third interlayer insulating film 13 to be formed on the drain electrode 6 is arranged so as to be included in the bottom portion of the aperture H11 of the second interlayer insulating film 12. However, as shown in FIG. 51 and FIG. 52, the aperture H8 may be arranged so that only a part of it is included in the aperture H11 (the aperture H8 crosses the side of the bottom portion of the aperture H11).

In this case, on the inner wall of the contact hole for connecting the drain electrode 6 and the pixel electrode 8, the second interlayer insulating film 12 is exposed between the first interlayer insulating film 11 and the third interlayer insulating film 13 (the structure similar to the inner wall of the aperture H1 shown in FIG. 4) is formed. Further, the pad 9 is exposed between the first interlayer insulating film 11 and the third interlayer insulating film 13 inside the aperture H11. That is to say, the contact hole has both the characteristics in the first preferred embodiment and the third preferred embodiment, and the electric connection between the drain electrode 6 and the pixel electrode 8 can be further stable.

Figure 54:
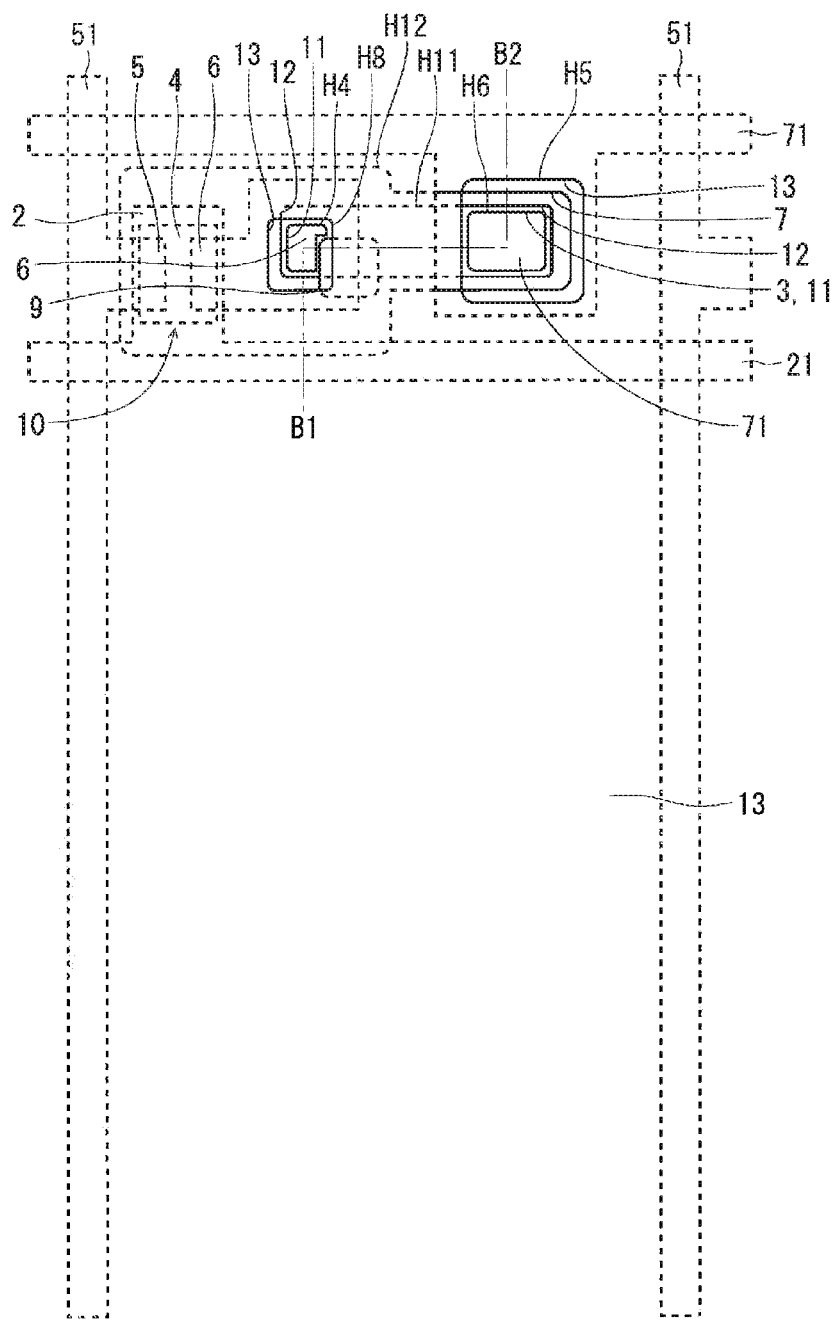
FIG. 54 is a plan view illustrating the step of manufacturing the array substrate according to the second modified preferred example of the third preferred embodiment.

The configuration in FIG. 51 and FIG. 52 can be formed by the method similar to the method for manufacturing the array substrate 110 according to the third preferred embodiment described above. That is to say, as shown in FIG. 53 and FIG. 54, a partial end of the aperture H8 of the third interlayer insulating film 13 is arranged outside the bottom portion of the aperture H11 of the second interlayer insulating film 12, so that only a part of the aperture H8 may be included in the bottom portion of the aperture H11 in the steps described with reference to FIG. 46 and FIG. 47. At the etching for forming the aperture H8, the aperture H4 of the first interlayer insulating film 11 is formed in a self-alignment manner by using the second interlayer insulating film 12 exposed inside the aperture H8 (the inner wall of the aperture H11) and the pad 9 as masks. Therefore, the shape of the aperture H4 is similar to the shape of a region where the aperture H8, a non-forming region for the pad 9, and the bottom portion of the aperture H11 overlap with each other.

Second Modified Preferred Example

Figure 55:
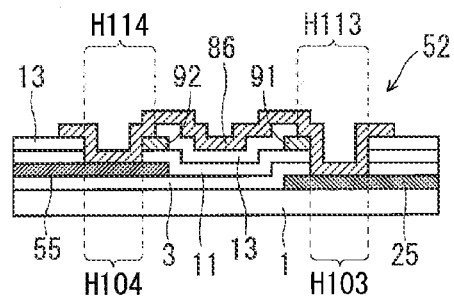
FIG. 55 is a cross sectional view of a wiring converter of the array substrate according to the second modified preferred example of the third preferred embodiment.

The example refers to a modified preferred example of a pad composed of the first transparent conductive film disposed on the wiring converter 52. FIG. 42 illustrates the configuration where the pad 91 having the aperture H111 and the pad 92 having the aperture H112 are disposed on the wiring converter 52, but the pad 91 and the pad 92 may be arranged so that parts of them overlap with the aperture H113 and the aperture H114 to be formed on the third interlayer insulating film 13, respectively, but their positions and shapes are not limited to the configuration shown in FIG. 42. For example, the pad 91 and the pad 92 having no aperture may be disposed so that parts of them overlap with the aperture H113 and the aperture H114 as shown in FIG. 55.

Figure 56:
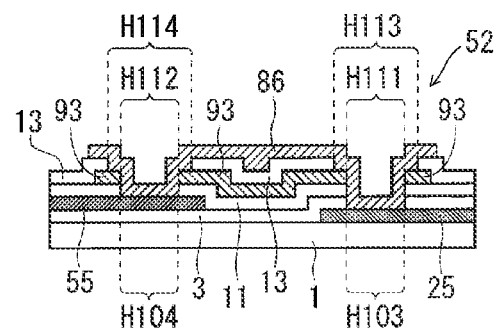
FIG. 56 is a cross sectional view of the wiring converter of the array substrate according to the second modified preferred example of the third preferred embodiment.
Figure 57:
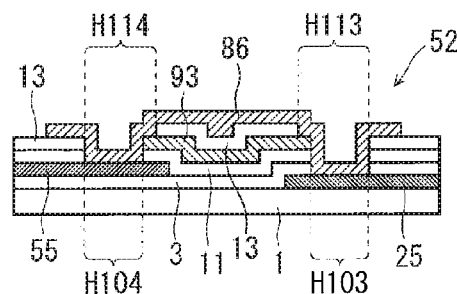
FIG. 57 is a cross sectional view of the wiring converter of the array substrate according to the second modified preferred example of the third preferred embodiment.

Further, since the pad 91 and the pad 92 do not have to be electrically insulated from each other, they may be replaced by a pad 93 obtained by integrating them. FIG. 56 illustrates an example using the pad 93 obtained by integrating the pads 91 and 92 shown in FIG. 42, and one pad 93 is formed with the aperture H111 and the aperture H112. FIG. 57 illustrates an example using the pad 93 obtained by integrating the pads 91 and 92 shown in FIG. 55, and one pad 93 having no aperture is disposed so as to be overlapped with both the aperture H113 and the aperture H114.

As described with reference to FIG. 46, when the apertures H103 and H104 are formed on the first interlayer insulating film 11 and the gate insulating film 3, respectively, the pads 91 and 92 function as etching masks. For this reason, when the pad 93 obtained by integrating the pads 91 and 92 is disposed across the lead-out wiring 25 and the lead-out wiring 55, the resist mask 202 shown in FIG. 46 does not have to be formed on the pad 93. When the resist mask 202 is not formed on the pad 93, the third interlayer insulating film 13 on the pad 93 is removed. For this reason, as shown in FIG. 58, an aperture H115 obtained by connecting the apertures H113 and H114 in FIG. 46 is formed on the third interlayer insulating film 13. The aperture H115 is formed across the lead-out wiring 25 and the lead-out wiring 25, and the connection pattern 86 is formed directly on the pad 93 inside the aperture H115.

Further, the second interlayer insulating film 12 remains in the wiring converting region, and the wiring converter 52 in FIG. 58 may be formed inside an aperture H116 provided with the second interlayer insulating film 12 as shown in FIG. 59. In this case, the apertures H103 and H104 that reach the lead-out wirings 25 and 55 are formed in regions where the bottom portions of the aperture H115 and the aperture H116 overlap with a non-forming region for the pad 93, respectively. At this time, only a part of the aperture H115 is included in the bottom portion of the aperture H116, and the second interlayer insulating film 12 may be exposed on the inner walls of the contact holes for connecting the connection pattern 86 and the lead-out wirings 25 and 55 as shown in FIG. 59. Since the first interlayer insulating film 11 does not touch the third interlayer insulating film 13 on the portion where the second interlayer insulating film 12 is exposed, the third interlayer insulating film 13 is prevented from having an eaves shape, and thus defective connection between the connection pattern 86 and the lead-out wirings 25 and 55 can be prevented.

FIG. 55 and FIG. 57 to FIG. 59 illustrate the example where the pad made of the first transparent conductive film is arranged in a region between the two lead-out wirings 25 and 55 connected by the wiring converter 52, but the pad may be arranged on any position as long as it is along the aperture H103 and the aperture H104.

Third Modified Preferred Example

Figure 60:
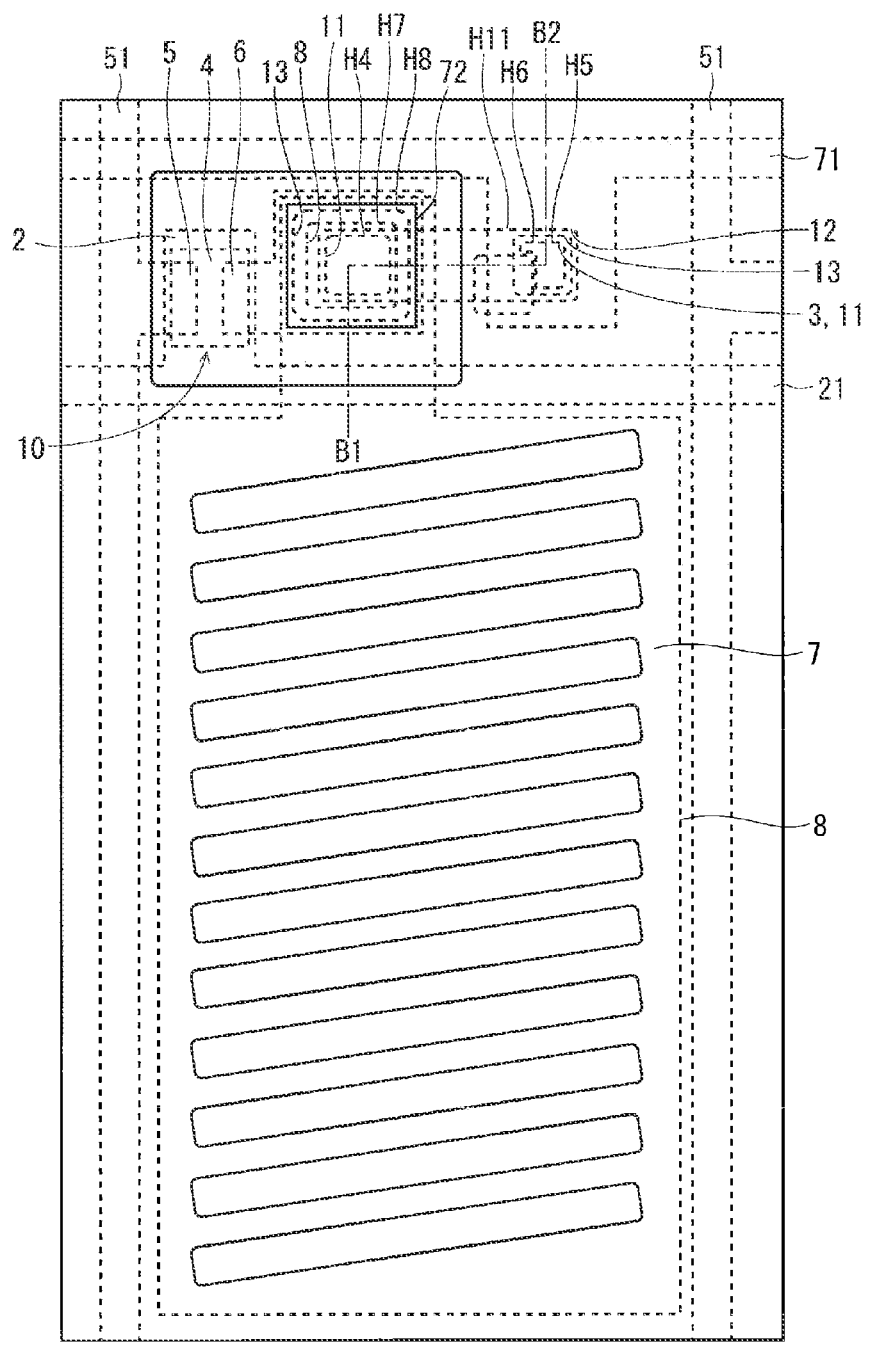
FIG. 60 is a plan view of the pixel of the array substrate according to a third modified preferred example of the third preferred embodiment.

The pad 9 made of the first transparent conductive film can be applied also to a configuration where the common electrode 7 is disposed above the pixel electrode 8 unlike FIG. 41 and FIG. 42. FIG. 60 and FIG. 61 illustrate a configurational example where the pad 9 made of the first transparent conductive film is applied to the array substrate 110 in which the pixel electrode 8 made of the first transparent conductive film is disposed on the second interlayer insulating film 12, and the common electrode 7 made of the second transparent conductive film is disposed above the pixel electrode 8.

FIG. 41 and FIG. 42 illustrates the example where the aperture H12 including the aperture H11 of the second interlayer insulating film 12 is formed on the first transparent conductive film, and the pad 9 is arranged inside the aperture H12. In FIG. 60 and FIG. 61, the aperture H7 including a part of the aperture H11 is formed on a position of the first transparent conductive film corresponding to the drain electrode 6, and the pad 9 is arranged outside the aperture H7. Concretely, the pad 9 is disposed so as to be partially included in the aperture H5 of the third interlayer insulating film 13 provided to a position corresponding to the common wiring 71. The pad 9 is electrically insulated from the pixel electrode 8.

In this case, similarly to the modified preferred example of the second preferred embodiment (FIG. 39 and FIG. 40), a part of the pixel electrode 8 is formed on the inner wall inside the aperture H11 of the second interlayer insulating film 12 on the side of the drain electrode 6. The contact electrode 72 made of the second transparent conductive film is connected to the pixel electrode 8 on the inner wall of the aperture H11, and is connected with the drain electrode 6 via the aperture H4 of the first interlayer insulating film 11 formed at the bottom of the aperture H11. As a result, the drain electrode 6 and the pixel electrode 8 are electrically connected with each other.

Further, the common electrode 7 is connected with the common wiring 71 via the aperture H6 of the first interlayer insulating film 11 formed at the bottom of the aperture H11. In the example of FIG. 60 and FIG. 61, the aperture H5 of the third interlayer insulating film 13 is arranged so as to be included in the bottom portion of the aperture H11 of the second interlayer insulating film 12, and the aperture H6 is formed in a region where the aperture H5 of the third interlayer insulating film 13 overlaps with the non-forming region for the pad 9. That is to say, the shape of the aperture H6 is similar to a shape of the region where the aperture H5 overlaps with the non-forming region for the pad 9.

This configuration is realized in a manner that the pad 9 made of the first transparent conductive film is formed so as to be partially overlap with the aperture H5 of the third interlayer insulating film 13 to be formed thereafter with respect to FIG. 39 and FIG. 40, and the aperture H5 is arranged so as to be included in the bottom portion of the aperture H11.

FIG. 60 and FIG. 61 illustrate the example where the second interlayer insulating film 12 is not exposed on the inner wall of the contact hole for connecting the common wiring 71 with the common electrode 7 (the aperture H5 of the third interlayer insulating film 13 is included in the bottom portion of the aperture H11). Similarly to FIG. 39 and FIG. 40, however, the second interlayer insulating film 12 may be exposed on the inner wall of the contact hole.

Figure 62:
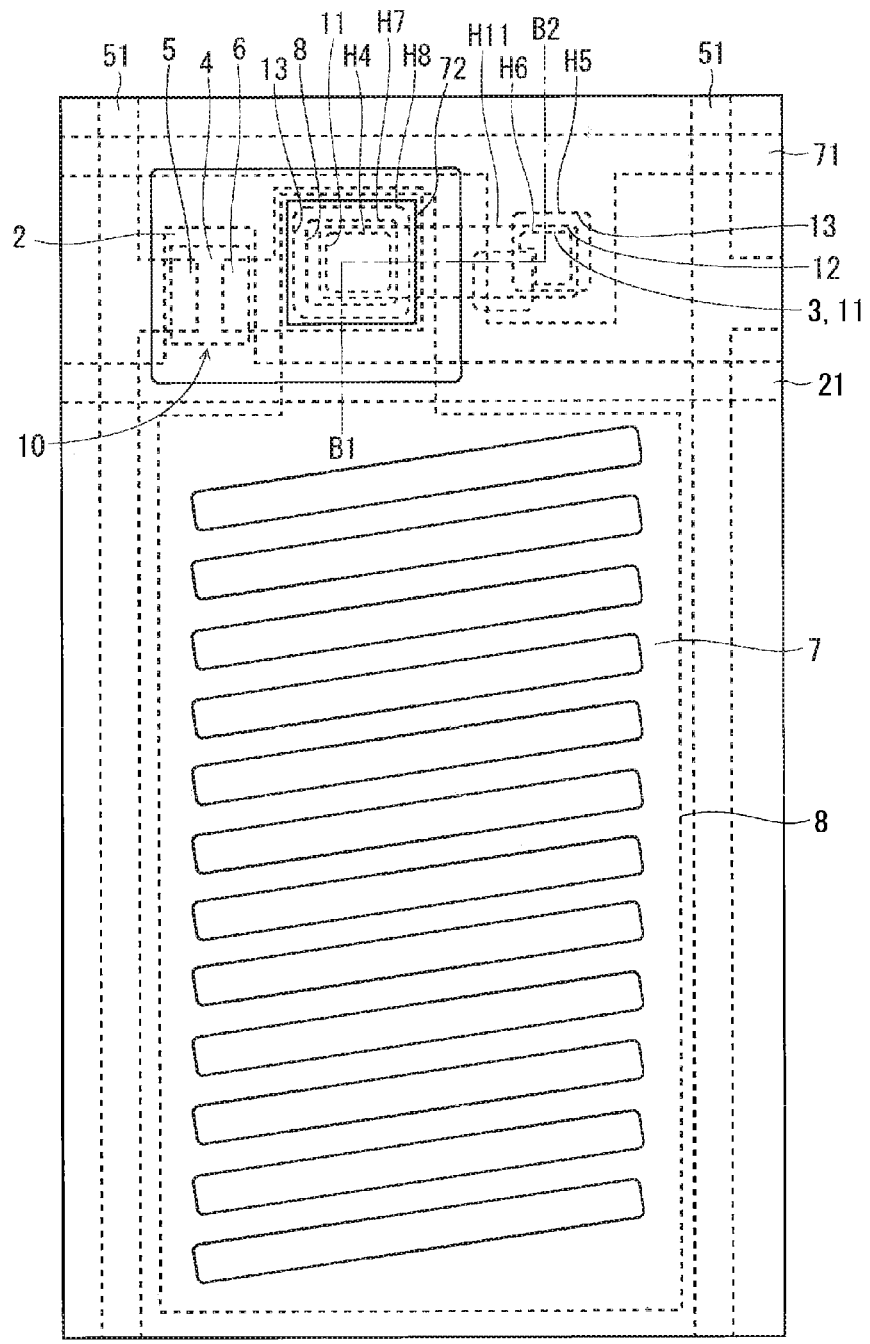
FIG. 62 is a plan view of the pixel of the array substrate according to the third modified preferred example of the third preferred embodiment.

That is to say, as shown in FIG. 62 and FIG. 63, a part of the end of the aperture H5 on the third interlayer insulating film 13 is arranged outside the bottom portion of the aperture H11 of the second interlayer insulating film 12, and only a part of the aperture H5 is included in the bottom portion of the aperture H11. As a result, the second interlayer insulating film 12 is exposed inside the aperture H5. Further, also in this case, the aperture H5 is formed so as to overlap with a part of the pad 9.

The aperture H6 that pierces the third interlayer insulating film 13 and the gate insulating film 3 is formed in a self-alignment manner by using the pad 9 exposed inside the aperture H5 and the second interlayer insulating film 12 (the inner wall of the aperture H11) as masks at the time of etching for forming the aperture H5. That is to say, the aperture H6 is formed in a region where the aperture H5, the non-forming region for the pad 9, and the bottom portion of the aperture H11 overlap with each other. Therefore, the shape of the aperture H6 is similar to the shape of the region where the aperture H5, the non-forming region for the pad 9, and the bottom portion of the aperture H11 overlap with each other.

In the configuration in FIG. 62 and FIG. 63, since the pad 9 and the second interlayer insulating film 12 are exposed on the inner wall of the contact hole for connecting the common wiring 71 with the common electrode 7, the contact hole have both the characteristics in the first preferred embodiment and the third preferred embodiment, so that the electric connection between the common wiring 71 and the common electrode 7 can be further stabilized.

In the plan views of FIG. 60 and FIG. 62, the channel region for the TFT 10 (the portion between the source electrode 5 and the drain electrode 6 on the semiconductor film 4) is not covered with the common electrode 7, but the upper part of the channel region may be covered with the common electrode 7.

While the invention has been shown and described in detail, the foregoing description is in all aspects illustrative and not restrictive. It is therefore understood that numerous modifications and variations can be devised without departing from the scope of the invention.

What is claimed is:

1. A thin film transistor array substrate comprising:
   a substrate having a surface;
   a thin film transistor formed on said surface of said substrate;
   a common wiring formed on said substrate;
   a first interlayer insulating film formed on said thin film transistor and said common wiring;
   a second interlayer insulating film formed on said first interlayer insulating film;
   a common electrode formed on said second interlayer insulating film;
   a third interlayer insulating film formed on said common electrode; and
   a pixel electrode formed on said third interlayer insulating film, wherein
   said pixel electrode is connected with a drain electrode of said thin film transistor via a first aperture formed on said second interlayer insulating film, a second aperture that includes a bottom portion of said first aperture and is formed on said common electrode, a third aperture that includes at least a part of the bottom portion of said first aperture, is included in said second aperture and is formed on said third interlayer insulating film, a fourth aperture that is formed on said first interlayer insulating film having a shape similar, in a plan view, to a shape of an overlap region where said third aperture overlaps with the bottom portion of said first aperture, and the direction of viewing for the plan view is along a normal to said surface of said substrate.

2. The thin film transistor array substrate according to claim 1, wherein
   said common electrode is indirectly connected to said common wiring via a fifth aperture formed on said second interlayer insulating film and a sixth aperture that is included in a bottom portion of said fifth aperture and is formed on said first interlayer insulating film,
   a part of said common electrode is exposed from said third interlayer insulating film on an inner wall of said fifth aperture,
   said common electrode and said common wiring are connected with each other via a contact electrode that is connected between the exposed portion of said common electrode formed on the inner wall of said fifth aperture and said common wiring exposed on said sixth aperture and is made of a conductive film on the same layer as said pixel electrode.

3. The thin film transistor array substrate according to claim 2, wherein
   said sixth aperture is formed so as to pierce said first interlayer insulating film and a gate insulating film of said thin film transistor.

4. The thin film transistor array substrate according to claim 1, wherein
   said second interlayer insulating film is removed in a forming region for a terminal for connecting an external wiring.

5. The thin film transistor array substrate according to claim 1, further comprising:
   a wiring converter for connecting a first wiring and a second wiring on different layers, wherein
   in said wiring converter,
   said first wiring and said second wiring are covered with said first interlayer insulating film, said second interlayer insulating film, and said third interlayer insulating film,
   a ninth aperture that reaches said first wiring or said second wiring is formed in a region where a bottom portion of a seventh aperture formed on said second interlayer insulating film overlaps with an eighth aperture formed on said third interlayer insulating film on said first interlayer insulating film,
   only a part of said eighth aperture is included in the bottom portion of said seventh aperture, and thus said second interlayer insulating film on an inner wall of said seventh aperture is exposed inside said eighth aperture.

6. A thin film transistor array substrate comprising:
   a substrate having a surface;
   a thin film transistor formed on said surface of said substrate;
   a common wiring formed on said substrate;
   a first interlayer insulating film formed on said thin film transistor and said common wiring;
   a second interlayer insulating film formed on said first interlayer insulating film;
   a common electrode formed on said second interlayer insulating film;
   a third interlayer insulating film formed on said common electrode;
   a pixel electrode formed on said third interlayer insulating film; and
   a first aperture formed on said second interlayer insulating film across a drain electrode of said thin film transistor and said common wiring, wherein
   said pixel electrode is connected with a drain electrode of said thin film transistor via said first aperture, a second aperture that includes a part of a bottom portion of said first aperture and is formed on said common electrode, a third aperture that includes a part of the bottom portion of said first aperture, is included in said second aperture and is formed on said third interlayer insulating film, a fourth aperture that is formed on said first interlayer insulating film having a shape similar, in a plan view, to a shape of an overlap region where said third aperture overlaps with the bottom portion of said first aperture, and the direction of viewing for the plan view is along a normal to said surface of said substrate, said common electrode is indirectly connected with said common wiring via said first aperture, and a fifth aperture that is included in the bottom portion of said first aperture and is formed on said first interlayer insulating film, a part of said common electrode is exposed from said third interlayer insulating film on the inner wall of said first aperture on a side of said common wiring, said common electrode and said common wiring are connected via a contact electrode that is connected between the exposed portion of said common electrode formed on the inner wall of said first aperture and said common wiring exposed on said fifth aperture and is made of a conductive film on the same layer as said pixel electrode.

7. The thin film transistor array substrate according to claim 6, wherein said fifth aperture is formed so as to pierce said first interlayer insulating film and a gate insulating film of said thin film transistor.

8. The thin film transistor array substrate according to claim 6, wherein said second interlayer insulating film is removed in a forming region for a terminal for connecting an external wiring.

9. The thin film transistor array substrate according to claim 6, further comprising:

a wiring converter for connecting a first wiring and a second wiring on different layers, wherein in said wiring converter, said first wiring and said second wiring are covered with said first interlayer insulating film, said second interlayer insulating film, and said third interlayer insulating film, an eighth aperture that reaches said first wiring or said second wiring is formed in a region where a bottom portion of a sixth aperture formed on said second interlayer insulating film overlaps with a seventh aperture formed on said third interlayer insulating film on said first interlayer insulating film, only a part of said seventh aperture is included in a bottom portion of said sixth aperture, and thus said second interlayer insulating film on the inner wall of said sixth aperture is exposed inside said seventh aperture.

10. A thin film transistor array substrate comprising:

a substrate having a surface;

a thin film transistor formed on said surface of said substrate;

a common wiring formed on said substrate;

a first interlayer insulating film formed on said thin film transistor and said common wiring;

a second interlayer insulating film formed on said first interlayer insulating film;

a common electrode formed on said second interlayer insulating film;

a third interlayer insulating film formed on said common electrode;

a pixel electrode formed on said third interlayer insulating film;

a first aperture formed on said second interlayer insulating film so as to overlap with at least a part of a drain electrode of said thin film transistor;

a second aperture that includes a bottom portion of said first aperture and is formed on said common electrode; and a pad that is made of a conductive film having one or more layers between said second interlayer insulating film and said third interlayer insulating film and is disposed so as to overlap with a part of said drain electrode in said second aperture, wherein said pixel electrode is connected with said drain electrode via said first aperture, a third aperture that includes a part of the bottom portion of said first aperture, is included in said second aperture and is formed on said third interlayer insulating film so that said pad is exposed, and a fourth aperture that is formed on said first interlayer insulating film having a shape similar, in a plan view, to a shape of an overlap region where said third aperture, a non-forming region for said pad, and the bottom portion of said first aperture overlap with each other, and the direction of viewing for the plan view is along a normal to said surface of said substrate.

11. The thin film transistor array substrate according to claim 10, wherein only a part of said third aperture is included in the bottom portion of said first aperture and thus said second interlayer insulating film on the inner wall of said first aperture is exposed inside said third aperture.

12. The thin film transistor array substrate according to claim 10, wherein said first aperture and said second aperture are formed across said drain electrode and said common wiring, said common electrode is indirectly connected with said common wiring via said first aperture and a fifth aperture that is included in the bottom portion of said first aperture and is formed on said first interlayer insulating film, a part of said common electrode is exposed from said third interlayer insulating film on the inner wall of said first aperture on a side of said common wiring, said common electrode and said common electrode are connected with each other via a contact electrode that is connected between the exposed portion of said common electrode formed on the inner wall of said first aperture and said common wiring exposed on said fifth aperture and is made of a conductive film on the same layer as said pixel electrode.

13. The thin film transistor array substrate according to claim 12, wherein said fifth aperture is formed so as to pierce said first interlayer insulating film and a gate insulating film of said thin film transistor.

14. The thin film transistor array substrate according to claim 10, wherein said second interlayer insulating film is removed in a forming region for a terminal for connecting an external wiring.

15. The thin film transistor array substrate according to claim 10, further comprising:

a wiring converter for connecting a first wiring and a second wiring on different layers; wherein in said wiring converter, said first wiring and said second wiring are covered with said first interlayer insulating film and said third interlayer insulating film, a pad that is made of a conductive film of one or more layers between said second interlayer insulating film and said third interlayer insulating film is provided between said first interlayer insulating film and said third interlayer insulating film, a seventh aperture that reaches said first wiring or said second wiring is formed in a region where a sixth aperture formed on said third interlayer insulating film overlaps with a non-forming region for said pad on said first interlayer insulating film, said sixth aperture overlaps with a part of said pad, and thus said pad is exposed inside said sixth aperture.

* * * * *